US012676201B2

(12) United States Patent
Takada et al.

(10) Patent No.: US 12,676,201 B2
(45) Date of Patent: Jul. 7, 2026

(54) MEMORY SYSTEM

(71) Applicant: Kioxia Corporation, Tokyo (JP)

(72) Inventors: Marie Takada, Yokohama Kanagawa (JP); Masanobu Shirakawa, Chigasaki Kanagawa (JP); Naomi Takeda, Yokohama Kanagawa (JP); Ryo Yamaki, Yokohama Kanagawa (JP); Shogo Muto, Fujisawa Kanagawa (JP); Hideki Yamada, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 155 days.

(21) Appl. No.: 18/795,818

(22) Filed: Aug. 6, 2024

(65) Prior Publication Data

US 2025/0054564 A1     Feb. 13, 2025

(30) Foreign Application Priority Data

Aug. 7, 2023     (JP) ................................. 2023-128545

(51) Int. Cl.
| | |
|---|---|
| *G11C 16/34* | (2006.01) |
| *G11C 16/04* | (2006.01) |
| *G11C 16/26* | (2006.01) |

(52) U.S. Cl.
CPC ........ *G11C 16/349* (2013.01); *G11C 16/0483* (2013.01); *G11C 16/26* (2013.01)

(58) Field of Classification Search
CPC .... G11C 16/349; G11C 16/0483; G11C 16/26
See application file for complete search history.

(56) References Cited

U.S. PATENT DOCUMENTS

| | | | |
|---|---|---|---|
| 10,048,863 B1 | 8/2018 | Goss et al. | |
| 11,217,320 B1 * | 1/2022 | Sheperek | G11C 16/30 |
| 11,301,382 B2 * | 4/2022 | Sheperek | G01R 19/16538 |
| 11,545,227 B2 * | 1/2023 | Sheperek | G11C 16/26 |
| 2016/0147582 A1 * | 5/2016 | Karakulak | G06F 11/079 714/37 |
| 2016/0148701 A1 * | 5/2016 | Karakulak | G11C 16/3427 365/185.18 |
| 2016/0148702 A1 * | 5/2016 | Karakulak | G11C 29/021 365/185.11 |
| 2020/0225852 A1 | 7/2020 | Sharon et al. | |
| 2021/0326250 A1 | 10/2021 | Bennett et al. | |

* cited by examiner

*Primary Examiner* — Jay W. Radke
(74) *Attorney, Agent, or Firm* — Foley & Lardner LLP

(57)     ABSTRACT

According to one embodiment, a memory system includes a memory chip and a memory controller. A first cell unit and a second cell unit are classified into a first group. A third cell unit is classified into a second group. The memory controller is configured to use a first correction amount of a read voltage when data of the first group is read and to use a second correction amount of the read voltage when data of the second group is read. When a time difference from a write operation of the first cell unit to the write operation of the second cell unit exceeds a reference value, the memory controller is configured to change a boundary position between the first group and the second group to between the first cell unit and the second cell unit, and to classify the second cell unit into the second group.

18 Claims, 45 Drawing Sheets

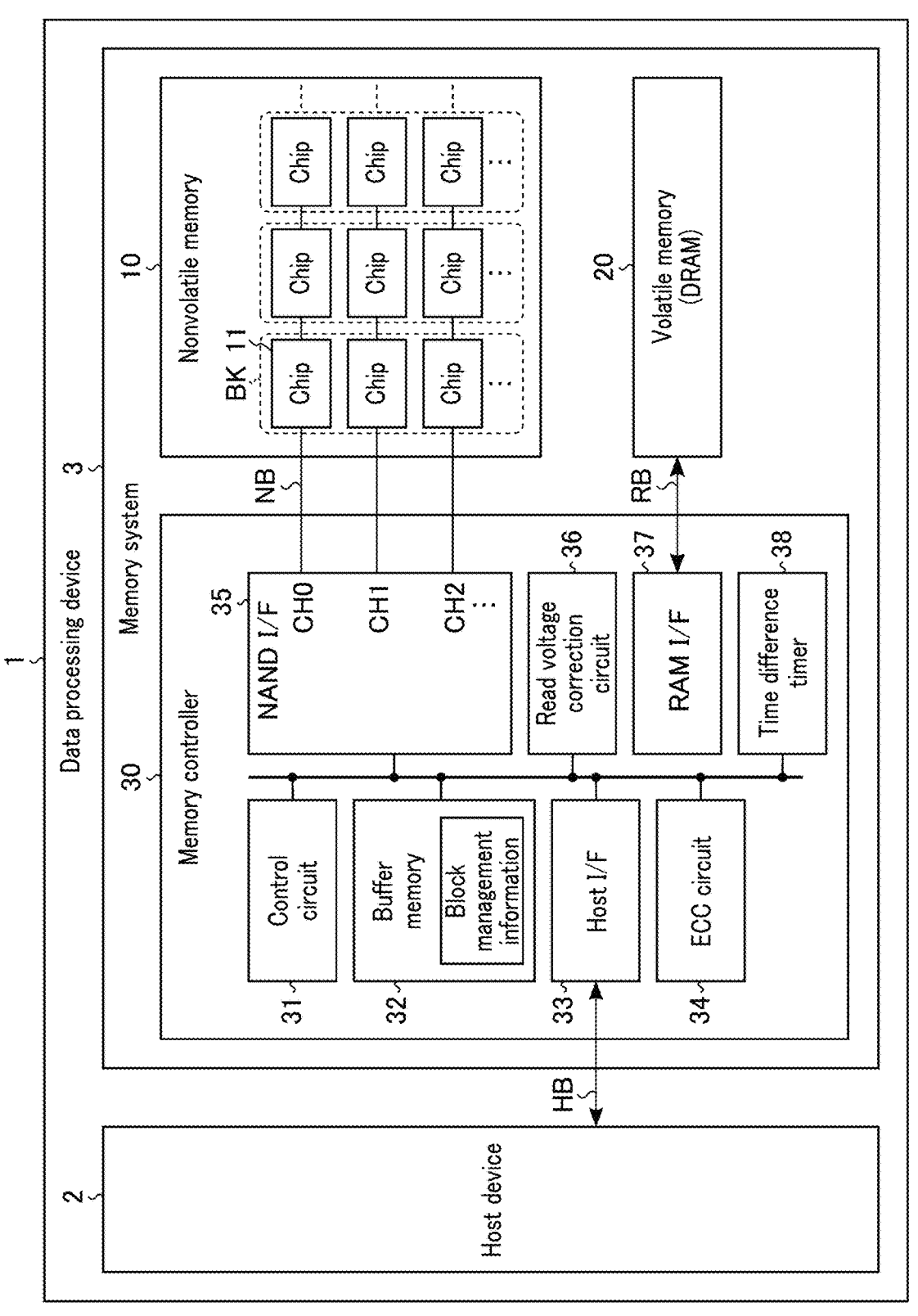
F I G. 1

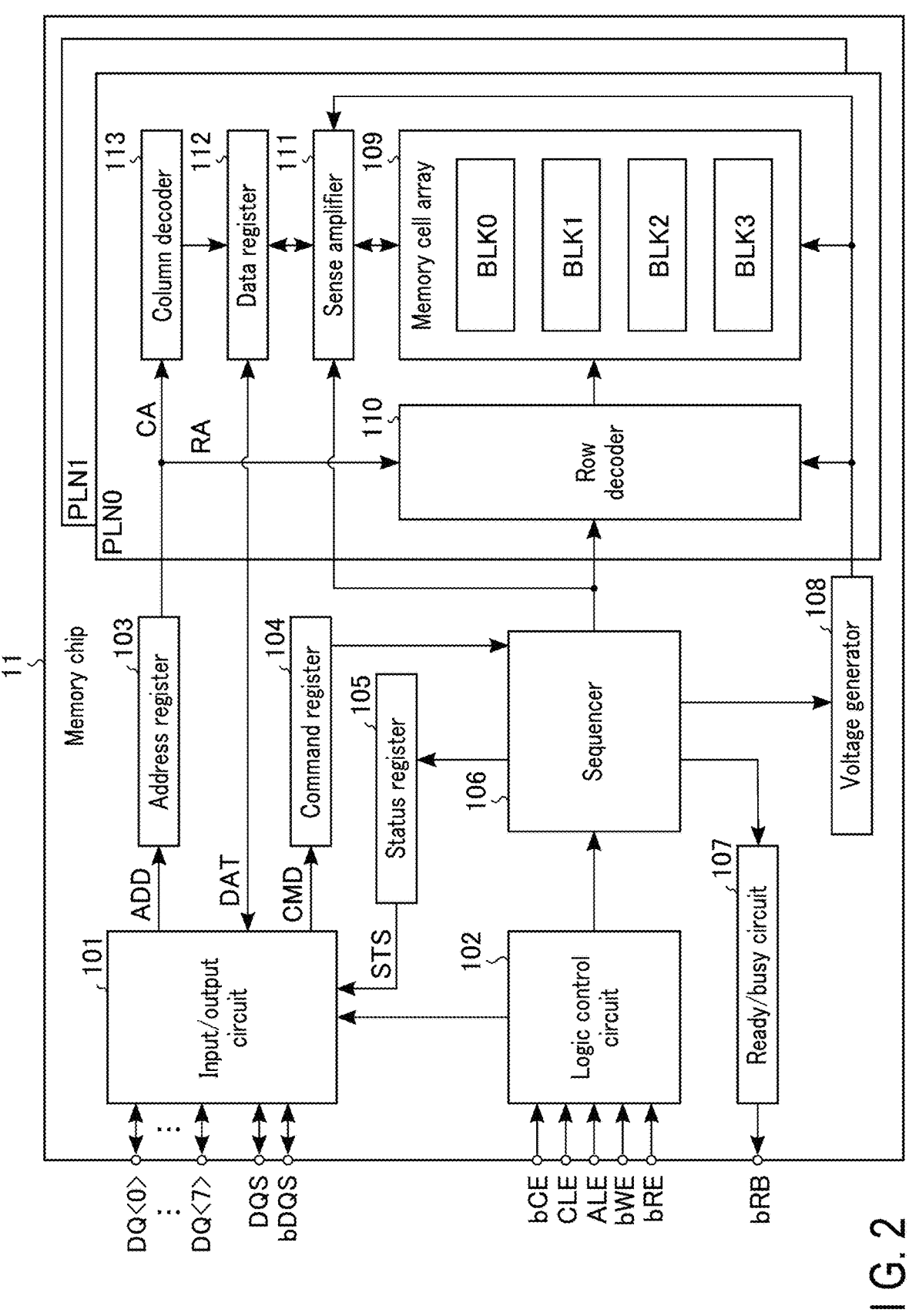
F I G. 2

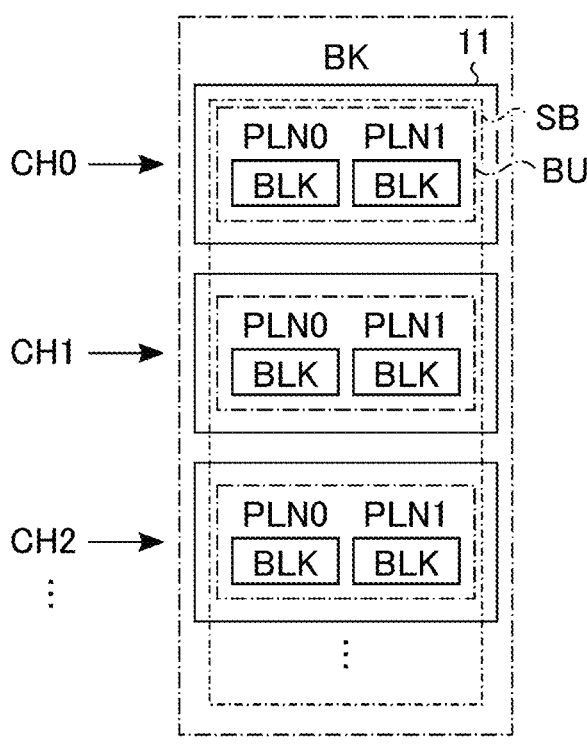
CH0 →
CH1 →
CH2 →
F I G. 3
BLK ZN(SB) Memory area
F I G. 4

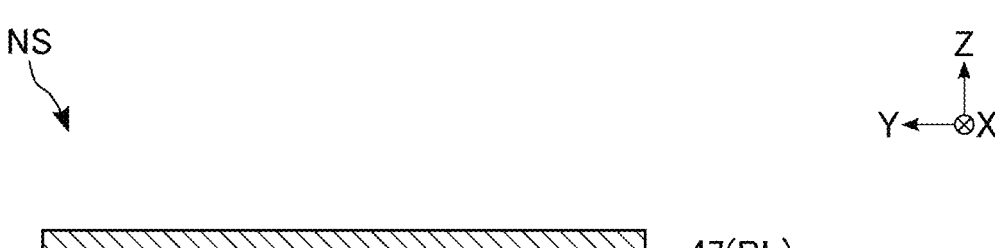
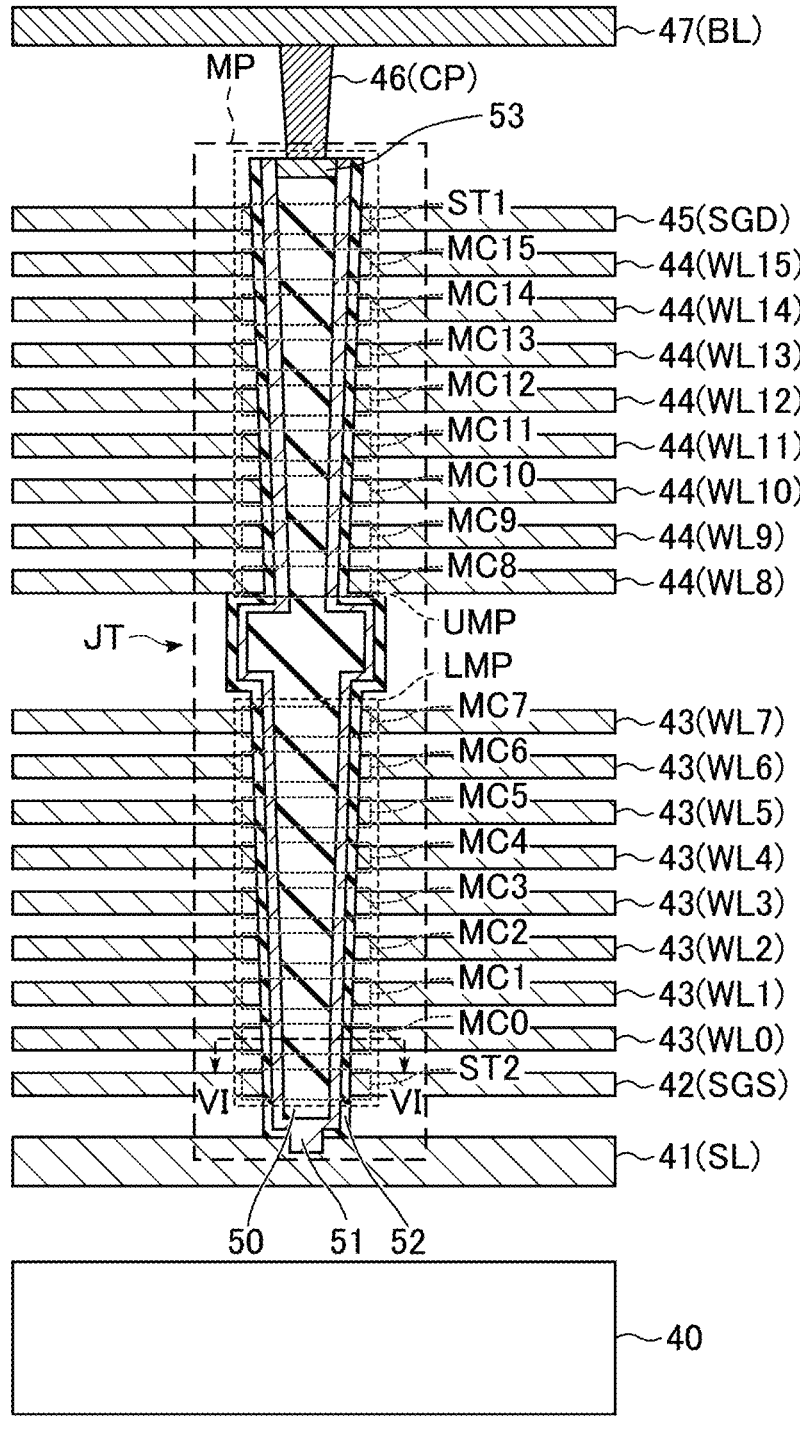
F I G. 7

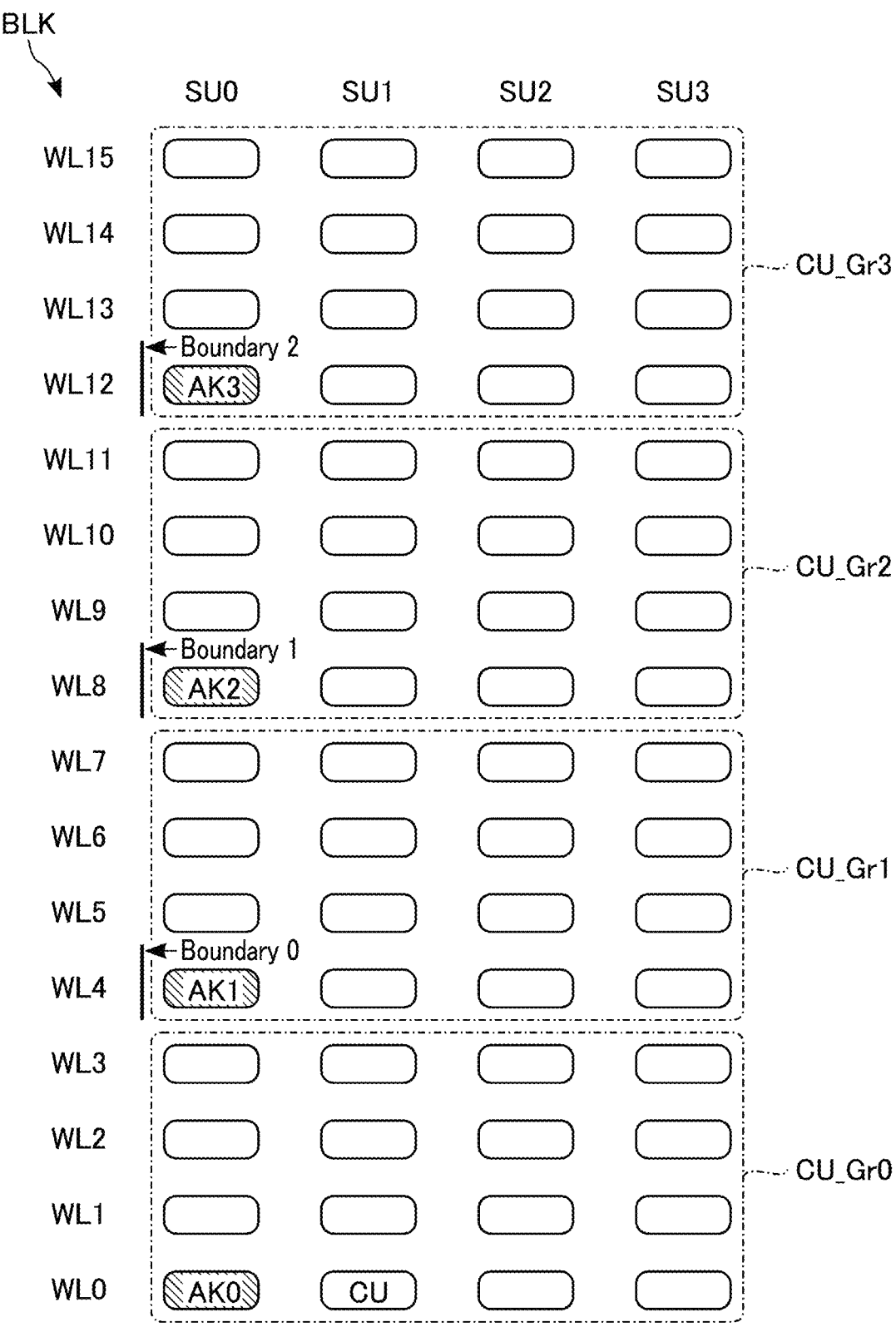
F I G. 9

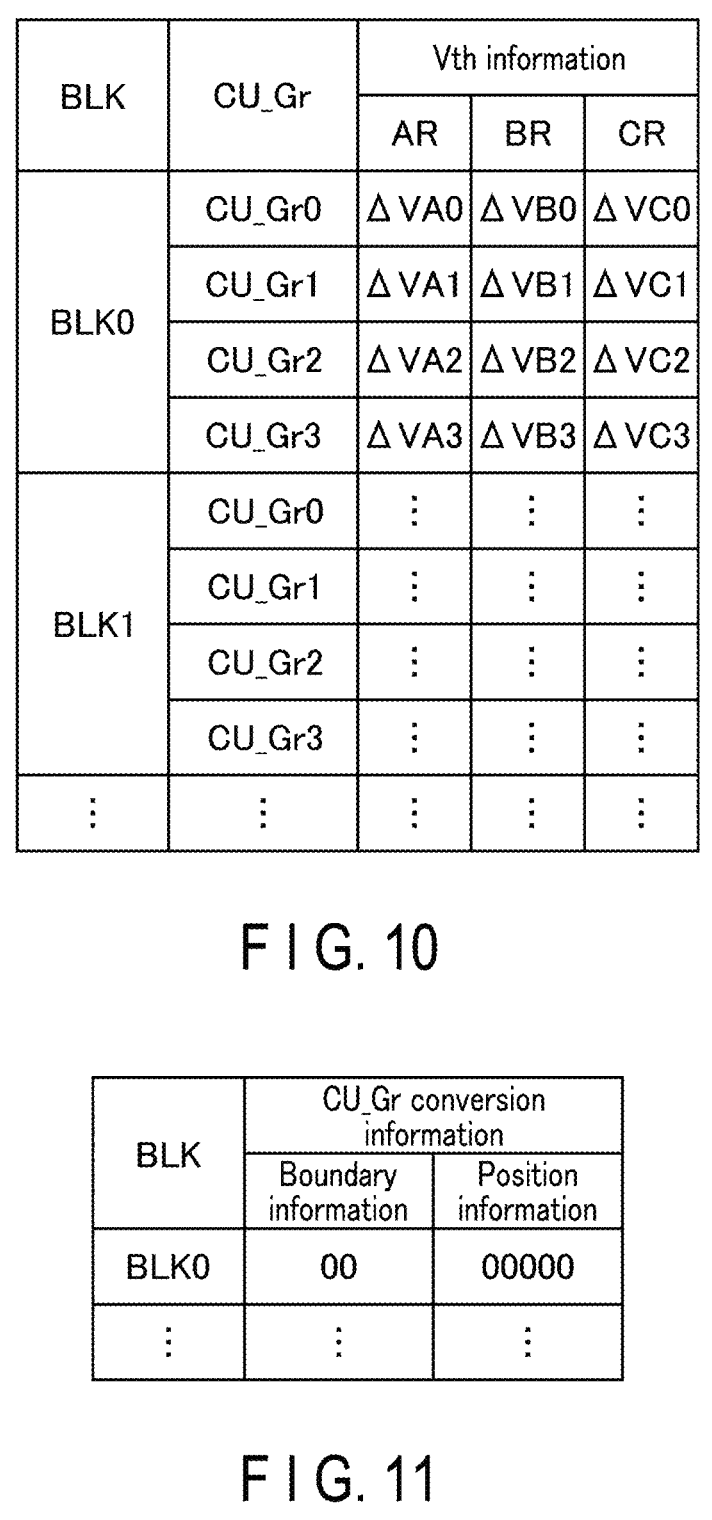

| BLK | CU_Gr | Vth information | | |
| --- | --- | --- | --- | --- |
| | | AR | BR | CR |
| BLK0 | CU_Gr0 | $\Delta$VA0 | $\Delta$VB0 | $\Delta$VC0 |
| | CU_Gr1 | $\Delta$VA1 | $\Delta$VB1 | $\Delta$VC1 |
| | CU_Gr2 | $\Delta$VA2 | $\Delta$VB2 | $\Delta$VC2 |
| | CU_Gr3 | $\Delta$VA3 | $\Delta$VB3 | $\Delta$VC3 |
| BLK1 | CU_Gr0 | ⋮ | ⋮ | ⋮ |
| | CU_Gr1 | ⋮ | ⋮ | ⋮ |
| | CU_Gr2 | ⋮ | ⋮ | ⋮ |
| | CU_Gr3 | ⋮ | ⋮ | ⋮ |
| ⋮ | ⋮ | ⋮ | ⋮ | ⋮ |

F I G. 10

| BLK | CU_Gr conversion information | |
| --- | --- | --- |
| | Boundary information | Position information |
| BLK0 | 00 | 00000 |
| ⋮ | ⋮ | ⋮ |

F I G. 11

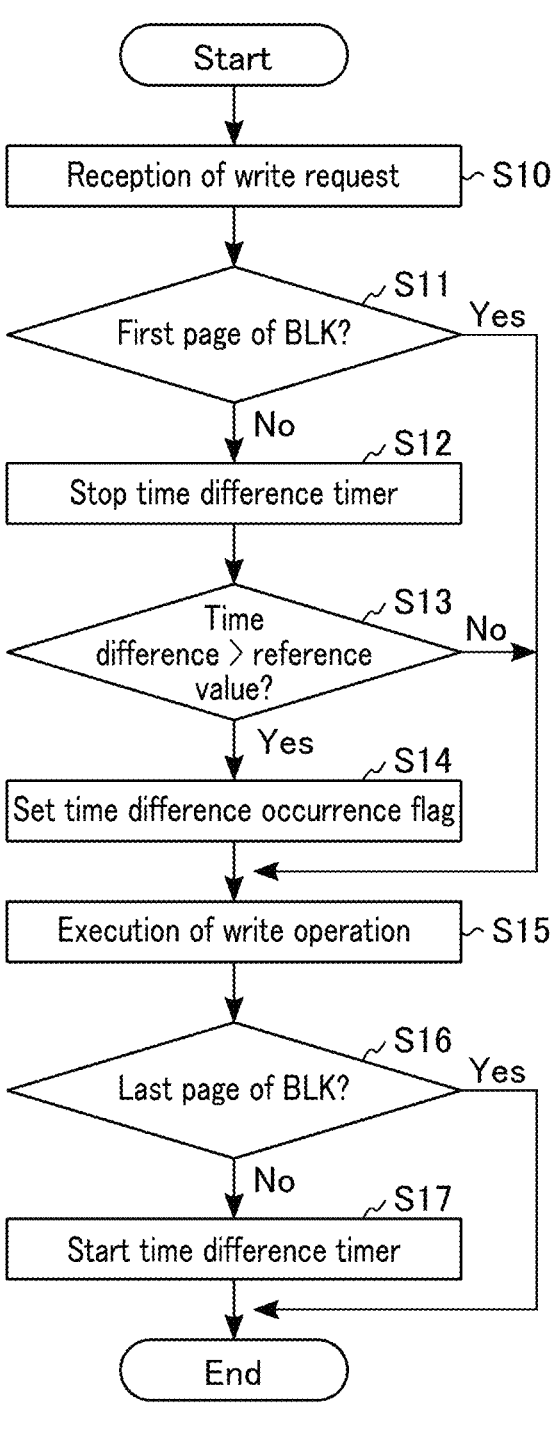
F I G. 12

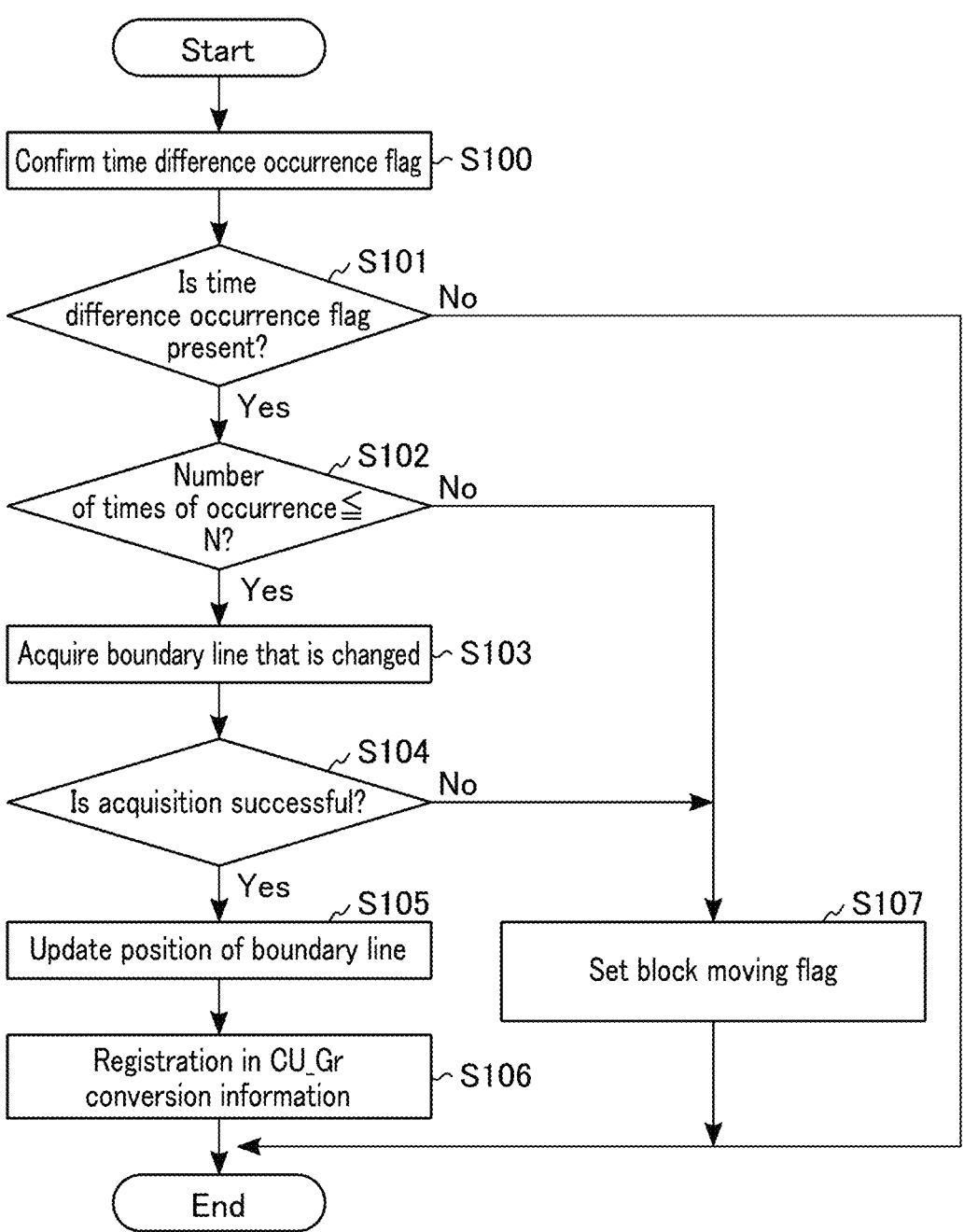
F I G. 13

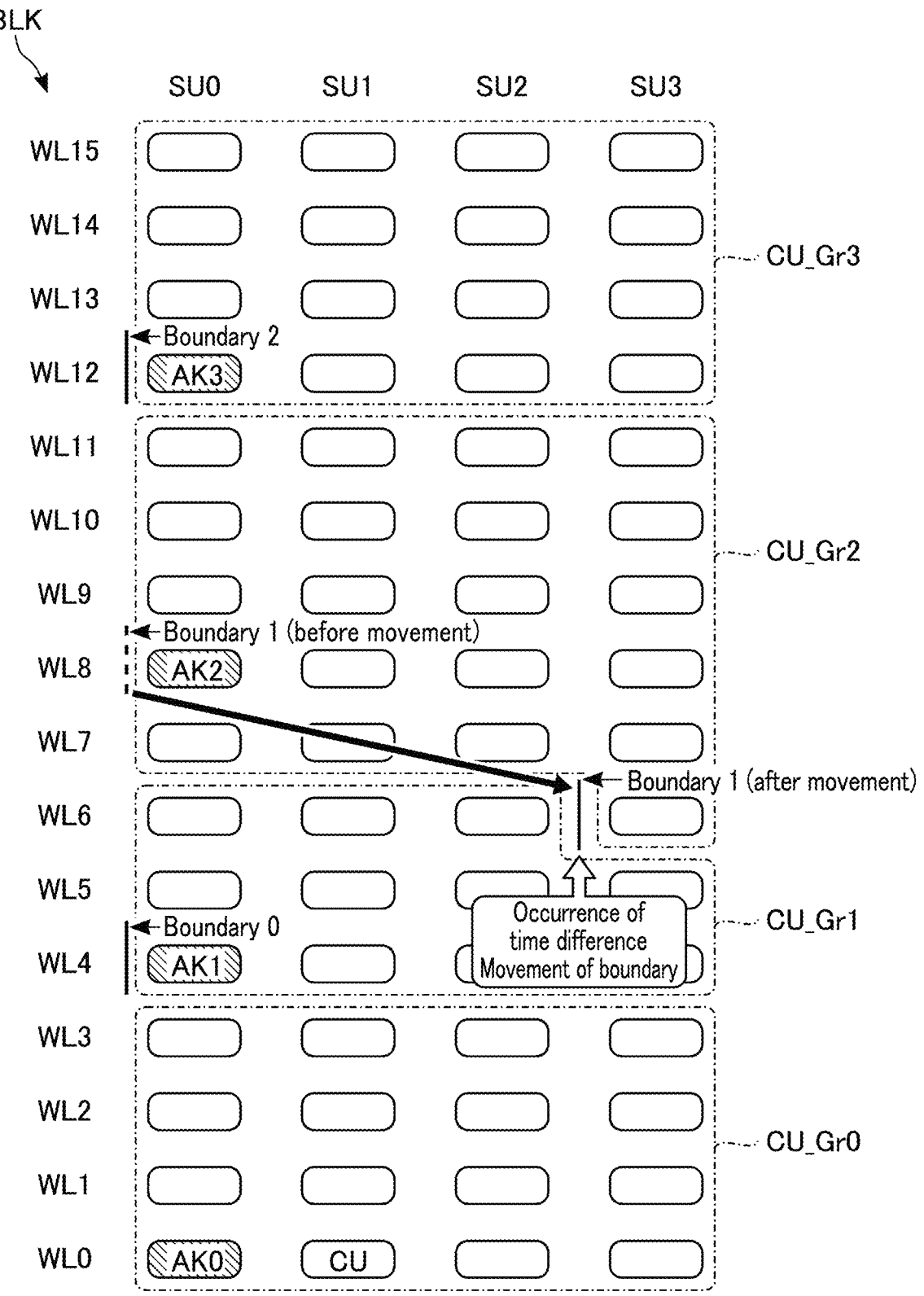
F I G. 14

| BLK | CU_Gr conversion information | |
| | Boundary information | Position information |
| --- | --- | --- |
| BLK0 | 01 | 11011 |

F I G. 15

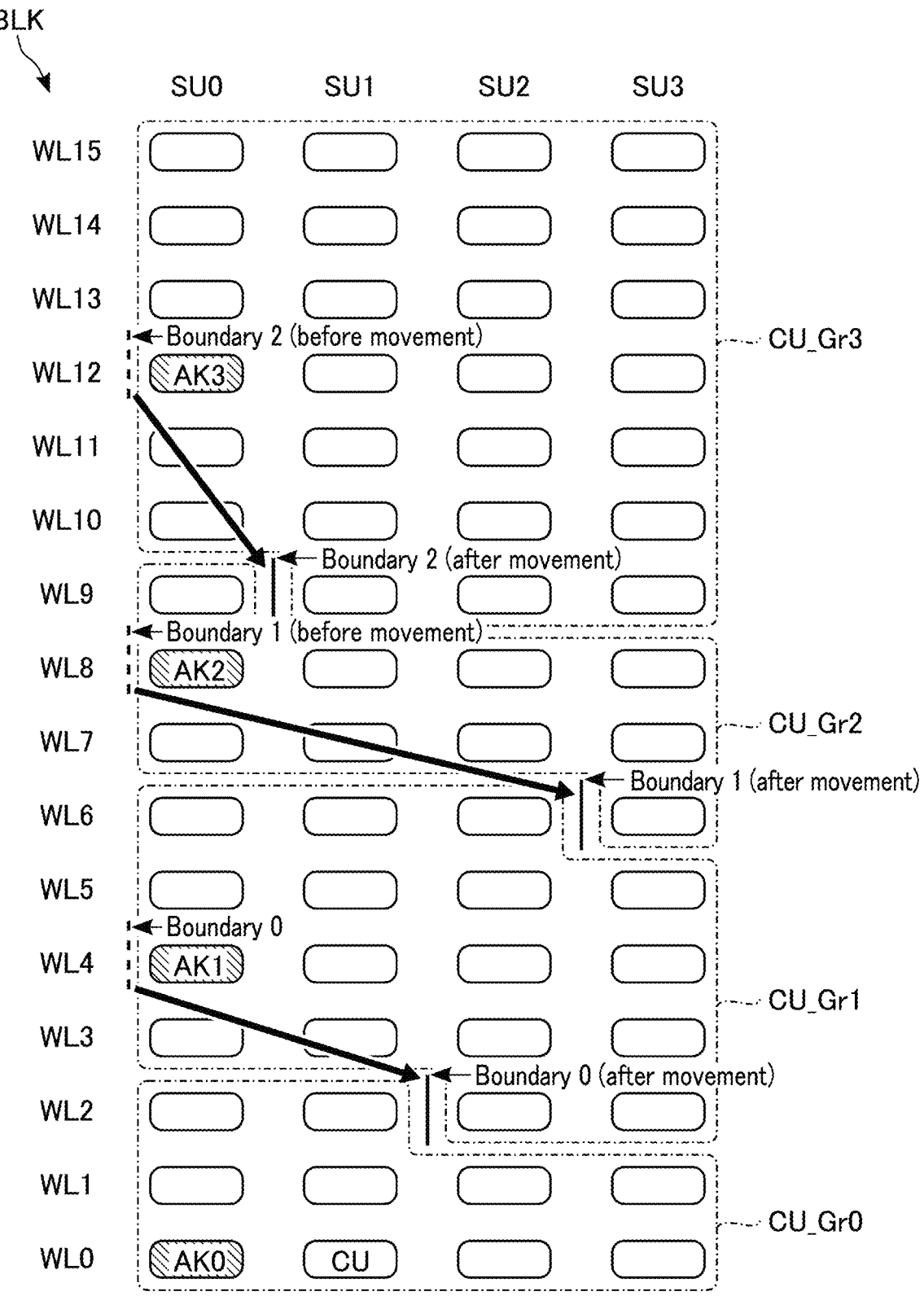
F I G. 16

| BLK | CU_Gr | Vth information | | | CU_Gr conversion information |
|---|---|---|---|---|---|
| | | AR | BR | CR | |
| BLK0 | CU_Gr0 | $\triangle$VA0 | $\triangle$VB0 | $\triangle$VC0 | — |
| | CU_Gr1 | $\triangle$VA1 | $\triangle$VB1 | $\triangle$VC1 | 1111010 |
| | CU_Gr2 | $\triangle$VA2 | $\triangle$VB2 | $\triangle$VC2 | 1111011 |
| | CU_Gr3 | $\triangle$VA3 | $\triangle$VB3 | $\triangle$VC3 | 1110101 |

F I G. 17

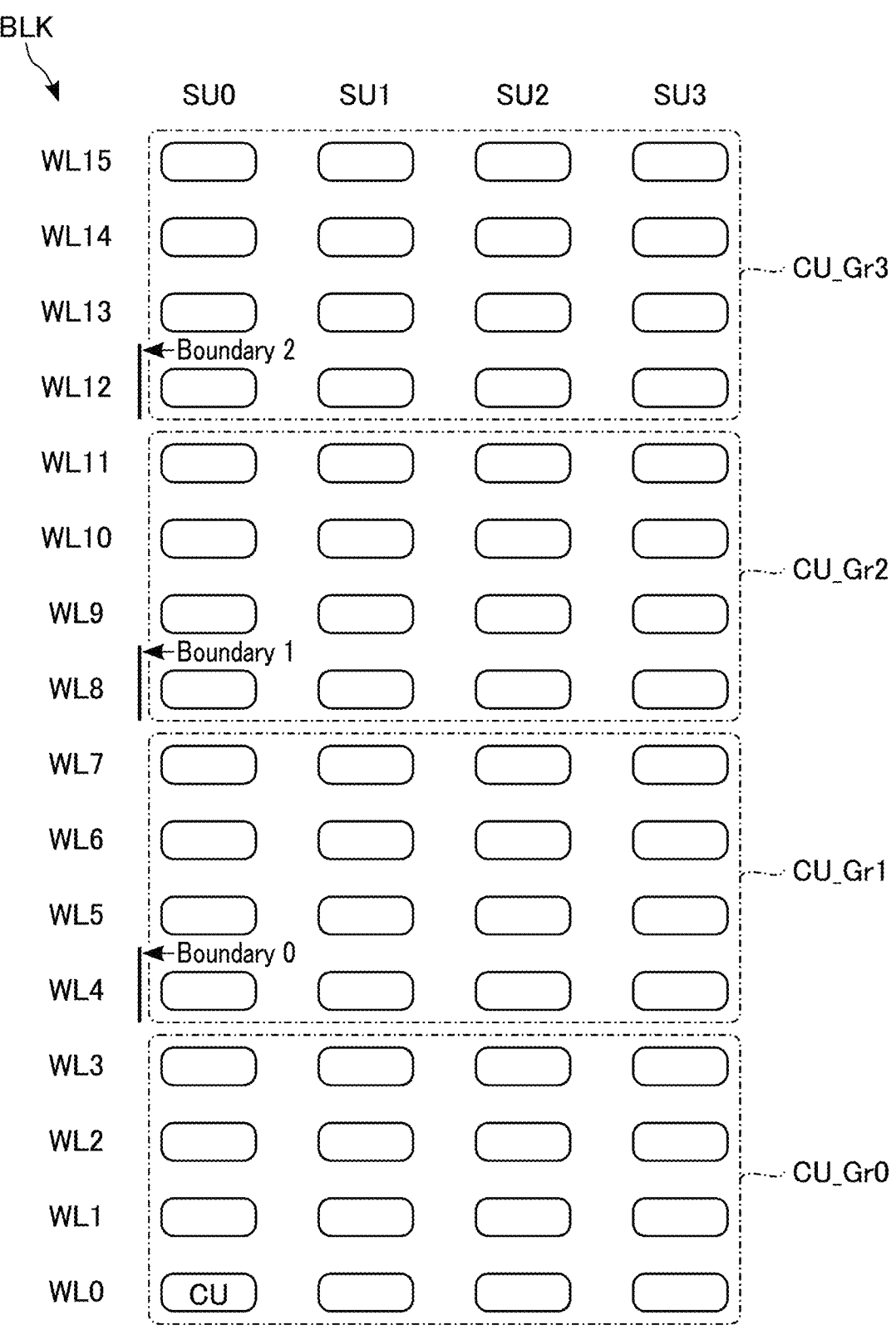
F I G. 18

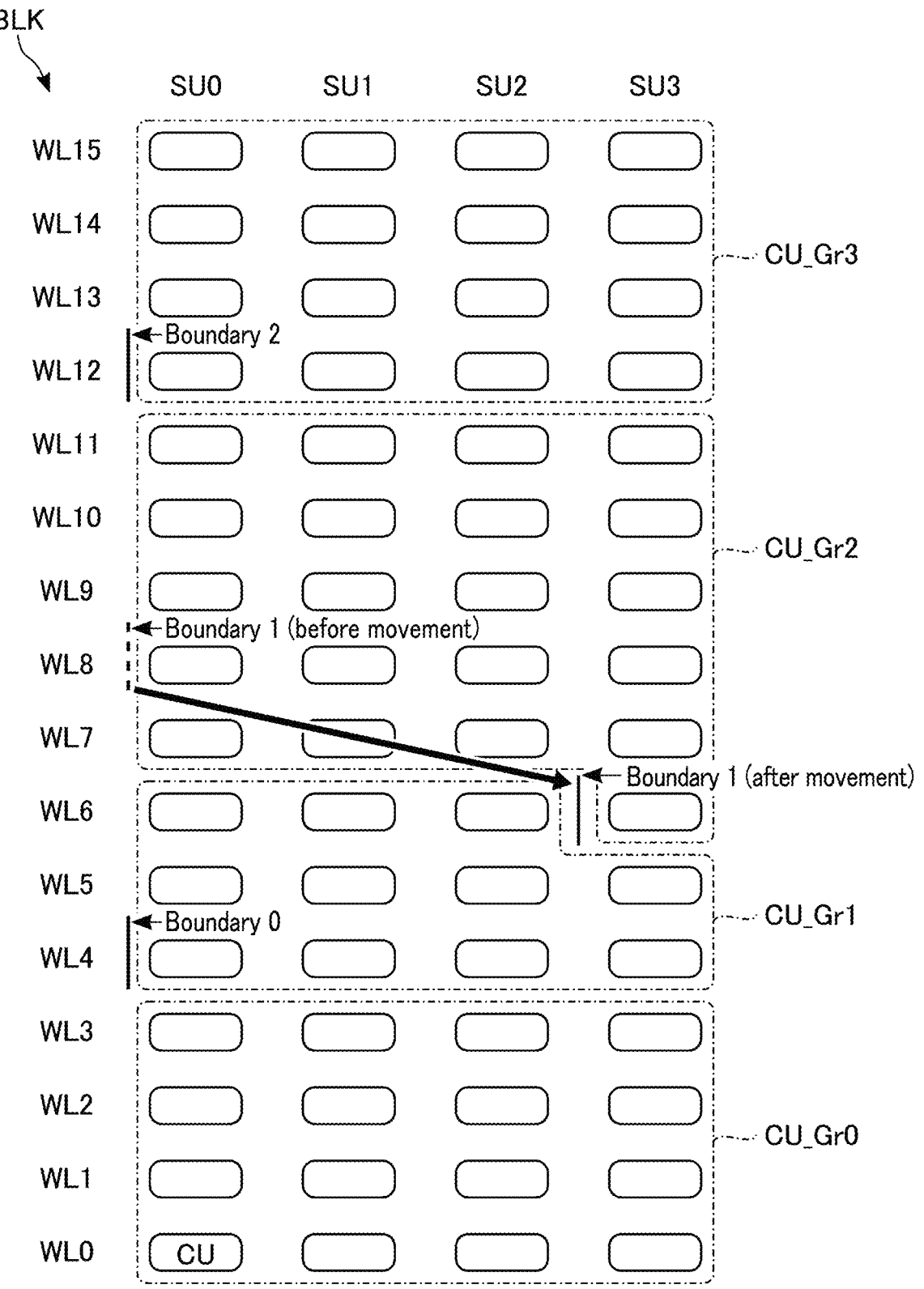
F I G. 19

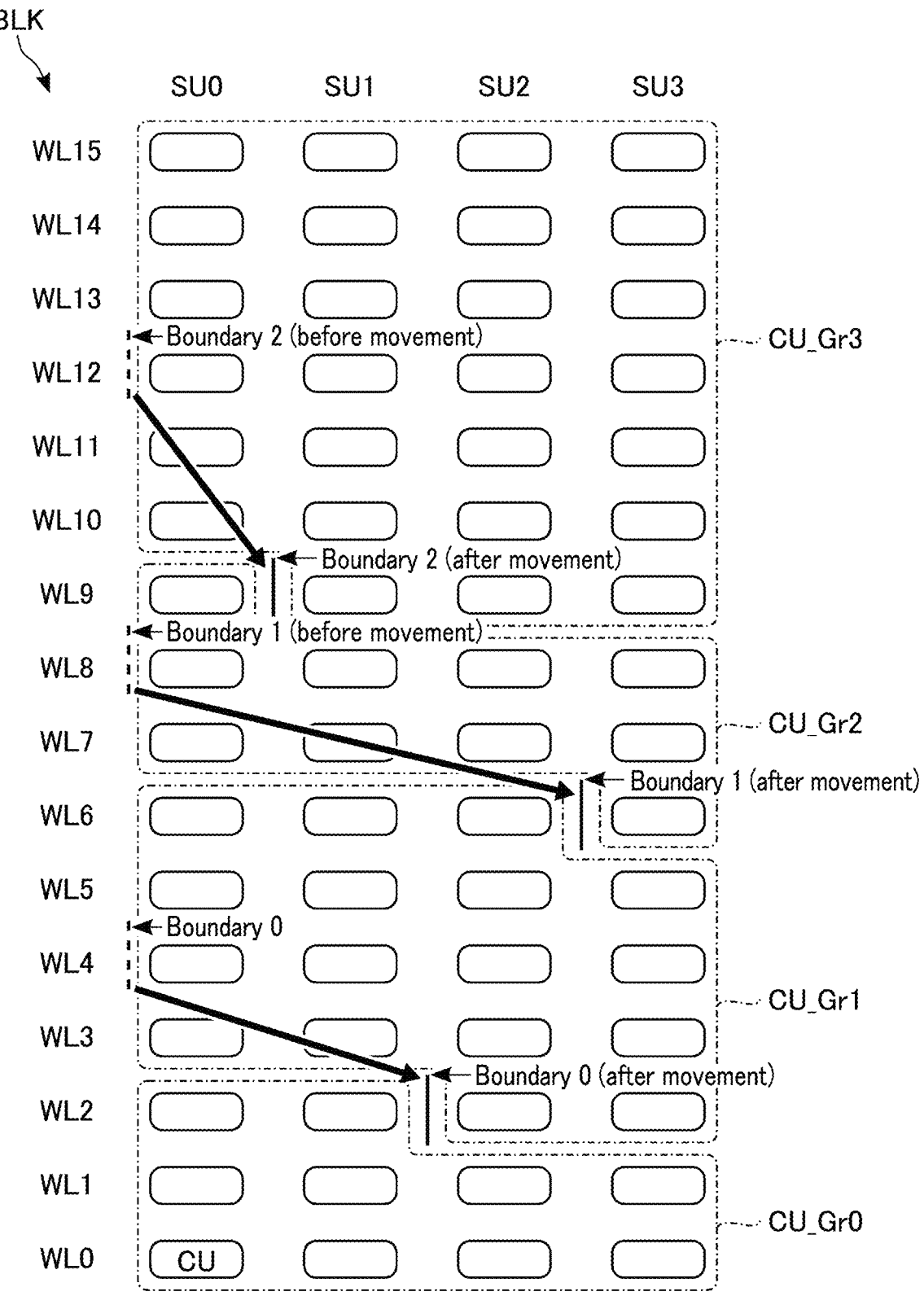
F I G. 20

| BLK | CU_Gr conversion information | | Anchor conversion information | |
|---|---|---|---|---|
| | Boundary information | Position information | Anchor information | Position information |
| BLK0 | 00 | 00000 | 00 | 00000 |
| ⋮ | ⋮ | ⋮ | ⋮ | ⋮ |

F I G. 21

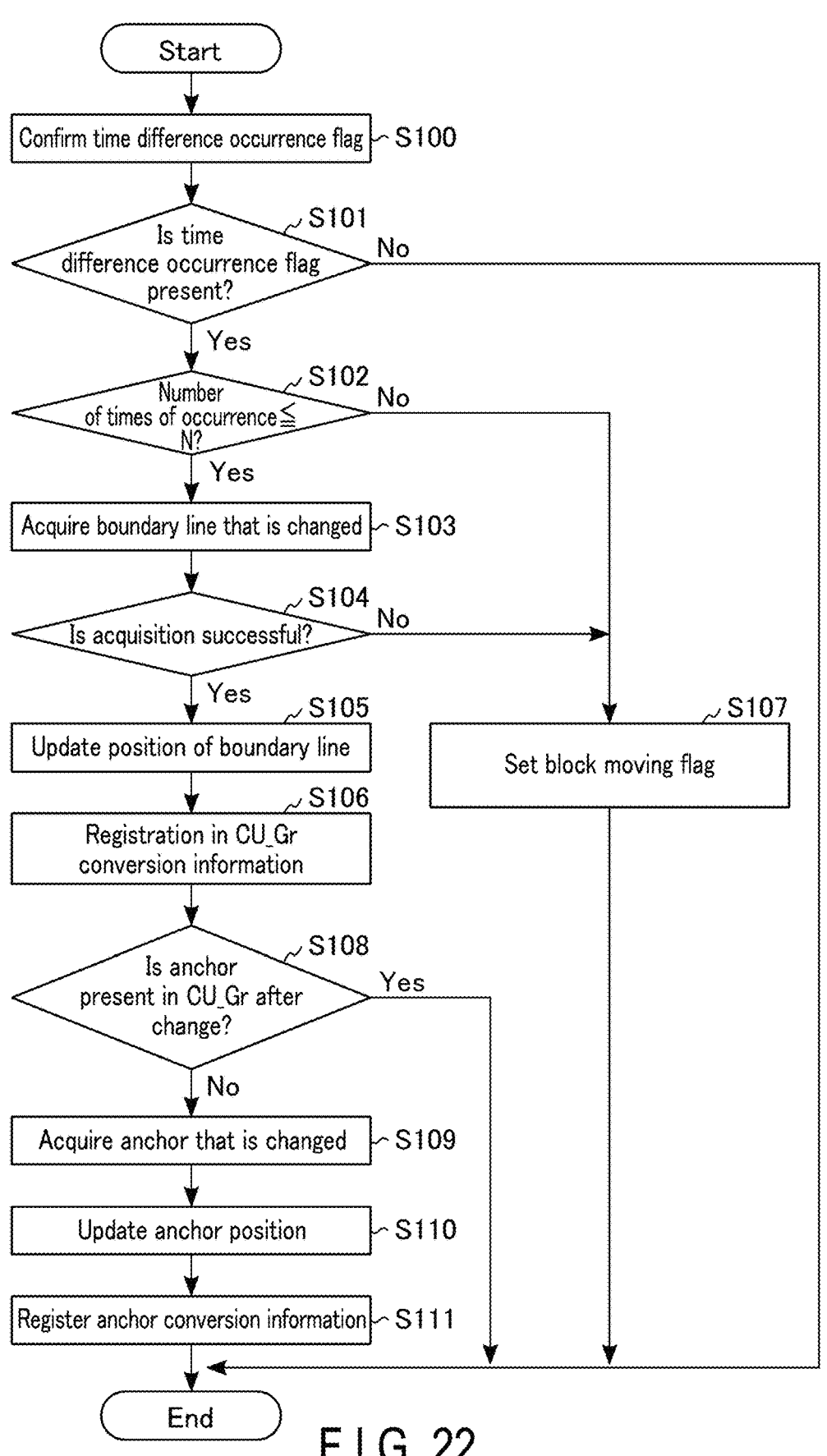
F I G. 22

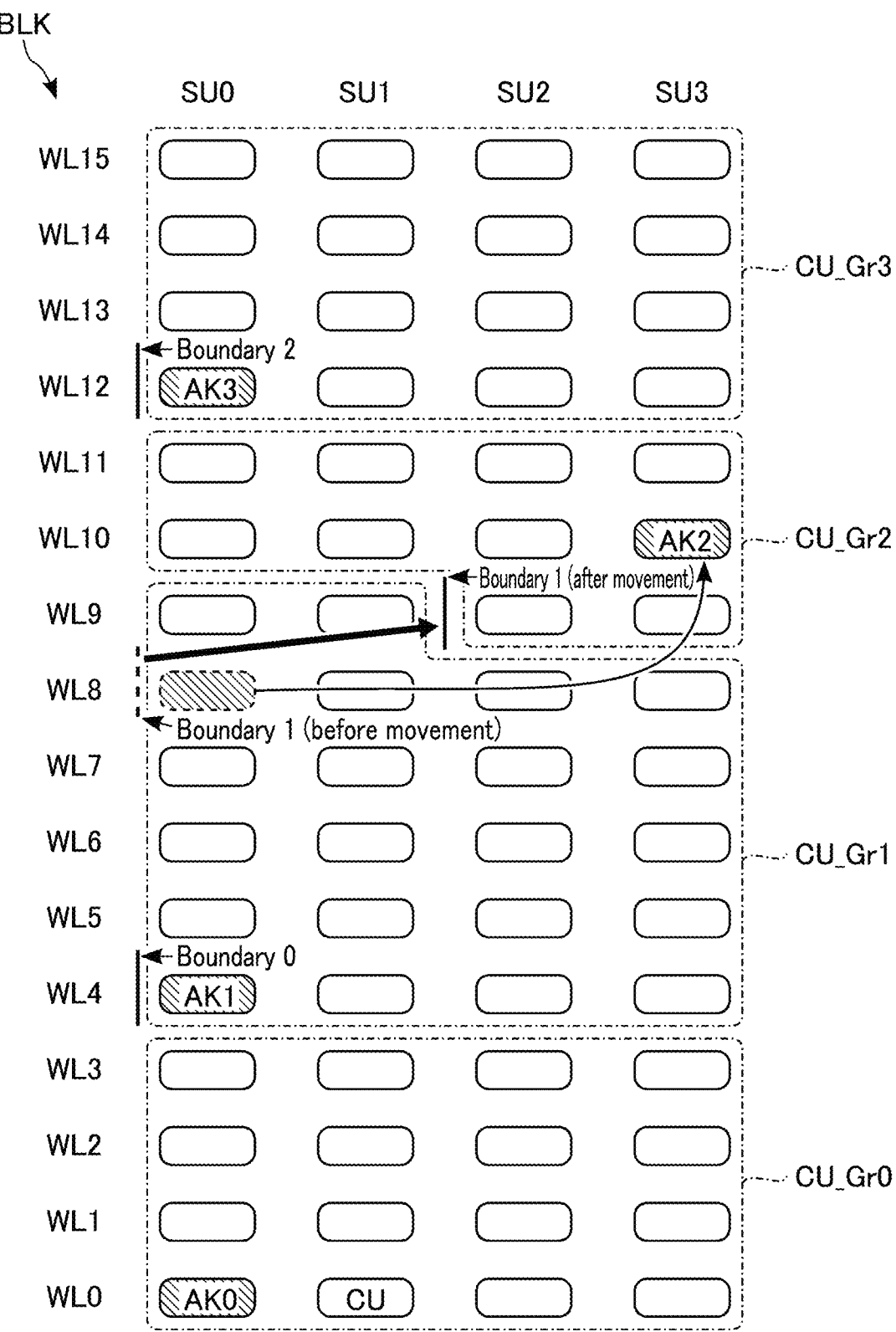
F I G. 23

| BLK | CU_Gr conversion information | | Anchor conversion information | |
|---|---|---|---|---|
| | Boundary information | Position information | Anchor information | Position information |
| BLK0 | 01 | 00110 | 10 | 01011 |

F I G. 24

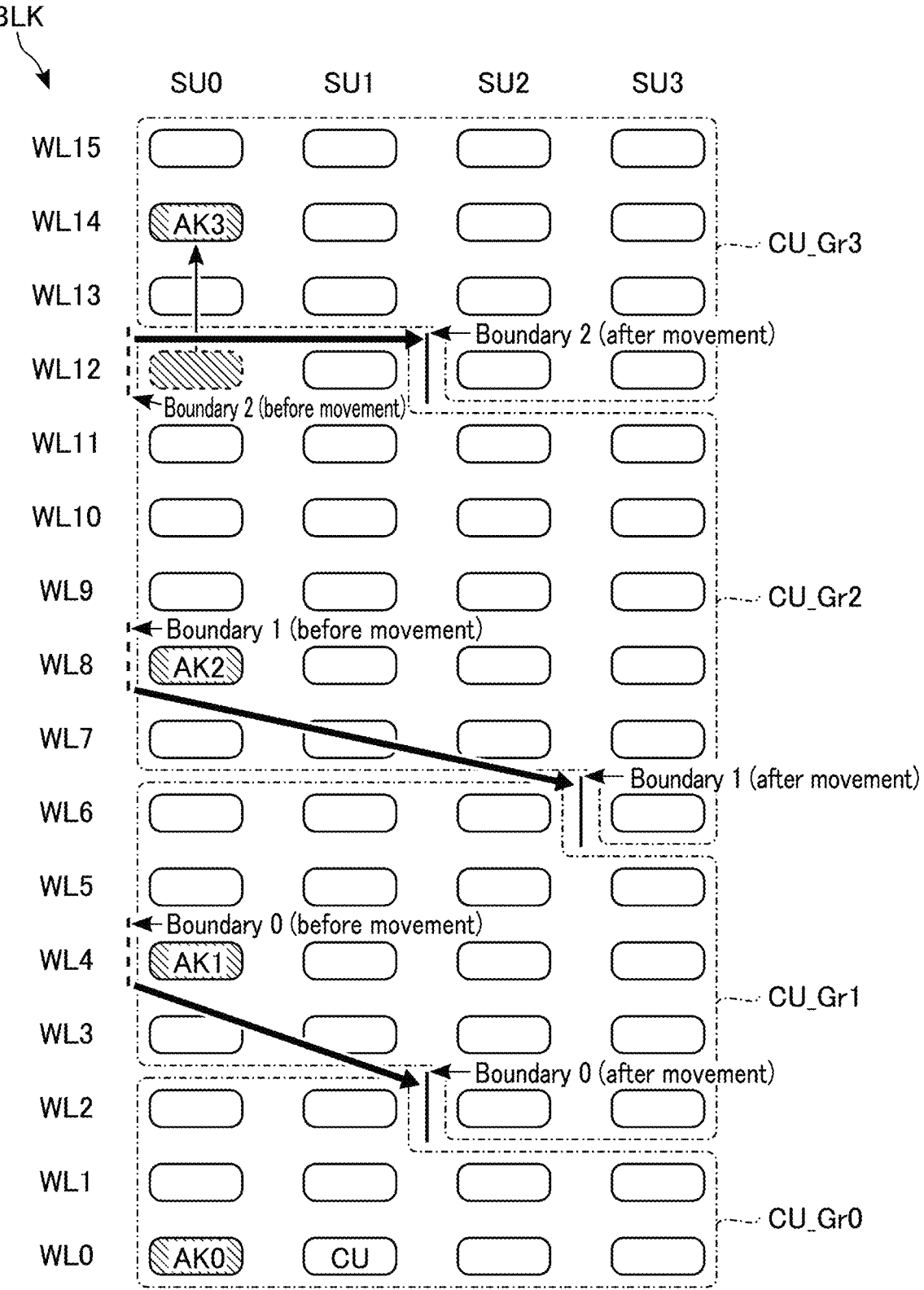
F I G. 25

| BLK | CU_Gr | Vth information | | | Anchor conversion information | CU_Gr conversion information |
|---|---|---|---|---|---|---|
| | | AR | BR | CR | | |
| BLK0 | CU_Gr0 | $\triangle$VA0 | $\triangle$VB0 | $\triangle$VC0 | — | — |
| | CU_Gr1 | $\triangle$VA1 | $\triangle$VB1 | $\triangle$VC1 | — | 1111010 |
| | CU_Gr2 | $\triangle$VA2 | $\triangle$VB2 | $\triangle$VC2 | — | 1111011 |
| | CU_Gr3 | $\triangle$VA3 | $\triangle$VB3 | $\triangle$VC3 | 0001000 | 0000010 |

F I G. 26

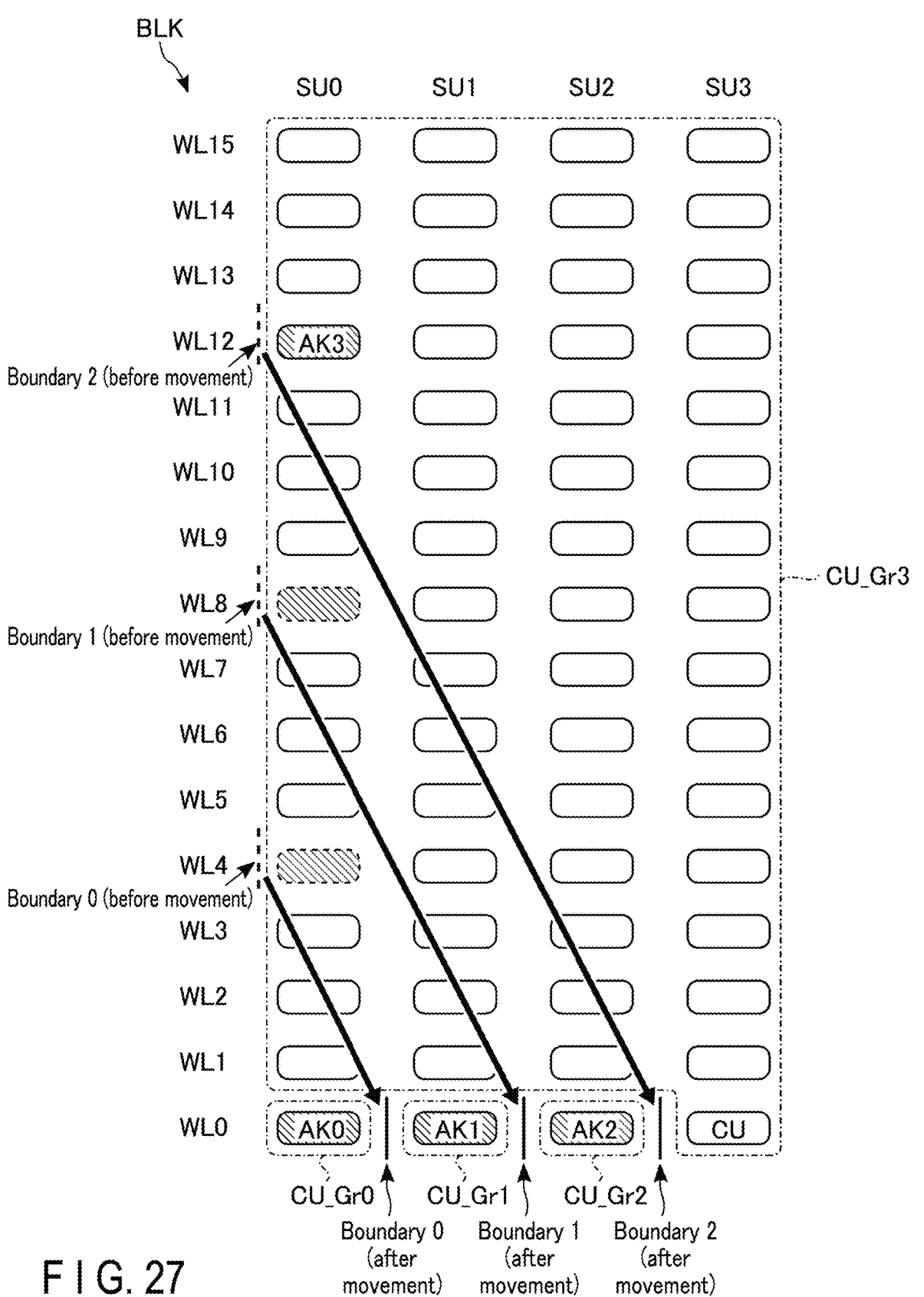
F I G. 27

| BLK | CU_Gr | Vth information | | | Anchor conversion information | CU_Gr conversion information |
|---|---|---|---|---|---|---|
| | | AR | BR | CR | | |
| BLK0 | CU_Gr0 | $\triangle$VA0 | $\triangle$VB0 | $\triangle$VC0 | — | — |
| | CU_Gr1 | $\triangle$VA1 | $\triangle$VB1 | $\triangle$VC1 | 1110001 | 1110001 |
| | CU_Gr2 | $\triangle$VA2 | $\triangle$VB2 | $\triangle$VC2 | 1100010 | 1100010 |
| | CU_Gr3 | $\triangle$VA3 | $\triangle$VB3 | $\triangle$VC3 | — | 1010011 |

F I G. 28

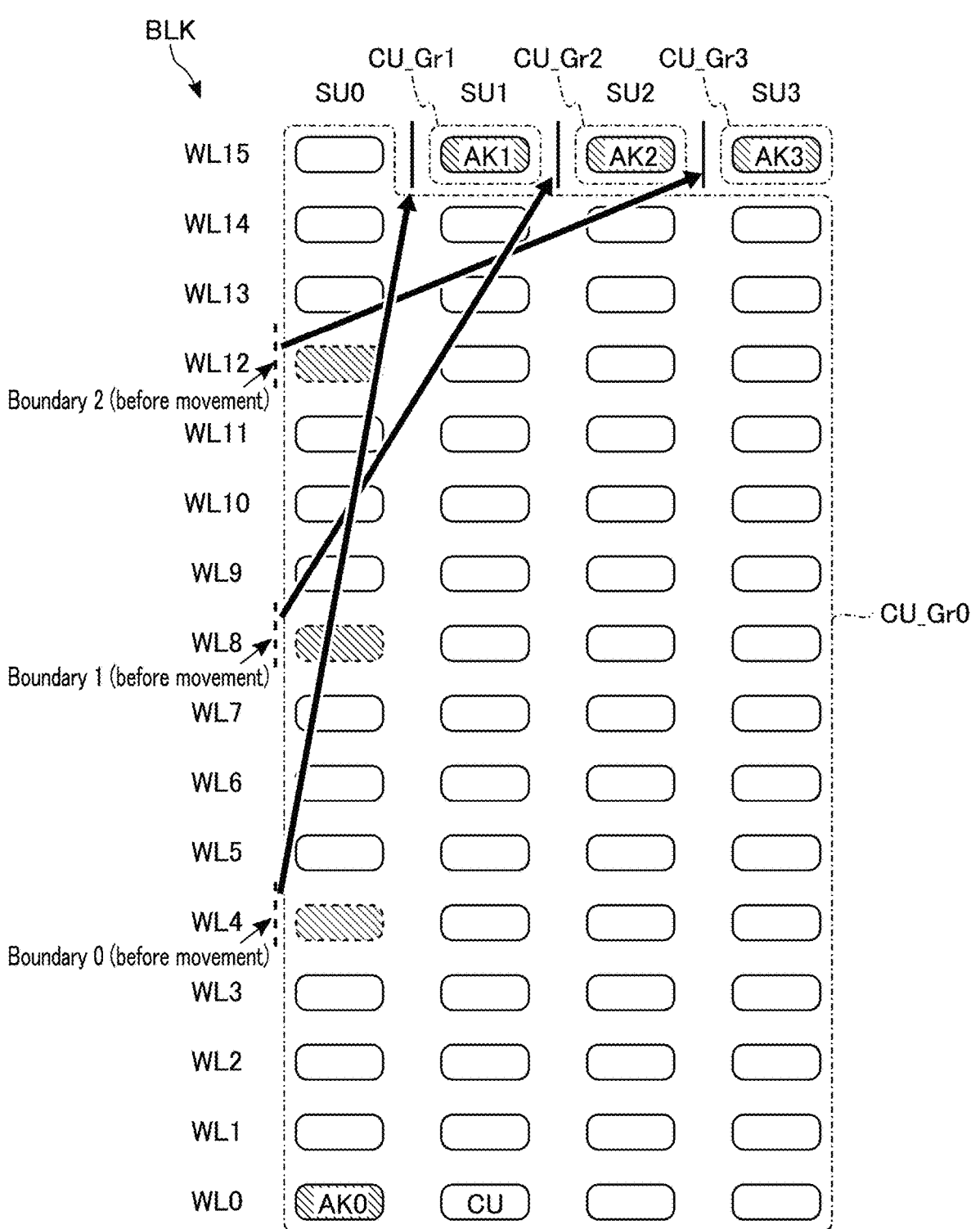
F I G. 29

| BLK | CU_Gr | Vth information | | | Anchor conversion information | CU_Gr conversion information |
|---|---|---|---|---|---|---|
| | | AR | BR | CR | | |
| BLK0 | CU_Gr0 | $\triangle$VA0 | $\triangle$VB0 | $\triangle$VC0 | — | — |
| | CU_Gr1 | $\triangle$VA1 | $\triangle$VB1 | $\triangle$VC1 | 0101101 | 0101101 |
| | CU_Gr2 | $\triangle$VA2 | $\triangle$VB2 | $\triangle$VC2 | 0011110 | 0011110 |
| | CU_Gr3 | $\triangle$VA3 | $\triangle$VB3 | $\triangle$VC3 | 0001111 | 0001111 |

F I G. 30

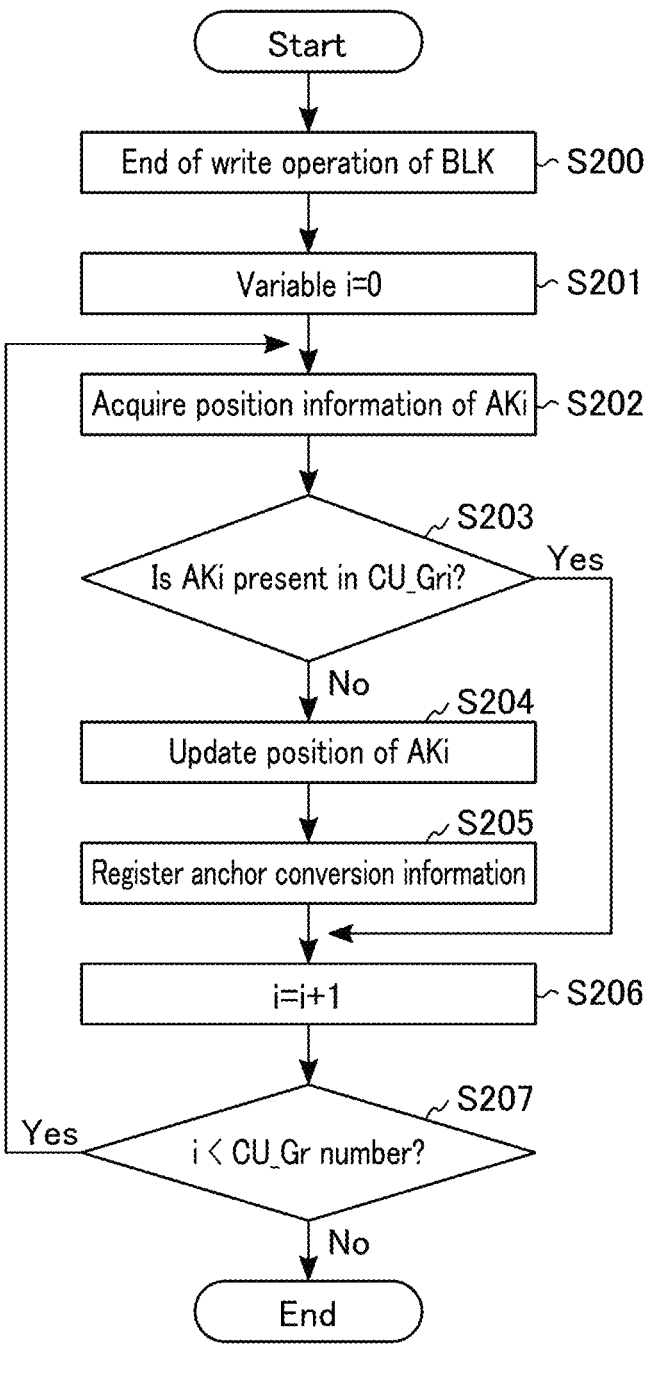
F I G. 31

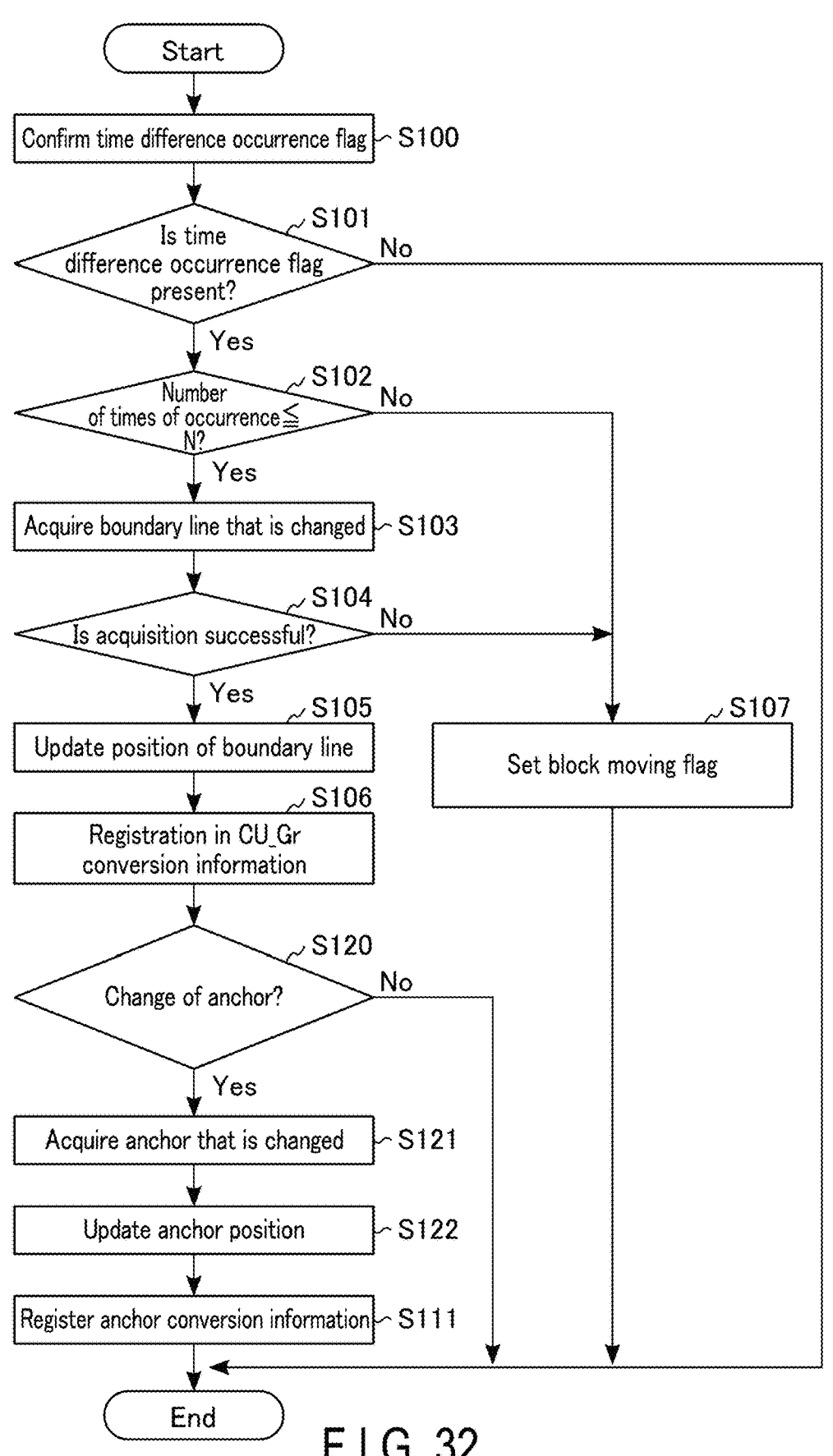
F I G. 32

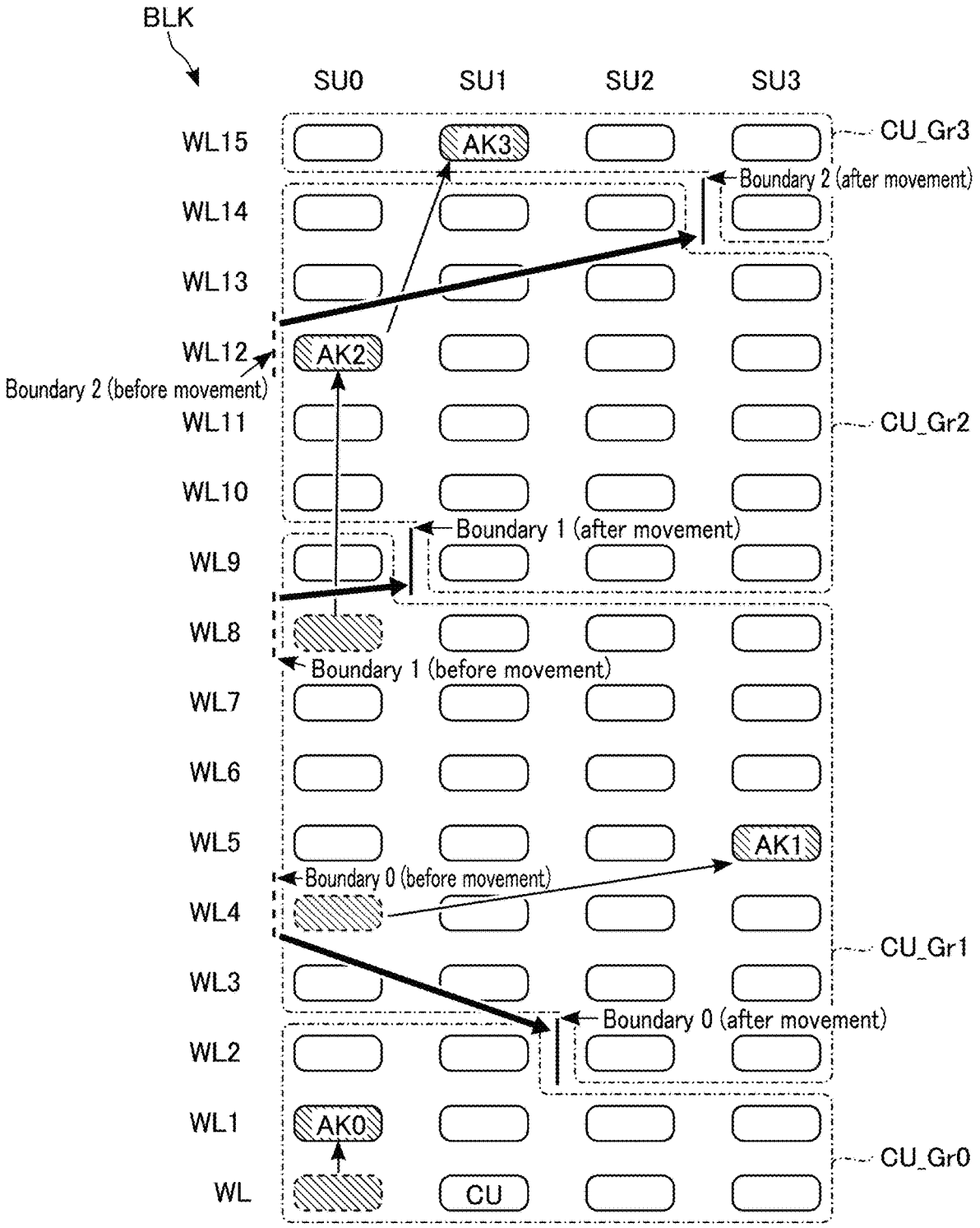
F I G. 33

| BLK | CU_Gr | Vth information | | | Anchor conversion information | CU_Gr conversion information |
|---|---|---|---|---|---|---|
| | | AR | BR | CR | | |
| BLK0 | CU_Gr0 | △VA0 | △VB0 | △VC0 | 0000100 | — |
| | CU_Gr1 | △VA1 | △VB1 | △VC1 | 0000111 | 1111010 |
| | CU_Gr2 | △VA2 | △VB2 | △VC2 | 0010000 | 0000101 |
| | CU_Gr3 | △VA3 | △VB3 | △VC3 | 0001101 | 0001011 |

F I G. 34

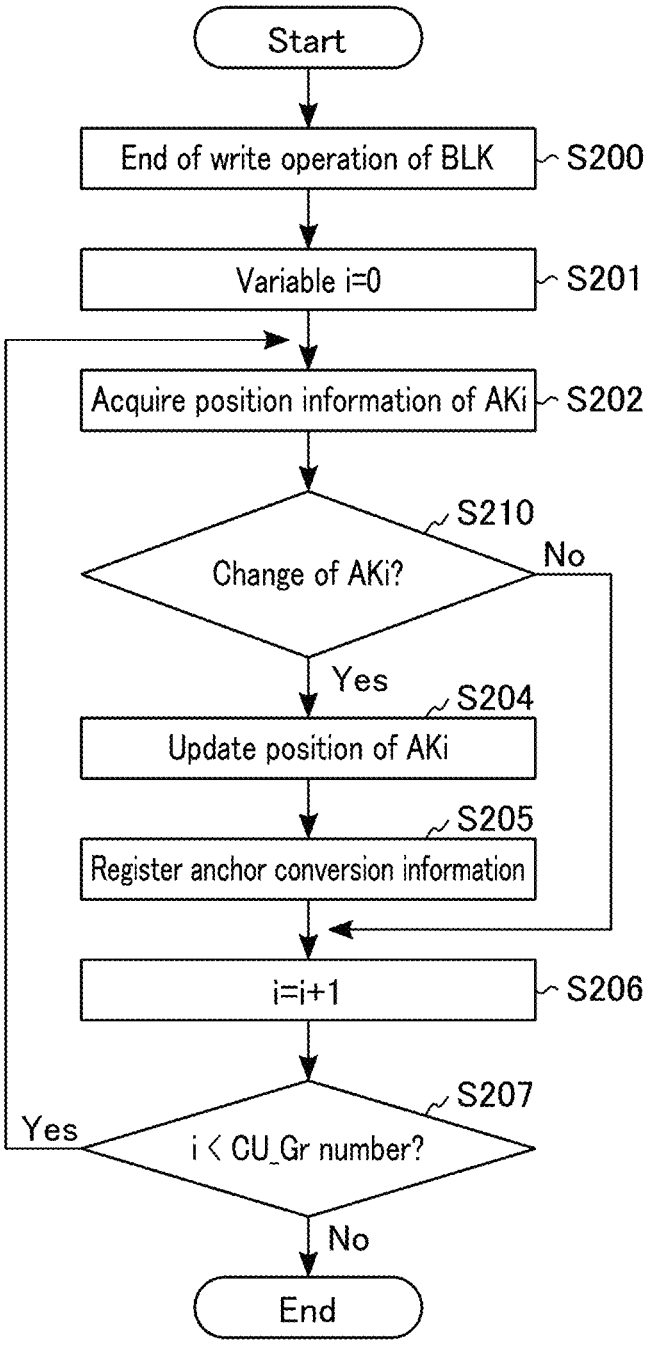
F I G. 35

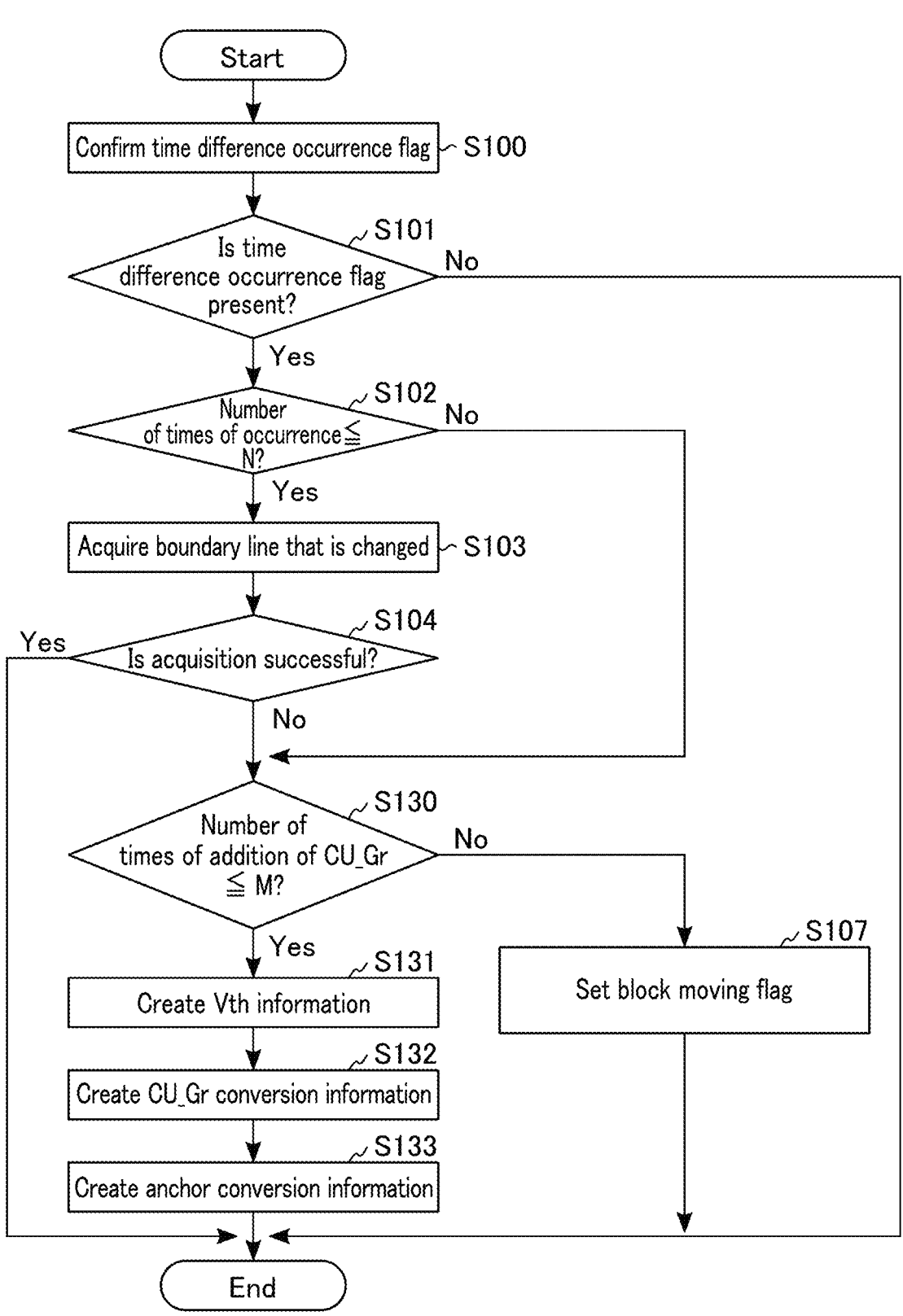
F I G. 36

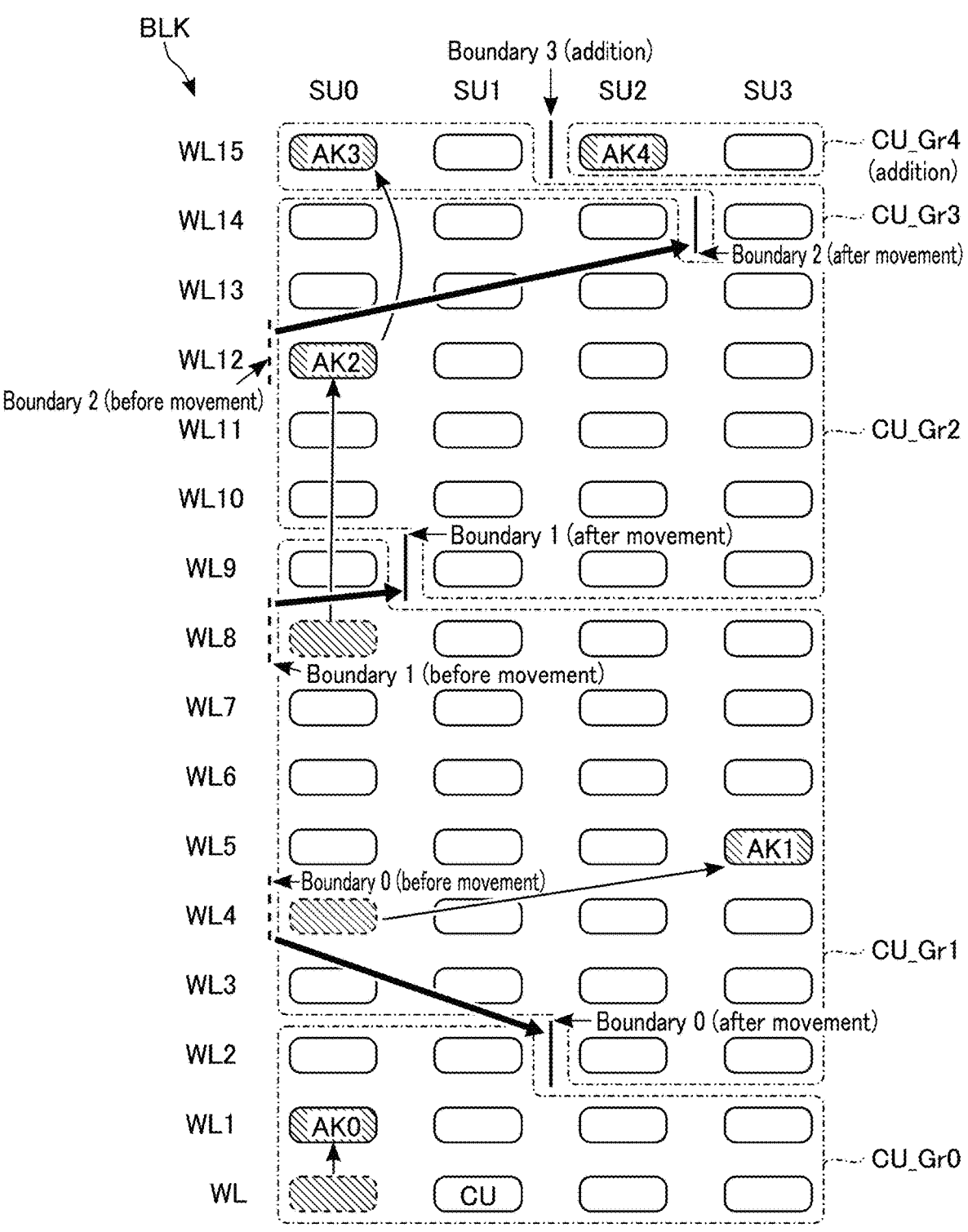
F I G. 37

| BLK | CU_Gr | Vth information | | | Anchor conversion information | CU_Gr conversion information |
|---|---|---|---|---|---|---|
| | | AR | BR | CR | | |
| BLK0 | CU_Gr0 | ΔVA0 | ΔVB0 | ΔVC0 | 0000100 | — |
| | CU_Gr1 | ΔVA1 | ΔVB1 | ΔVC1 | 0000111 | 1111010 |
| | CU_Gr2 | ΔVA2 | ΔVB2 | ΔVC2 | 0010000 | 0000101 |
| | CU_Gr3 | ΔVA3 | ΔVB3 | ΔVC3 | 0001100 | 0001011 |
| | CU_Gr4 | ΔVA4 | ΔVB4 | ΔVC4 | 0111010 | 0111000 |

F I G. 38

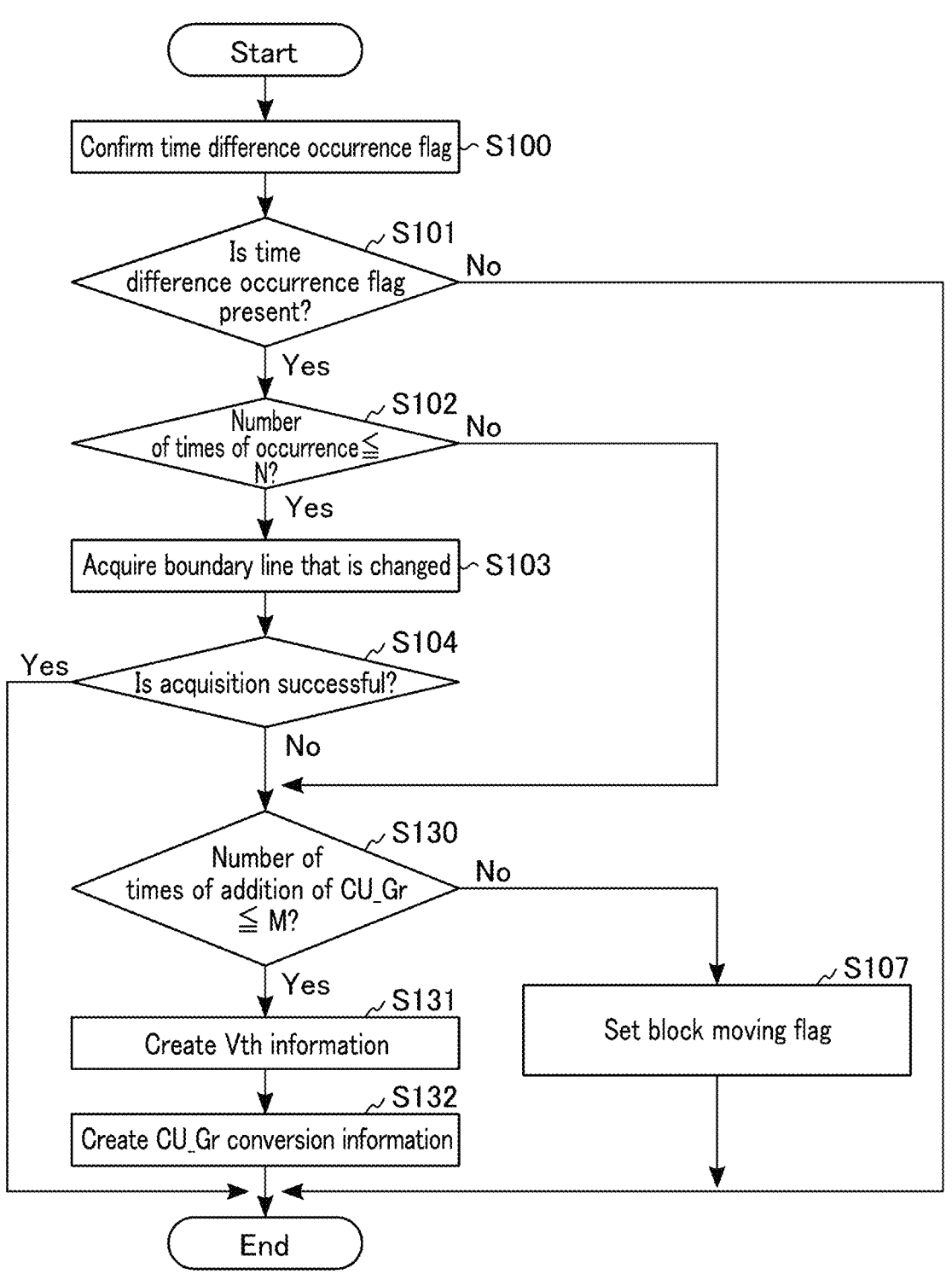
F I G. 39

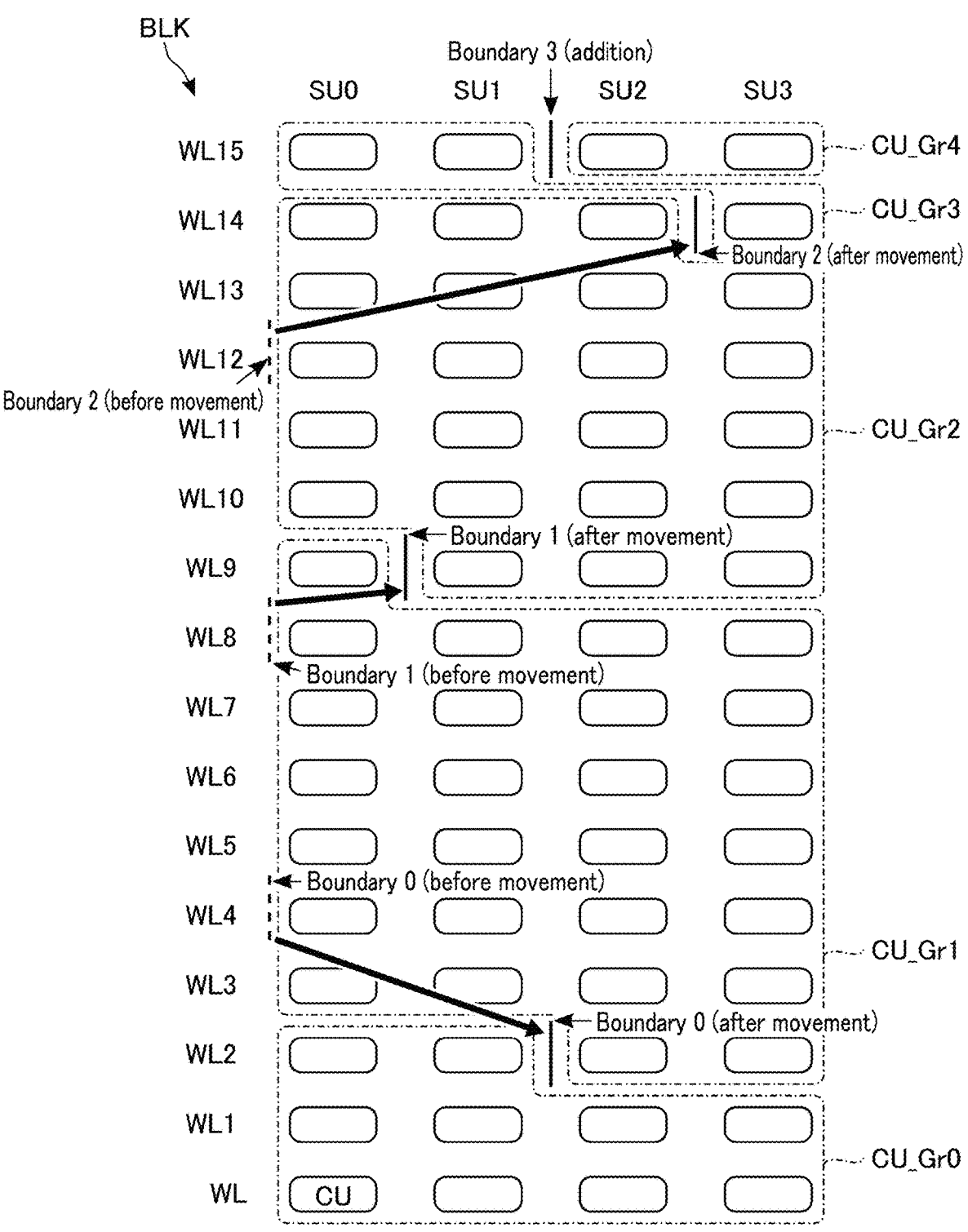
F I G. 40

| BLK | CU_Gr | Vth information | | | CU_Gr conversion information |
|---|---|---|---|---|---|
| | | AR | BR | CR | |
| BLK0 | CU_Gr0 | △VA0 | △VB0 | △VC0 | — |
| | CU_Gr1 | △VA1 | △VB1 | △VC1 | 1111010 |
| | CU_Gr2 | △VA2 | △VB2 | △VC2 | 0000101 |
| | CU_Gr3 | △VA3 | △VB3 | △VC3 | 0001011 |
| | CU_Gr4 | △VA4 | △VB4 | △VC4 | 0111000 |

F I G. 41

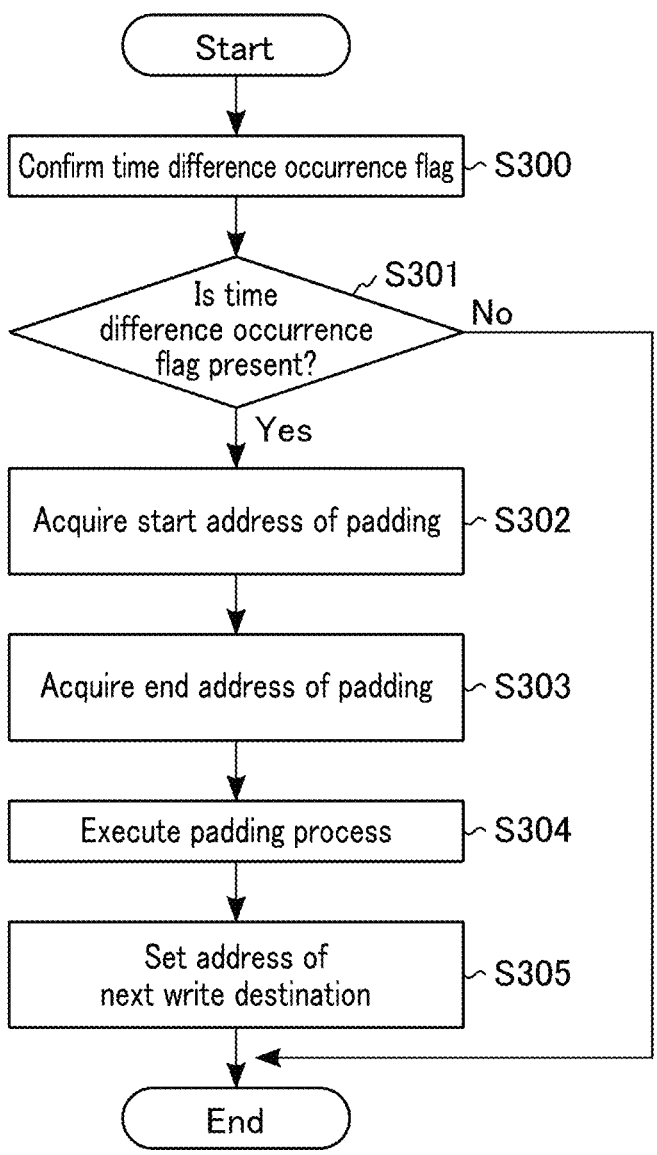
F I G. 42

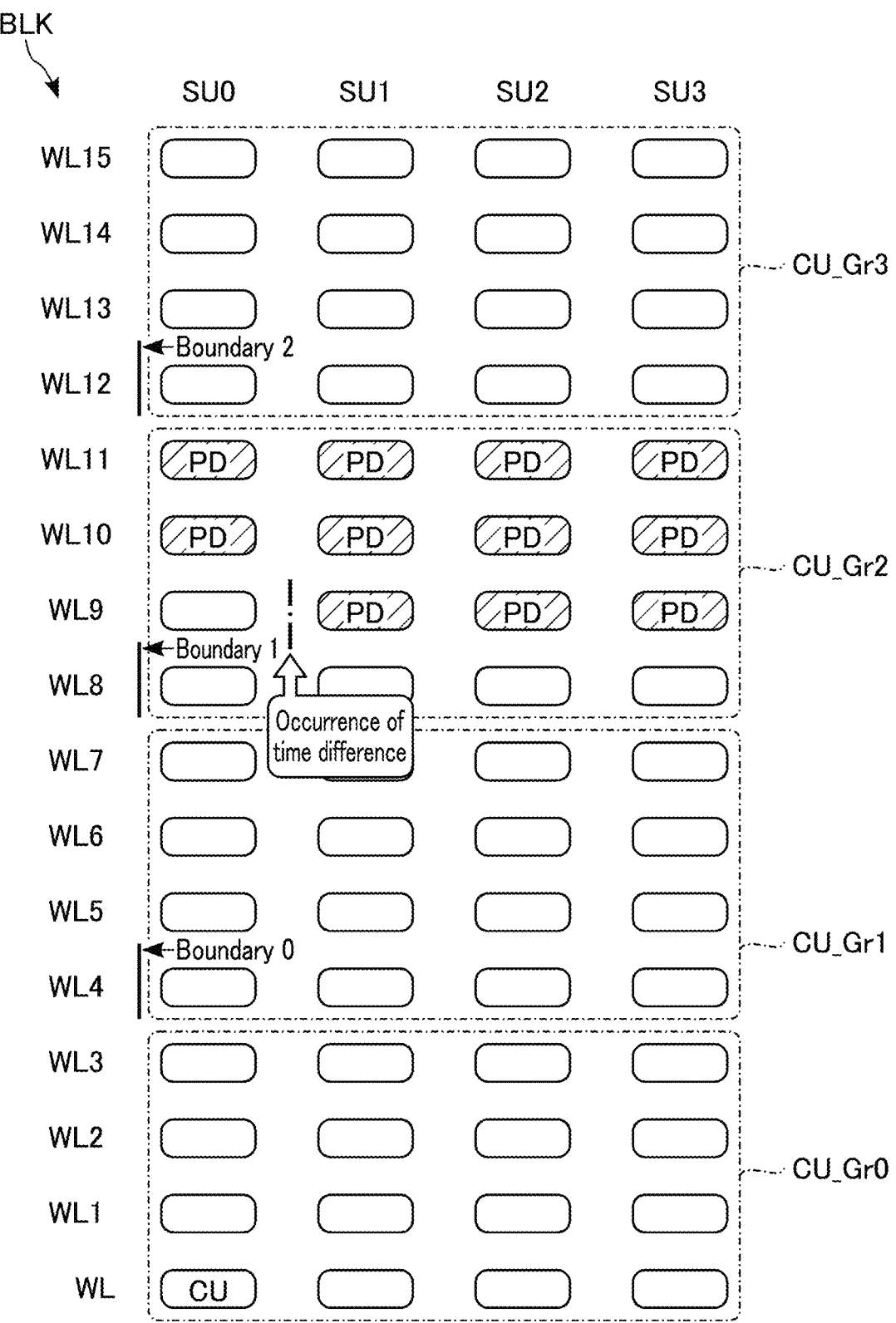
F I G. 44

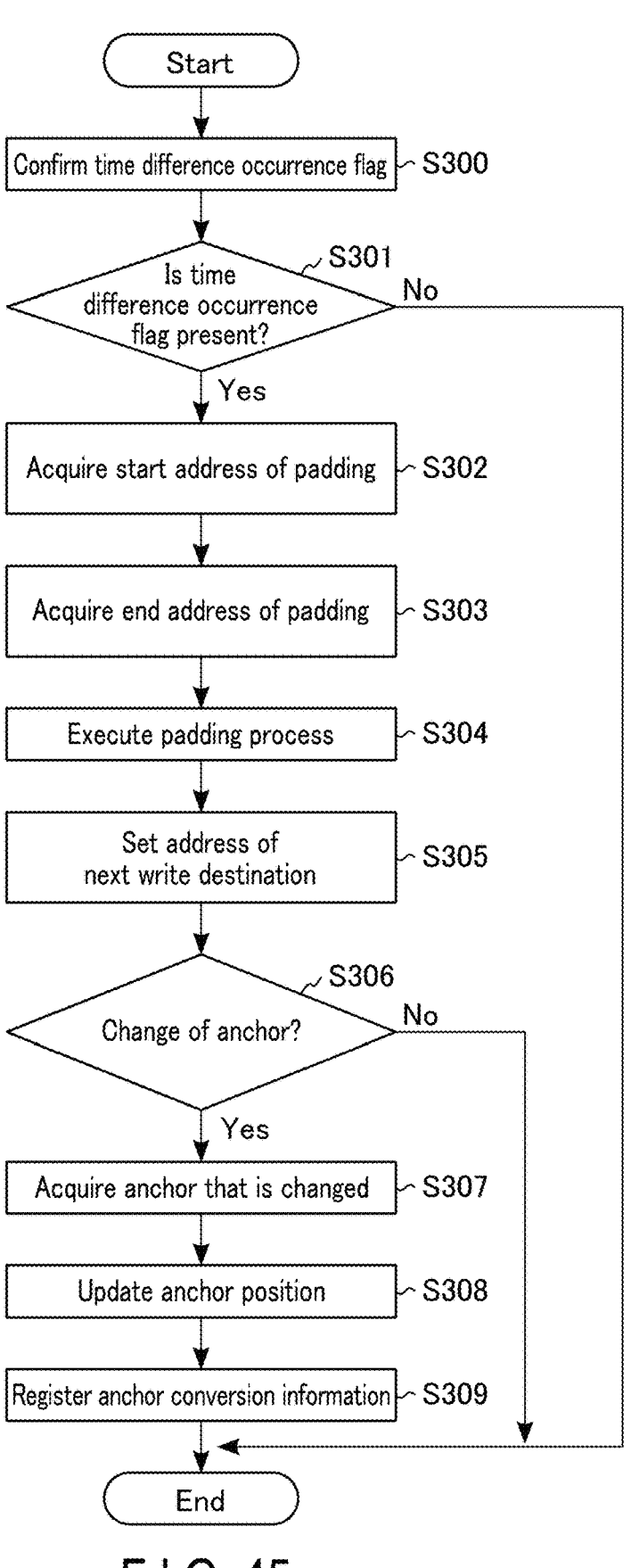
F I G. 45

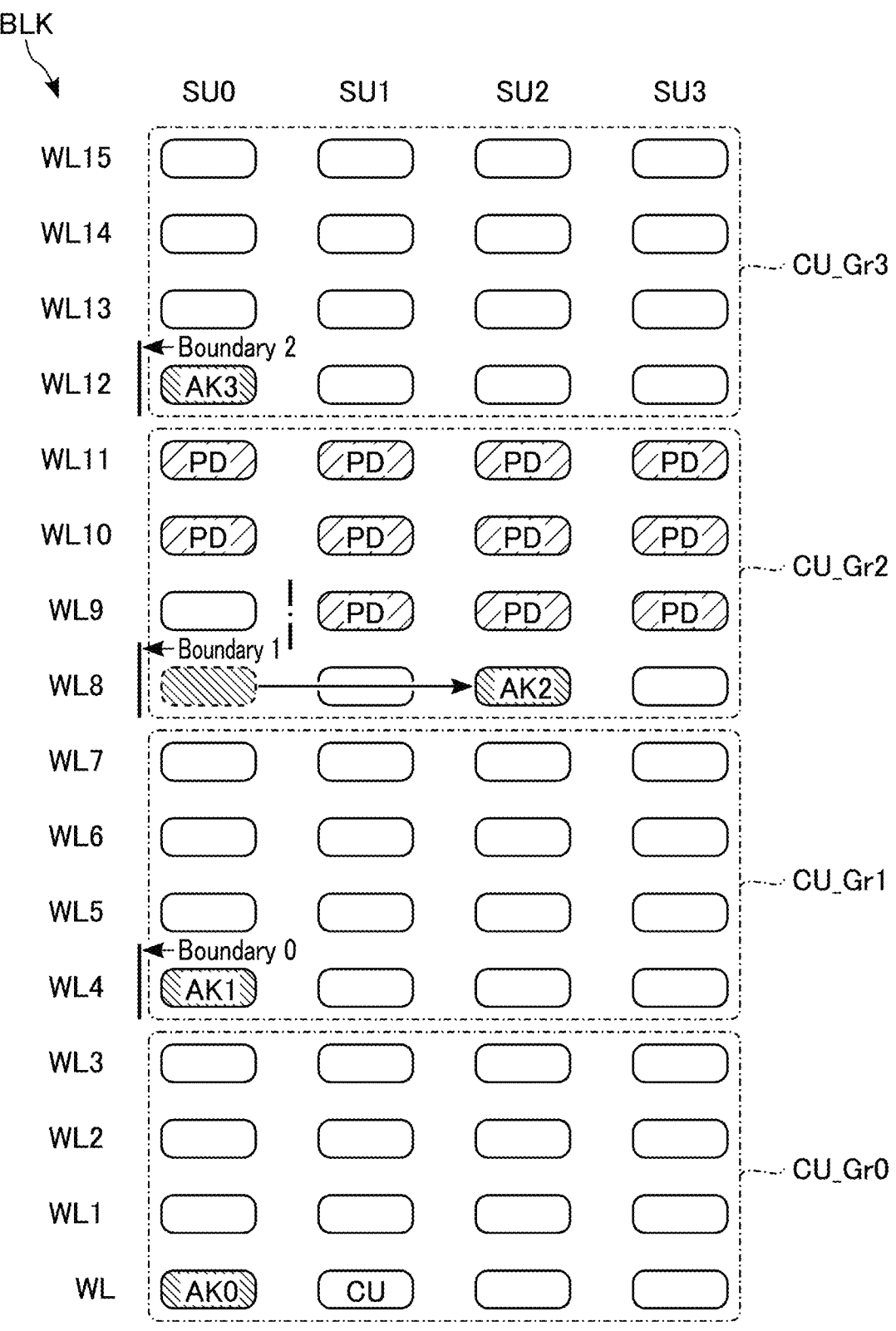
F I G. 46

| BLK | CU_Gr | Vth information | | | Anchor conversion information |
|---|---|---|---|---|---|
| | | AR | BR | CR | |
| BLK0 | CU_Gr0 | $\triangle$VA0 | $\triangle$VB0 | $\triangle$VC0 | — |
| | CU_Gr1 | $\triangle$VA1 | $\triangle$VB1 | $\triangle$VC1 | — |
| | CU_Gr2 | $\triangle$VA2 | $\triangle$VB2 | $\triangle$VC2 | 0010 |
| | CU_Gr3 | $\triangle$VA3 | $\triangle$VB3 | $\triangle$VC3 | — |

F I G. 47

MEMORY SYSTEM

CROSS-REFERENCE TO RELATED APPLICATION

This application is based upon and claims the benefit of priority from prior Japanese Patent Application No. 2023-128545, filed Aug. 7, 2023, the entire contents of which are incorporated herein by reference.

FIELD

Embodiments described herein relate generally to a memory system.

BACKGROUND

As a memory system, there is known a solid state drive (SSD) in which a nonvolatile memory device, such as a NAND flash memory, is mounted.

BRIEF DESCRIPTION OF THE DRAWINGS

FIG. 1 is a block diagram illustrating an example of an entire configuration of a data processing device including a memory system according to a first embodiment.

FIG. 2 is a block diagram illustrating an example of a configuration of a memory chip included in the memory system according to the first embodiment.

FIG. 3 is a diagram illustrating an example of a configuration of a memory area of a bank included in the memory system according to the first embodiment.

FIG. 4 is a diagram illustrating an example of a configuration of a memory area of a nonvolatile memory in a case where the memory system according to the first embodiment is a ZNS-adaptive memory system.

FIG. 7 is a cross-sectional view of a NAND string that is a partial area of a block included in the memory system according to the first embodiment.

FIG. 9 is a schematic diagram illustrating an example of a configuration of cell unit groups in one block included in the memory system according to the first embodiment.

FIG. 10 is a table illustrating an example of a structure of Vth information in the memory system according to the first embodiment.

FIG. 11 is a table illustrating an example of CU_Gr conversion information in the memory system according to the first embodiment.

FIG. 12 is a flowchart illustrating an example of a flow of a write operation in the memory system according to the first embodiment.

FIG. 13 is a flowchart illustrating an example of a flow of registration of CU_Gr conversion information in the memory system according to the first embodiment.

FIG. 14 is a schematic diagram illustrating a first concrete example of a boundary line movement in one block included in the memory system according to the first embodiment.

FIG. 15 is a table illustrating an example of CU_Gr conversion information in the first concrete example of the boundary line movement in the memory system according to the first embodiment.

FIG. 16 is a schematic diagram illustrating a second concrete example of the boundary line movement in one block included in the memory system according to the first embodiment.

FIG. 17 is a table illustrating an example of CU_Gr conversion information in the second concrete example of the boundary line movement in the memory system according to the first embodiment.

FIG. 18 is a schematic diagram illustrating an example of a configuration of cell unit groups in one block included in a memory system according to a first modification of the first embodiment.

FIG. 19 is a schematic diagram illustrating a first concrete example of the boundary line movement in one block included in the memory system according to the first modification of the first embodiment.

FIG. 20 is a schematic diagram illustrating a second concrete example of the boundary line movement in one block included in the memory system according to the first modification of the first embodiment.

FIG. 21 is a table illustrating an example of CU_Gr conversion information and anchor conversion information in a memory system according to a second embodiment.

FIG. 22 is a flowchart illustrating an example of a flow of registration of CU_Gr conversion information and anchor conversion information in the memory system according to the second embodiment.

FIG. 23 is a schematic diagram illustrating a first concrete example of a movement of a boundary line and an anchor in one block included in the memory system according to the second embodiment.

FIG. 24 is a table illustrating an example of CU_Gr conversion information and anchor conversion information in the first concrete example of the movement of the boundary line and the anchor in the memory system according to the second embodiment.

FIG. 25 is a schematic diagram illustrating a second concrete example of the movement of the boundary line and the anchor in one block included in the memory system according to the second embodiment.

FIG. 26 is a table illustrating an example of Vth information, CU_Gr conversion information, and anchor conversion information in the second concrete example of the movement of the boundary line and the anchor in the memory system according to the second embodiment.

FIG. 27 is a schematic diagram illustrating a third concrete example of the movement of the boundary line and the anchor in one block included in the memory system according to the second embodiment.

FIG. 28 is a table illustrating an example of Vth information, CU_Gr conversion information, and anchor conversion information in the third concrete example of the movement of the boundary line and the anchor in the memory system according to the second embodiment.

FIG. 29 is a schematic diagram illustrating a fourth concrete example of the movement of the boundary line and the anchor in one block included in the memory system according to the second embodiment.

FIG. 30 is a table illustrating an example of Vth information, CU_Gr conversion information, and anchor conversion information in the fourth concrete example of the movement of the boundary line and the anchor in the memory system according to the second embodiment.

FIG. 31 is a flowchart illustrating a flow of registration of anchor conversion information in a memory system according to a modification of the second embodiment.

FIG. 32 is a flowchart illustrating an example of a flow of registration of CU_Gr conversion information and anchor conversion information in a memory system according to a third embodiment.

FIG. 33 is a schematic diagram illustrating a concrete example of a movement of a boundary line and an anchor in one block included in the memory system according to the third embodiment.

FIG. 34 is a table illustrating an example of Vth information, CU_Gr conversion information, and anchor conversion information in the concrete example of the movement of the boundary line and the anchor in the memory system according to the third embodiment.

FIG. 35 is a flowchart illustrating a flow of registration of anchor conversion information in a memory system according to a modification of the third embodiment.

FIG. 36 is a flowchart illustrating an example of a flow of addition of a cell unit group and an anchor in a memory system according to a fourth embodiment.

FIG. 37 is a schematic diagram illustrating a concrete example of adding a cell unit group and an anchor in one block included in the memory system according to the fourth embodiment.

FIG. 38 is a table illustrating an example of Vth information, CU_Gr conversion information, and anchor conversion information in the concrete example of the addition of the cell unit group and anchor in the memory system according to the fourth embodiment.

FIG. 39 is a flowchart illustrating an example of a flow of addition of a cell unit group in a memory system according to a modification of the fourth embodiment.

FIG. 40 is a schematic diagram illustrating a concrete example of adding a cell unit group in one block included in the memory system according to the modification of the fourth embodiment.

FIG. 41 is a table illustrating an example of Vth information, CU_Gr conversion information, and anchor conversion information in the concrete example of the addition of the cell unit group in the memory system according to the modification of the fourth embodiment.

FIG. 42 is a flowchart illustrating an example of a flow of an insertion process of padding data in a memory system according to a fifth embodiment.

FIG. 44 is a schematic diagram illustrating a concrete example of inserting padding data in one block included in a memory system according to a modification of the fifth embodiment.

FIG. 45 is a flowchart illustrating an example of a flow of an insertion process of padding data and registration of anchor conversion information in a memory system according to a sixth embodiment.

FIG. 46 is a schematic diagram illustrating a concrete example of inserting padding data and moving an anchor in one block included in a memory system according to a sixth embodiment.

FIG. 47 is a table illustrating an example of Vth information and anchor conversion information in the concrete example of the padding data insertion and anchor movement in the memory system according to the sixth embodiment.

DETAILED DESCRIPTION

Figure 5:
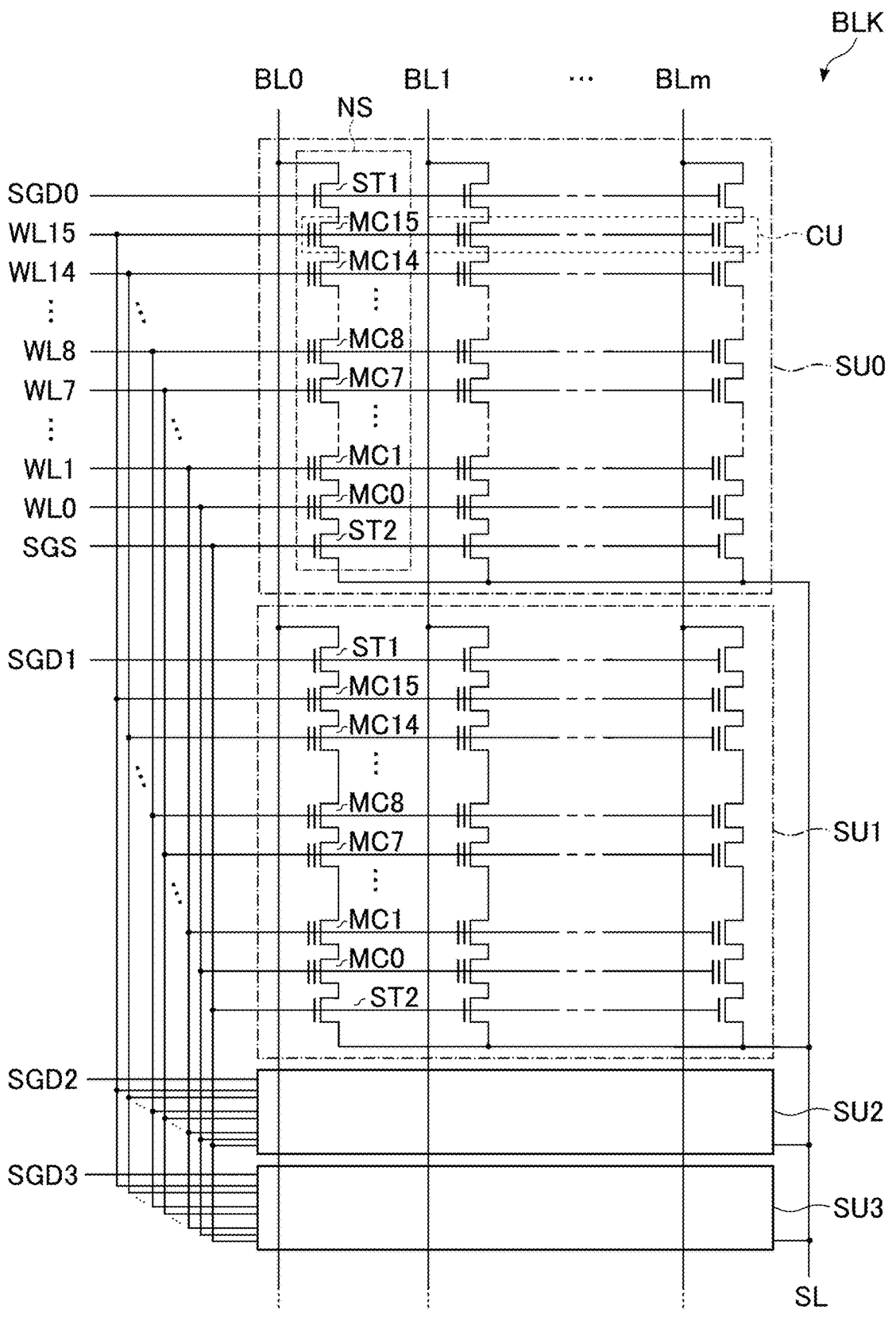
FIG. 5 is a circuit diagram illustrating a configuration of a memory cell array included in the memory system according to the first embodiment.

In general, according to one embodiment, a memory system includes a memory chip including a block that includes a plurality of cell units and a memory controller. Each of the plurality of cell units including a plurality of memory cells. A first cell unit and a second cell unit of the plurality of cell units are classified into a first group, and a third cell unit of the plurality of cell units is classified into a second group. The memory controller is configured to use a first correction amount of a read voltage when data is read from the plurality of memory cells of a cell unit classified into the first group among the plurality of cell units, to use a second correction amount of the read voltage when data is read from the memory cells of a cell unit classified into the second group among the plurality of cell units. In a case where a time difference from execution of a write operation of the first cell unit to execution of the write operation of the second cell unit exceeds a reference value, the memory controller is configured to change a boundary position between the first group and the second group to between the first cell unit and the second cell unit, and to classify the second cell unit into the second group.

Hereinafter, embodiments are described with reference to the accompanying drawings. The drawings are schematic ones. In the description below, elements having substantially the same functions and configurations are denoted by the same reference signs. Numerals after the letters forming the reference signs are used to distinguish elements that are denoted by the reference signs including the same letters and that have similar configurations. If there is no need to mutually distinguish the elements that are denoted by the reference signs including the same letters, these elements are denoted by the reference signs that include only the letters.

Hereinafter, a memory system according to an embodiment is described.

1. First Embodiment

1.1. Configuration

1.1.1. Configuration of Data Processing Device

First, referring to FIG. 1, an example of a configuration of a data processing device 1 including a memory system is described. FIG. 1 is a block diagram illustrating an example of an entire configuration of the data processing device 1.

As illustrated in FIG. 1, the data processing device 1 includes a host device 2 and a memory system 3. The data processing device 1 can include a plurality of host devices 2 or a plurality of memory systems 3. In a case where the data processing device 1 includes a plurality of host devices 2 and a plurality of memory systems 3, the memory systems 3 may be coupled to one host device 2. In addition, the host devices 2 may be coupled to one memory system 3.

The host device 2 is an information processing device (computing device) that accesses the memory system 3. The host device 2 controls the memory system 3. More specifically, for example, the host device 2 requests (instructs) the memory system 3 to execute a write operation or a read operation.

The memory system 3 is, for example, a solid state drive (SSD). The memory system 3 is coupled to the host device 2 via a host bus HB. In the present embodiment, a case is described in which peripheral component interconnect express (PCIe) (trademark) is applied as a coupling standard for mutually coupling the host device 2 and the memory system 3, and non-volatile memory express (NVMe) (trademark) is applied as a communication protocol. The memory system 3 of the present embodiment may adapt to zoned namespace (ZNS) that is one of NVMe standards (hereinafter referred to as "ZNS-adaptive memory system"), or may not adapt to ZNS (hereinafter "ZNS-nonadaptive memory system"). In a case where the memory system 3 is a ZNS-adaptive memory system, the memory system 3 does not have a function as a flash translation layer (FTL) that correlates a logical address received from the host device 2 with a physical address of a nonvolatile memory. In this case, the host device 2 allocates, in a memory area, hot data (data with a relatively high access frequency) or cold data (data with a relatively low access frequency) to each of zones. The zones are divided memory areas of the nonvola-tile memory 10. The memory system 3 executes a write operation, an erase operation, or the like, on a zone-by-zone basis. For example, in a case where a plurality of host devices 2 are coupled to the memory system 3, different zones are allocated to the respective host devices 2.

For example, in a case where the memory system 3 is a ZNS-nonadaptive memory system, the memory system 3 executes garbage collection and an insertion process of padding data.

The garbage collection is a process of reading valid data from a plurality of blocks and rewriting (copying) the read data into another block. The blocks, from which all valid data was copied by the garbage collection, enter an erasable state. For example, the erase operation in the nonvolatile memory 10 is executed for each data area called "block". On the other hand, the write operation and read operation are executed in units of data called "page". The block includes a plurality of pages. Accordingly, the unit of data erase is different from the unit of data write and the unit of data read. In a case of rewriting data in the nonvolatile memory 10, new data is written in another page. Thus, if rewrite of data progresses, invalid data in the block increases. Even if the invalid data in the block increases, if even one valid data remains, the erase operation of the block cannot be executed. For example, if the number of erasable blocks decreases, garbage collection is executed.

The insertion process of padding data is a process of writing padding data (invalid data) in an unwritten area of a block during data write (hereinafter, also referred to as "write block"). For example, there is a case where in the write block, a length of time intervenes from a previous (latest) write operation to a next write operation. In the description below, in a case where an elapsed time from the previous (latest) write operation to the next write operation exceeds a preset reference value, this case is described as "a time difference has occurred". An optimal value of a read voltage is different between data before, and data after, the occurrence of the time difference. Thus, if data written after the occurrence of the time difference is read, the number of error bits due to erroneous read increases. In order to suppress the increase of error bits, in a case where the time different has occurred, the write operation of valid data is not executed in the unwritten area of the write block, and the insertion process of padding data is executed. In this case, in the next write operation, another block is selected.

On the other hand, in the ZNS-adaptive memory system, the garbage collection and the insertion process of padding data are not executed. Thereby, since the increase of invalid data is suppressed, an increase of a write amplification factor (WAF) is suppressed.

Note that as coupling standards, use is made of small computer system interface (SCSI), serial attached SCSI (SAS), advanced technology attachment (ATA), serial ATA (SATA), Ethernet (trademark), Fibre channel, and the like.

1.1.2. Configuration of the Memory System

Subsequently, referring to FIG. 1, an example of a con-figuration of the memory system 3 is described.

As illustrated in FIG. 1, the memory system 3 includes a nonvolatile memory 10, a volatile memory 20, and a memory controller 30.

The nonvolatile memory 10 is a nonvolatile storage medium (semiconductor storage device). The nonvolatile memory 10 nonvolatilely stores data received from the memory controller 30. Hereinafter, a case is described in which the nonvolatile memory 10 is a NAND flash memory. Note that the nonvolatile memory 10 may be a nonvolatile storage medium other than the NAND flash memory.

The volatile memory 20 is a volatile storage medium (semiconductor storage device). Hereinafter, a case is described in which the volatile memory 20 is adynamic random access memory (DRAM). Note that the volatile memory 20 may be a volatile storage medium other than the DRAM.

The memory controller 30 is, for example, a system on a chip (SoC). Based on a request (instruction) from the host device 2, the memory controller 30 instructs the nonvolatile memory 10 to execute a read operation, a write operation, an erase operation, and the like. In addition, the memory controller 30 manages a memory area of the nonvolatile memory 10.

Next, an example of an internal configuration of the nonvolatile memory 10 is described. The nonvolatile memory 10 can include a plurality of memory chips 11 (hereinafter, also referred to simply as "chips"). Each of the memory chips 11 can operate independently. Note that the number of memory chips 11 included in the nonvolatile memory 10 is arbitrary.

The memory chip 11 is, for example, a semiconductor chip on which a NAND flash memory is mounted. Note that the memory chip 11 may be some other nonvolatile memory. The memory chip 11 nonvolatilely stores data. The memory chip 11 is coupled to the memory controller 30 via a NAND bus NB.

Note that the number of NAND buses NB and the number of memory chips 11 coupled to one NAND bus NB are arbitrary.

Next, an example of an internal configuration of the memory controller 30 is described. The memory controller 30 includes a control circuit 31, a buffer memory 32, a host interface circuit (host I/F) 33, an error check and correction (ECC) circuit 34, a NAND interface circuit (NAND I/F) 35, a read voltage correction circuit 36, a RAM interface circuit (RAM I/F) 37, and a time difference timer 38. These circuits are mutually coupled by, for example, an internal bus of the memory controller 30. Note that the functions of the host interface circuit 33, the ECC circuit 34, the NAND interface circuit 35, the read voltage correction circuit 36, the RAM interface circuit 37, and the time difference timer 38 may be implemented by dedicated circuit, or may be implemented by the control circuit 31 executing firmware.

The control circuit 31 is circuit that controls the entirety of the memory controller 30. For example, the control circuit 31 controls the buffer memory 32, the host interface circuit 33, the ECC circuit 34, the NAND interface circuit 35, the read voltage correction circuit 36, the RAM interface circuit 37, and the time difference timer 38. The control circuit 31 includes, for example, a processor such as a central process-ing unit (CPU), and a read only memory (ROM). For example, based on a request of the host device 2, the control circuit 31 instructs the nonvolatile memory 10 (memory chip 11) to execute a write operation, a read operation, and an erase operation. The control circuit 31 controls the nonvola-tile memory 10.

The buffer memory 32 is a volatile semiconductor memory. The buffer memory 32 temporarily stores data that the memory controller 30 reads from the nonvolatile memory 10, data that is received from the host device 2, and the like. In addition, for example, the buffer memory 32 stores block management information. Note that the block management information may be stored in the volatile memory 20.

The block management information is management information of each block included in the memory chip 11. The block management information includes threshold voltage information (hereinafter, also referred to as "Vth information"), cell unit group conversion information (hereinafter, also referred to as "CU_Gr conversion information), and the like.

The Vth information is information relating to correction amounts of read voltages that are set for each of cell unit groups. The cell unit group is a group of cell units included in one block. The cell unit is a set of memory cell transistors that are selected collectively in the write operation or the read operation. For example, the Vth information is updated, based on a result of a patrol process.

The patrol process is executed periodically or nonperiodically, in order to read data stored in the nonvolatile memory 10, with a small error bit number. The patrol process includes, for example, a patrol read process, and a correction amount calculation process of calculating a correction amount of a read voltage, based on a result of the patrol read process. The control circuit 31 may execute the patrol process for each cell unit in the cell unit group, or may execute the patrol process for a freely selected cell unit in the cell unit group.

The CU_Gr conversion information is conversion information of grouping of cell unit groups in the block. In other words, the CU_Gr conversion information is information relating to a change (movement) of a boundary position between cell unit groups. For example, in a case where a time difference of the write operation has occurred in the write block, the control circuit 31 changes the grouping of cell unit groups. Specifically, the control circuit 31 changes the position of the boundary line between cell unit groups. The control circuit 31 registers the changed information as the CU_Gr conversion information.

The host interface circuit 33 is interface circuit coupled to the host device 2. The host interface circuit 33 controls communication between the host device 2 and the memory controller 30. The host interface circuit 33 transmits the request and data received from the host device 2, to the control circuit 31 and buffer memory 32, respectively. In addition, based on the control by the control circuit 31, the host interface circuit 33 transmits the data in the buffer memory 32 to the host device 2.

The ECC circuit 34 executes an error detection process and an error correction process relating to data stored in the nonvolatile memory 10. Specifically, in the write operation, the ECC circuit 34 adds an error correction code to write data. In the read operation, the ECC circuit 34 decodes read data, and detects the presence or absence of an error bit. Then, if the error bit is detected, the ECC circuit 34 specifies a column address (error position) of the error bit, and executes error correction.

The NAND interface circuit 35 controls communication between the memory controller 30 and the nonvolatile memory 10. More specifically, the NAND interface circuit 35 transmits to the memory chip 11 a command corresponding to the write operation, the read operation, the erase operation, or the like. In addition, in the read operation, the NAND interface circuit 35 receives read data from the memory chip 11. The NAND interface circuit 35 can include a plurality of channels CH (CH0, CH1, CH2, . . . ). A plurality of memory chips 11 can be coupled to each channel CH via the NAND bus NB.

In the present embodiment, a bank BK is configured by one memory chip 11 coupled to each of the channels CH (NAND buses NB). A plurality of memory chips 11 included in the bank BK are operable in parallel.

The read voltage correction circuit 36 includes a function of calculating a correction amount (Vth information) of a read voltage that is used at a time of the read operation in the nonvolatile memory 10.

The RAM interface circuit 37 manages communication between the volatile memory 20 and the memory controller 30. A bus RB that couples the volatile memory 20 and the memory controller 30 supports, for example, a DRAM interface standard.

The time difference timer 38 measures, in each block, an elapsed time (time difference) from the execution of the last write operation to the execution of the next write operation.

1.1.3. Configuration of the Memory Chip

Next, referring to FIG. 2, an example of a configuration of the memory chip 11 is described. FIG. 2 is a block diagram illustrating an example of the configuration of the memory chip 11. Note that in the example of FIG. 2, some of couplings between the structural elements are indicated by arrows. However, the couplings between the structural elements are not limited to these.

As illustrated in FIG. 2, the memory chip 11 transmits and receives signals DQ and timing signals DQS and bDQS to and from the memory controller 30 (more specifically, the NAND interface circuit 35) via the NAND bus NB. The signal DQ is, for example, data DAT, an address ADD, or a command CMD. The timing signals DQS and bDQS are timing signals that are used at a time of input and output of data DAT. The timing signal bDQS is an inverted signal of the timing signal DQS.

In addition, the memory chip 11 receives, for example, a chip enable signal bCE, a command latch enable signal CLE, an address latch enable signal ALE, a write enable signal bWE, and a read enable signal bRE, from the memory controller 30 via the NAND bus NB. Besides, the memory chip 11 transmits a ready/busy signal bRB to the memory controller 30 via the NAND bus NB.

The chip enable signal bCE is a signal for enabling the memory chip 11. The signal bCE is asserted, for example, at Low ("L") level.

The command latch enable signal CLE is a signal indicating that the signal DQ is the command. The signal CLE is asserted, for example, at High ("H") level.

The address latch enable signal ALE is a signal indicating that the signal DQ is the address. The signal ALE is asserted, for example, at "H" level.

The write enable signal bWE is a signal for taking in the signal DQ in a case where the signal DQ is the command CMD or the address ADD. The signal bWE is asserted, for example, at "L" level at a timing when the memory chip 11 takes in the command CMD or the address ADD. Thus, each time the signal bWE is toggled, the command CMD or the address ADD is taken in the memory chip 11.

The read enable signal bRE is a signal for the memory controller 30 to read data from the memory chip 11. The signal bRE is asserted, for example, at "L" level. For example, at a time of data output, the memory chip 11 generates the signals DQS and bDQS, based on the signal bRE.

The ready/busy signal bRB is a signal indicating whether the memory chip 11 is in a receivable state of the command CMD from the memory controller 30, or in an unreceivable state of the command CMD. A ready state is a state in which the memory chip 11 can receive the command CMD from the memory controller 30. A busy state is a state in which the memory chip 11 cannot receive the command CMD from the memory controller 30. For example, the ready/busy signal bRB is set at "L" level when the memory chip 11 is in the busy state.

Next, an internal configuration of the memory chip 11 is described. The memory chip 11 includes an input/output circuit 101, a logic control circuit 102, an address register 103, a command register 104, a status register 105, a sequencer 106, a ready/busy circuit 107, a voltage generator 108, and a plurality of planes PLN.

The input/output circuit 101 is circuit that executes input and output of the signals DQ and timing signals DOS and bDQS from and to the memory controller 30. The input/output circuit 101 is coupled to the NAND interface circuit 35 of the memory controller 30. In addition, the input/output circuit 101 is coupled to the logic control circuit 102, the address register 103, the command register 104, the status register 105, and a data register 112 of each plane PLN.

The logic control circuit 102 is circuit that executes logic control of the memory chip 11. The logic control circuit 102 receives, for example, the signals bCE, CLE, ALE, bWE, and bRE from the memory controller 30. The logic control circuit 102 is coupled to the input/output circuit 101 and the sequencer 106. Based on a received signal, the logic control circuit 102 controls the input/output circuit 101 and the sequencer 106.

The address register 103 is a register that temporarily stores the address ADD. The address register 103 is coupled to the input/output circuit 101, and to a row decoder 110 and a column decoder 113 of each plane PLN. The address ADD includes a row address RA and a column address CA. The address register 103 transmits the row address RA to the row decoder 110. In addition, the address register 103 transmits the column address CA to the column decoder 113.

The command register 104 is a register that temporarily stores the command CMD. The command register 104 is coupled to the input/output circuit 101 and the sequencer 106. The command register 104 transmits the command CMD to the sequencer 106.

The status register 105 is a register that temporarily stores status information STS. For example, the status information STS includes information relating to a result of the write operation, the read operation, the erase operation, and the like. The status register 105 is coupled to the sequencer 106. For example, the status information STS is transmitted to the memory controller 30 as an output signal DQ.

The sequencer 106 is circuit that controls an operation of the entirety of the memory chip 11. The sequencer 106 is coupled to the logic control circuit 102, the address register 103, the command register 104, the status register 105, the ready/busy circuit 107, the voltage generator 108, the row decoder 110 and a sense amplifier 111 of each plane PLN, and the like. The sequencer 106 controls the status register 105, the ready/busy circuit 107, the voltage generator 108, the row decoder 110 and the sense amplifier 111 of each plane PLN, and the like. Based on the command CMD, the sequencer 106 executes the write operation, the read operation, the erase operation, and the like.

The ready/busy circuit 107 is circuit that generates the ready/busy signal bRB. The ready/busy circuit 107 is coupled to the sequencer 106. Based on the control of the sequencer 106, the ready/busy circuit 107 generates the ready/busy signal bRB. The ready/busy circuit 107 transmits the ready/busy signal bRB to the memory controller 30.

The voltage generator 108 generates, based on the control of the sequencer 106, various voltages used for the write operation, the read operation, and the erase operation. The voltage generator 108 supplies the various voltages to the memory cell array 109, the row decoder 110, the sense amplifier 111, and the like of each plane PLN.

Each plane PLN is a unit that executes the write operation, the read operation, and the erase operation. In the example of FIG. 2, the memory chip 11 includes two planes PLN0 and PLN1. Note that the number of planes PLN is not limited to two. The number of planes PLN may be one, or may be plural, excluding two. The planes PLN0 and PLN1 can mutually independently execute the write operation, the read operation, or the erase operation. In addition, the planes PLN0 and PLN1 can operate in parallel.

Next, an internal configuration of the plane PLN is described. In the description below, a case is described in which the planes PLN0 and PLN1 have the same configuration. Note that the planes PLN may have different configurations. Hereinafter, in a case where which of the planes PLN0 and PLN1 is not specified, each plane is expressed as "plane PLN". The plane PLN includes a memory cell array 109, a row decoder 110, a sense amplifier 111, a data register 112, and a column decoder 113.

The memory cell array 109 is a set of arrayed memory cell transistors. The memory cell array 109 includes a plurality of blocks BLK. The block BLK is, for example, a set of memory cell transistors in which data is erased collectively. In the example of FIG. 2, the memory cell array 109 includes four blocks BLK0, BLK1, BLK2, and BLK3. Note that the number of blocks BLK in the memory cell array 109 is arbitrary.

The row decoder 110 is decode circuit of the row address RA. The row decoder 110 is coupled to the address register 103, the sequencer 106, the voltage generator 108, and the memory cell array 109. The row decoder 110 selects one of the blocks BLK, based on a decoded result of the row address RA. The row decoder 110 applies voltages to lines (word lines and select gate lines to be described later) in a row direction of the selected block BLK.

The sense amplifier 111 is circuit that executes write and read of the data DAT. The sense amplifier 111 is coupled to the sequencer 106, the voltage generator 108, the memory cell array 109, and the data register 112. In the read operation, the sense amplifier 111 reads the data DAT from the memory cell array 109. In addition, In the write operation, the sense amplifier 111 supplies voltages corresponding to the write data DAT to the memory cell array 109.

The data register 112 is a register that temporarily stores the data DAT. The data register 112 is coupled to the input/output circuit 101, the sequencer 106, the sense amplifier 111, and the column decoder 113. The data register 112 includes a plurality of latch circuits. Each latch circuit temporarily stores write data or read data.

The column decoder 113 is circuit that decodes the column address CA. The column decoder 113 is coupled to the address register 103, the sequencer 106, and the data register 112. The column decoder 113 receives the column address CA from the address register 103. The column decoder 113 selects the latch circuits in the data register 112, based on a decoded result of the column address CA.

1.1.4. Configuration of the Memory Area of the Nonvolatile Memory

Next, referring to FIG. 3 and FIG. 4, a description is given of an example of the configuration of the memory area of the nonvolatile memory in a case where the memory system 3 is a ZNS-adaptive memory system. FIG. 3 is a diagram illustrating an example of the configuration of the memory area of the bank BK. FIG. 4 is a diagram illustrating an example of the configuration of the memory area of the nonvolatile memory 10.

As illustrated in FIG. 3, the memory area of the memory chip 11 includes a plurality of block units BU each being configured by one block BLK of the plane PLN0 and one block BLK of the plane PLN1. The blocks BLK of the block unit BU can operate in parallel. The bank BK includes a plurality of super blocks SB each configured by one block unit BU of each memory chip 11. The blocks BLK in the super block SB can operate in parallel. In a case where the memory system 3 is, for example, the ZNS-adaptive memory system, the super block SB corresponds to a zone.

For example, in a case where the NAND interface circuit 35 includes three channels CH0 to CH2, and each memory chip 11 includes two planes PLN, one super block SB includes six blocks BLK. Note that the configuration of the super block SB is not limited to this. For example, the super block SB may be configured by a plurality of blocks BLK, which can operate in parallel, of a plurality of banks BK.

In a case where the memory system 3 is the ZNS-adaptive memory system, the control circuit 31 manages the memory area of the nonvolatile memory 10 by dividing the memory area into a plurality of zones ZN (super blocks SB) as illustrated in FIG. 4. The memory controller 30 executes the write operation, the read operation, and the erase operation in units of the zone ZN.

1.1.5. Circuitry Configuration of the Memory Cell Array

Next, referring to FIG. 5, an example of the circuit configuration of the memory cell array 109 is described. FIG. 5 is an example of a circuit diagram illustrating a configuration of the memory cell array 109. In the example of FIG. 5, one block BLK, which is included in the memory cell array 109, is extracted and illustrated.

As illustrated in FIG. 5, the block BLK includes a plurality of string units SU. In the example of FIG. 5, the block BLK includes four string units SU0 to SU3. Note that in FIG. 5, the configurations of the string units SU2 and SU3 are illustrated in a simplified manner.

Each string unit SU includes a plurality of NAND strings NS that are associated with bit lines BL0 to BLm (m is an integer of 1 or more), respectively. The NAND string NS includes, for example, memory cell transistors MC0 to MC15, and select transistors ST1 and ST2.

The memory cell transistor MC includes a control gate and a charge storage layer, and stores data nonvolatilely. Each of the select transistors ST1 and ST2 is used to select the string unit SU at a time of various processes.

In each NAND string NS, the memory cell transistors MC0 to MC15 are coupled in series. The select transistor ST1 is coupled between one end of the series-coupled memory cell transistors MC0 to MC15 and the associated bit line BL. The drain of the select transistor ST2 is coupled to the other end of the series-coupled memory cell transistors MC0 to MC15. A source line SL is coupled to the source of the select transistor ST2.

In the same block BLK, the gates of the select transistors ST1 included in the string units SU0 to SU3 are commonly coupled to select gate lines SGD0 to SGD3, respectively. The control gates of the memory cell transistors MC0 to MC15 are commonly coupled to word lines WL0 to WL15, respectively. The gates of the select transistors ST2 are commonly coupled to a select gate line SGS.

The bit lines BL0 to BLm are shared by a plurality of blocks BLK. The same bit line BL is coupled to the NAND strings NS corresponding to the same column address. The word lines WL0 to WL15 are provided for each block BLK. The source line SL is shared by, for example, a plurality of blocks BLK.

Hereinafter, a set of memory cell transistors MC coupled to a common word line WL in one string unit SU is referred to as "cell unit CU". The cell unit CU is used as a unit of data write. For example, the storage capacity of the cell unit CU including memory cell transistors MC each storing one-bit data is defined as "one-page data". The one-page data is used, for example, as a unit of data read. The cell unit CU may have a storage capacity of data of two or more pages, in accordance with the number of bits of data that the memory cell transistor MC stores.

Note that the above-described circuit configuration of the memory cell array 109 is merely an example, and is not limited to this. For example, the number of string units SU included in each block BLK may be designed to be a freely selected number. The number of memory cell transistors MC and the number of select transistors ST1 and ST2, which are included in each NAND string NS, may be designed to be a freely selected number.

In the present embodiment, a case is described in which one memory cell transistor MC stores 2-bit data. Specifically, the memory cell transistor MC in the present embodiment is a multi-level cell (MLC) that stores 2-bit data. The 2-bit data that the memory cell transistor of the MLC stores is expressed as a lower bit and an upper bit in the order from the lower bit. In addition, a set of lower bits that the memory cell transistors MC included in the same cell unit CU store is called "lower page", and a set of upper bits is called "upper page". Note that the memory cell transistor MC is not limited to the MLC. The memory cell transistor MC may be a single level cell (SLC) that stores 1-bit data, a triple level cell (TLC) that stores 3-bit data, a quad level cell (QLC) that stores 4-bit data, or a penta level cell (PLC) that stores 5-bit data.

1.1.6. Threshold Voltage Distributions of Memory Cell Transistors

Figure 6:
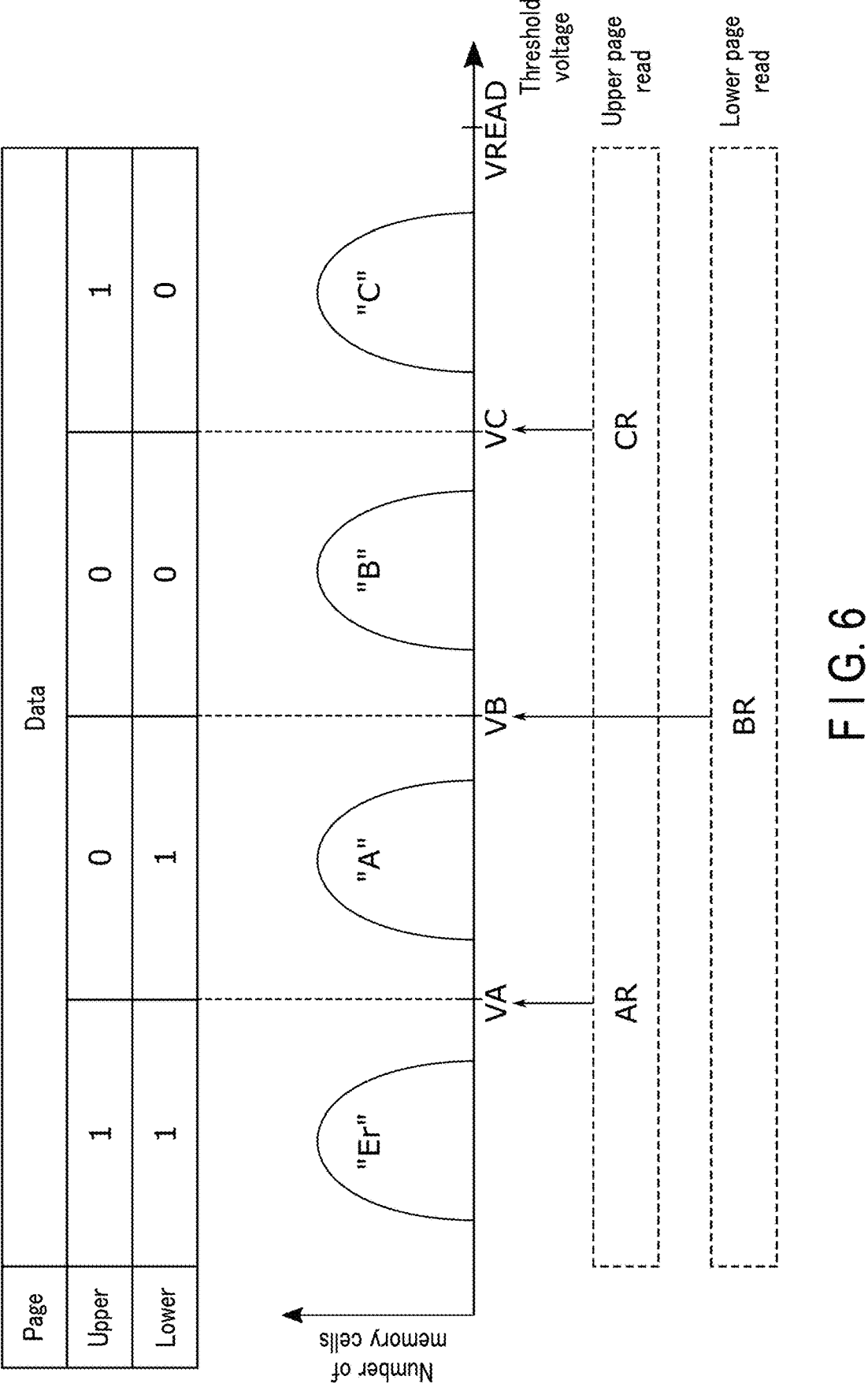
FIG. 6 is a schematic diagram illustrating an example of threshold voltage distributions of memory cell transistors in the memory cell array included in the memory system according to the first embodiment.

Next, referring to FIG. 6, an example of threshold voltage distributions of memory cell transistors MC is described. FIG. 6 is a schematic diagram illustrating an example of threshold voltage distributions of the memory cell transistors MC in the memory cell array 109.

As illustrated in FIG. 6, in a case where the memory cell transistor MC stores 2-bit data, the distribution of threshold voltages thereof can be divided into four threshold voltage distributions. The four threshold voltage distributions are expressed as an "Er" state, an "A" state, a "B" state and a "C" state in the order from the lowest threshold voltage.

In addition, voltages VA, VB and VC illustrated in FIG. 6 are used to distinguish two mutually neighboring states in a read process. A voltage VREAD is a voltage that is applied to unselected word lines in the read process. The memory cell transistor MC sets to an ON state, regardless of the data stored therein, when the voltage VREAD is applied to the gate. The relationship between these voltage values is VA<VB<VC<VREAD.

Of the above-described threshold voltage distributions, the "Er" state corresponds to an erase state of the memory cell transistor MC. The threshold voltage in the "Er" state is less than the voltage VA. The threshold voltage in the "A" state is the voltage VA or more, and is less than the voltage VB. The threshold voltage in the "B" state is the voltage VB or more, and is less than the voltage VC. The threshold voltage in the "C" state is the voltage VC or more, and is less than the VREAD.

The above-described four threshold voltage distributions are formed by writing 2-bit (2-page) data including the lower bit and the upper bit. In addition, the four threshold voltage distributions correspond to different 2-bit data. In the present embodiment, in the memory cell transistors MC included in each state, data is allocated to the "upper bit/lower bit" as described below.

The memory cell transistor MC included in the "Er" state stores "11" data. The memory cell transistor MC included in the "A" state stores "01" data. The memory cell transistor MC included in the "B" state stores "00" data. The memory cell transistor MC included in the "C" state stores "10" data.

In read operation of the lower page, the voltage VB is used as a read voltage to distinguish the "A" state and the "B" state. The read process using the voltage VB is expressed as "read process BR".

In read operation of the upper page, the voltage VA is used as a read voltage to distinguish the "Er" state and the "A" state, and the voltage VC is used as a read voltage to distinguish the "B" state and the "C" state. The read process using the voltage VA is called "read process AR", and the read process using the voltage VC is expressed as "read process CR".

1.1.7. Cross-Sectional Configuration of the Memory Cell Array

Figure 8:
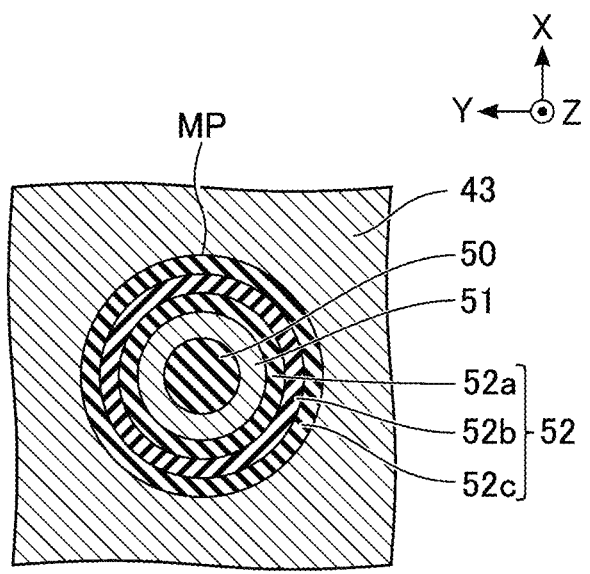
FIG. 8 is a cross-sectional view of a memory pillar along line VI-VI in FIG. 7.

Next, referring to FIG. 7 and FIG. 8, an example of a cross-sectional configuration of the memory cell array 109 is described. FIG. 7 is a cross-sectional view of the NAND string NS that is a partial area of the block BLK. FIG. 8 is a cross-sectional view of a memory pillar MP along line VI-VI in FIG. 7. In the cross-sectional views to be referred to below, an X axis corresponds to an extending direction of word lines WL, a Y axis corresponds to an extending direction of bit lines BL, and a Z axis corresponds to an extending direction of the memory pillar MP with respect to a semiconductor substrate 40. In addition, for the purpose of easier viewing of the drawings, the depiction of structural elements, such as insulator layers (interlayer insulating films), is omitted as appropriate.

As illustrated in FIG. 7, the memory pillar MP formed above the semiconductor substrate 40 corresponds to one NAND string NS.

A conductor layer 41 is provided above the semiconductor substrate 40 via an insulator layer (not illustrated). In this insulator layer, for example, peripheral circuits, such as the sense amplifier 111, can be provided. The conductor layer 41 is formed in a plate shape extending in, for example, an XY plane, and is used as the source line SL.

A conductor layer 42 is provided above the conductor layer 41 via an insulator layer (not illustrated). The conductor layer 42 is used as the select gate line SGS.

Insulator layers (not illustrated) and conductor layers 43 are alternately stacked multiple times (eight times in FIG. 7)

above the conductor layer 42. The conductor layers 43 are used as the word lines WL0 to WL7 in order from the semiconductor substrate 40 side.

Insulator layers (not illustrated) and conductor layers 44 are alternately stacked multiple times (eight times in FIG. 7) above the uppermost conductor layer 43. The conductor layers 44 are used as the word lines WL8 to WL15 in order from the semiconductor substrate 40 side. A distance between the uppermost conductor layer 43 and the lowermost conductor layer 44 is greater than, for example, a distance between mutually neighboring conductor layers 43 or a distance between mutually neighboring conductor layers 44.

A conductor layer 45 is provided above the uppermost conductor layer 44 via an insulator layer (not illustrated). The conductor layer 45 is used as the select gate line SGD. The conductor layers 42 to 45 are formed, for example, in plate shapes extending along the XY plane.

A conductor layer 47 is provided above the conductor layer 45 via an insulator layer (not illustrated). The conductor layer 47 extends along the Y axis, and a plurality of conductor layers 47 are arranged along the X axis in line shapes and are used as the bit lines BL.

The memory pillar MP is provided to extend along the Z axis, and penetrates the conductor layers 42 to 45, and a bottom portion of the memory pillar MP is in contact with the conductor layer 41. The memory pillar MP includes a lower pillar LMP, an upper pillar UMP formed on an upper portion of the lower pillar LMP, and a joint portion JT that electrically couples the lower pillar LMP and the upper pillar UMP. Each of the lower pillar LMP and the upper pillar UMP has, for example, a taper shape with a diameter increasing toward the bit line BL (along the Z axis) from the semiconductor substrate 40. A diameter of the joint portion JT along the XY plane is greater than, for example, a diameter of each of the lower pillar LMP and the upper pillar UMP at a contact portion with the joint portion JT.

The memory pillar MP includes, for example, a core film 50, a semiconductor film 51, a stacked film 52, and a semiconductor portion 53. Each of the core film 50, the semiconductor film 51, and the stacked film 52 is formed as a continuous film, for example, in the lower pillar LMP, the joint portion JT, and the upper pillar UMP.

Specifically, the core film 50 is provided at a substantially central portion of the memory pillar MP, and extends along the Z axis. The core film 50 includes, for example, an upper end that is positioned above the conductor layer 45, and a lower end that is positioned below the conductor layer 42. The core film 50 includes, for example, an insulator such as silicon oxide (SiO).

The semiconductor film 51 includes a cylindrical portion formed along the Z axis, which covers a bottom surface and a side surface of the core film 50. The semiconductor film 51 includes an upper end positioned above the conductor layer 45, and a lower end that is in contact with the conductor layer 41. The semiconductor film 51 includes, for example, polysilicon.

The stacked film 52 includes a cylindrical portion formed along the Z axis, which covers a side surface of the semiconductor film 51. The details of the configuration of the stacked film 52 is described.

As illustrated in FIG. 8, the stacked film 52 includes a tunnel insulating film 52a, a charge storage film 52b, and a block insulating film 52c. The tunnel insulating film 52a covers a side surface of the semiconductor film 51, and the charge storage film 52b covers a side surface of the tunnel insulating film 52*a*. The block insulating film 52*c* covers a side surface of the charge storage film 52*b*, and is covered with the conductor layer 43.

Referring back to FIG. 7, the configuration of the memory pillar MP is described. The semiconductor portion 53 covers an upper surface of the core film 50, and is in contact with a portion of the semiconductor film 51 above the core film 50. The semiconductor portion 53 has, for example, a columnar shape, and is positioned at an upper end of the upper pillar UMP.

A conductor layer 46 is provided between an upper surface of the semiconductor portion 53 and a lower surface of the conductor layer 47. The conductor layer 46 is used as a contact plug CP that electrically couples the memory pillar MP and the bit line BL.

In the above-described configuration of the memory pillar MP, a portion where the lower pillar LMP and the conductor layer 42 intersect functions as the select transistor ST2. Portions where the lower pillar LMP and the conductor layers 43 intersect function as the memory cell transistors MC0 to MC7, respectively. Portions where the upper pillar UMP and the conductor layers 44 intersect function as the memory cell transistors MC8 to MC15, respectively. A portion where the upper pillar UMP and the conductor layer 45 intersect functions as the select transistor ST1. The semiconductor film 51 functions as channels of the memory cell transistors MC and the select transistors ST1 and ST2.

By the above-described configuration, the memory pillar MP can function as the NAND string NS. In addition, the memory cell array 109 is formed by arranging a plurality of the memory pillars MP above the semiconductor substrate 40.

As described with reference to FIG. 7, since the memory cell transistors MC0 to MC15, which are coupled in series in the NAND string NS, are formed by being stacked along the Z axis, the memory cell transistors MC0 to MC15 can have mutually different shapes in accordance with the position (height) along the Z axis. Thus, the memory cell transistors MC0 to MC15 can have mutually different electrical characteristics. In addition, since both end portions of the upper pillar UMP are electrically coupled to the bit line BL and the upper end of the joint portion JT, both end portions of the upper pillar UMP can have different electrical characteristics from the central portion of the upper pillar UMP. Since both end portions of the lower pillar LMP are electrically coupled to the source line SL and the lower end of the joint portion JT, both end portions of the lower pillar LMP can have different electrical characteristics from the central portion of the lower pillar LMP.

1.1.8. Configuration of Cell Unit Groups

Next, referring to FIG. 9, an example of a configuration of cell unit groups CU_Gr in the block BLK is described. FIG. 9 is a schematic diagram illustrating an example of the configuration of cell unit groups CU_Gr in one block BLK. One rectangular frame of a solid line illustrated in FIG. 9 corresponds to one cell unit CU. In FIG. 9, 64 cell units CU in one block BLK are distinctly illustrated in association with each of sets of corresponding string units SU and word lines WL.

As illustrated in FIG. 9, by gathering cell units CU having similar electrical characteristics into one group, the cell units CU in the block BLK can be classified into some groups. For example, the control circuit 31 can classify the cell units CU in the block BLK into some groups, and can manage correction amounts of read voltages, and the like, for the respective groups.

The 64 cell units CU are classified into, for example, four cell unit groups CU_Gr (CU_Gr0 to CU_Gr3). Specifically, for example, 16 cell units CU, which are coupled to the word lines WL0 to WL3 located on the lower side of the lower pillar LMP, are classified into the cell unit group CU_Gr0. 16 cell units CU, which are coupled to the word lines WL4 to WL7 located on the upper side of the lower pillar LMP, are classified into the cell unit group CU_Gr1. 16 cell units CU, which are coupled to the word lines WL8 to WL11 located on the lower side of the upper pillar UMP, are classified into the cell unit group CU_Gr2. 16 cell units CU, which are coupled to the word lines WL12 to WL15 located on the upper side of the upper pillar UMP, are classified into the cell unit group CU_Gr3. Note that the grouping of the cell unit groups CU_Gr can freely be set. The numbers of cell units CU in the respective cell unit groups CU_Gr may be different.

A boundary 0 is set between the cell unit group CU_Gr0 and cell unit group CU_Gr1. More specifically, the boundary 0 is set between the cell unit CU corresponding to the set of the string unit SU3 and the word line WL3 and the cell unit CU corresponding to the set of the string unit SU0 and the word line WL4. A boundary 1 is set between the cell unit group CU_Gr1 and cell unit group CU_Gr2. More specifically, the boundary 1 is set between the cell unit CU corresponding to the set of the string unit SU3 and the word line WL7 and the cell unit CU corresponding to the set of the string unit SU0 and the word line WL8. A boundary 2 is set between the cell unit group CU_Gr2 and cell unit group CU_Gr3. More specifically, the boundary 2 is set between the cell unit CU corresponding to the set of the string unit SU3 and the word line WL11 and the cell unit CU corresponding to the set of the string unit SU0 and the word line WL12.

In addition, one representative cell unit CU (hereinafter, also referred to as "anchor AK") is allocated to each of the cell unit groups CU_Gr0 to CU_Gr3. Anchors AK0 to AK3 allocated to the cell unit groups CU_Gr0 to CU_Gr3 are, for example, cell units CU for which a patrol process is executed. A result of the patrol process for the anchor AK is stored in the Vth information of the block management information as a representative correction amount. Specifically, the anchor is a cell unit CU that is used for calculating the correction amount. Note that the anchor K is not set in a case where the patrol process is not executed, or in a case where the patrol process is executed for all cell units CU.

In the example of FIG. 9, a cell unit CU corresponding to the set of the string unit SU0 and the word line WL0 is allocated to the anchor AK0 of the cell unit group CU_Gr0. A cell unit CU corresponding to the set of the string unit SU0 and the word line WL4 is allocated to the anchor AK1 of the cell unit group CU_Gr1. A cell unit CU corresponding to the set of the string unit SU0 and the word line WL8 is allocated to the anchor AK2 of the cell unit group CU_Gr2. A cell unit CU corresponding to the set of the string unit SU0 and the word line WL12 is allocated to the anchor AK3 of the cell unit group CU_Gr3.

Note that the above-described allocation method of anchors AK is merely an example, and the allocation method is not limited to this. For example, the anchor AK of a certain cell unit group CU_Gr may be allocated to any one of the cell units CU in this cell unit group CU_Gr. In addition, in the example of FIG. 9, although the case is illustrated in which four cell unit groups CU_Gr are included in one block BLK, the embodiment is not limited to this. For example, the number of cell unit groups CU_Gr included in one block BLK may be one or more.

Besides, in the description below, it is assumed that the configuration of the cell unit groups CU_Gr described with reference to FIG. 9 is applied to all blocks BLK, but the embodiment is not limited to this. For example, the number of cell unit groups in one block BLK, the range of each cell unit group CU_Gr, and the position of the boundary line of each cell unit group CU_Gr may be different between blocks BLK.

1.1.9. Block Management Information

Next, referring to FIG. 10 and FIG. 11, an example of the block management information is described. FIG. 10 is a table illustrating an example of a structure of the Vth information. FIG. 11 is a table illustrating an example of the CU_Gr conversion information. Note that the example of FIG. 10 and FIG. 11 illustrates an example in regard to the block BLK0.

In the present embodiment, a case is described in which a table relating to the Vth information and a table relating to the CU_Gr conversion information are included in the block management information.

As illustrated in FIG. 10, information of correction amounts of read voltages in the respective cell unit groups CU_Gr is included in the Vth information. Specifically, for example, in a case where the memory cell transistor MC is the MLC, a correction amount $\Delta VA$ of the read voltage VA, a correction amount $\Delta VB$ of the read voltage VB, and a correction amount $\Delta VC$ of the read voltage VC are included in the Vth information.

In the example of FIG. 10, a set of $\Delta VA0$, $\Delta VB0$, and $\Delta VC0$ is included as the correction amounts of the cell unit group CU_Gr0 in the block BLK0. Similarly, a set of $\Delta VA1$, $\Delta VB1$, and $\Delta VC1$, a set of $\Delta VA2$, $\Delta VB2$, and $\Delta VC2$, and a set of $\Delta VA3$, $\Delta VB3$, and $\Delta VC3$ are included as the correction amounts allocated to the cell unit groups CU_Gr1 to CU_Gr3 in the block BLK0, respectively.

By the above-described configuration, the cell unit group CU_Gr and the correction amounts $\Delta VA$ to $\Delta VC$ are uniquely correlated.

Next, the CU_Gr conversion information is described. For example, there is a case where in one cell unit group CU_Gr, an elapsed time (time difference) from the execution of the previous write operation to the execution of the next write operation exceeds a preset reference value. In this case, the control circuit 31 moves (converts) the position of the boundary line of the cell unit group CU_Gr to between the cell units CU where the time difference exceeding the reference value has occurred. In other words, the configuration of the cell unit group CU_Gr is changed. The CU_Gr conversion information includes position information of the boundary line that was moved.

As illustrated in FIG. 11, the CU_Gr conversion information includes, for example, boundary information indicating a moved boundary line, and position information of the boundary line. The example of FIG. 11 illustrates a case where in one block BLK, the permissible number of times of movement of the boundary line (the number of times of occurrence of a time difference) is one. For example, in a case where the number of boundaries included in one block BLK is four or less, the boundary information is indicated by 2-bit data. In addition, for example, in a case where 16 cell units CU are included in the cell unit group CU_Gr, the position information is indicated by 5-bit data. Accordingly, in the case where the occurrence of the time difference is permitted up to once, an amount of increase of data by the addition of the CU_Gr conversion information is one byte per block BLK. Note that the amount of increase of data varies depending on the number of boundaries, the number of cell units CU included in the cell unit group CU_Gr, and the like.

The example of FIG. 11 illustrates a case where the time difference (movement of the boundary line) did not occur. In this case, "00" is set in the boundary information. For example, an amount of movement from the initial state is set in the position information of the boundary line. In a case where no movement occurs, the position information of the boundary line is set to "00000". For example, it is assumed that a negative movement amount is defined in a case where the boundary 0 indicating the boundary line between the cell unit group CU_Gr0 and the cell unit group CU_Gr1 has moved toward the cell unit group CU_Gr0, and a positive movement amount is defined in a case where the boundary 0 has moved toward the cell unit group CU_Gr1. For example, in a case where the movement amount is –16, the position information is set to "10000". For example, in a case where the movement amount is –1, the position information of the boundary line is set to "11111". For example, in a case where the movement amount is +15, the position information of the boundary line is set to "01111".

1.2. Flow of Write Operation

Next, referring to FIG. 12, an example of a flow of a write operation is described. FIG. 12 is a flowchart illustrating an example of the flow of the write operation.

As illustrated in FIG. 12, the memory system 3 first receives a write request from the host device 2 (S10).

The control circuit 31 confirms whether the destination of data write is a first page of the block BLK that is a write target (S11). More specifically, the control circuit 31 confirms whether a lower page of the cell unit CU corresponding to the set of the string unit SU0 and the word line WL0 is selected as the destination of write.

In a case where the destination of data write is not the first page of the block BLK (S11 No), the control circuit 31 stops the time difference timer 38 (S12). More specifically, the time difference timer 38 measures the elapsed time from the execution of the write operation to a certain cell unit CU to the execution of the write operation to a cell unit CU of the next write target in the block BLK that is the write target. In a case where the write operation to each cell unit CU is executed in multiple steps, the time difference timer 38 measures the elapsed time from the execution of the last step of the write operation to a certain cell unit CU to the execution of the last step of the write operation to a cell unit CU of the next write target in the block BLK of the write target. After the end of the measurement, the time difference timer 38 transmits the elapsed time in the block BLK to the control circuit 31 as "time difference".

The control circuit 31 confirms whether the time difference exceeds a reference value (S13). In a case where the time difference exceeds the reference value (S13_Yes), the control circuit 31 sets a time difference occurrence flag (S14). Specifically, the control circuit 31 sets the time difference occurrence flag at "H" level.

After setting the time difference occurrence flag (S14), if the destination of data right is the first page of the block BLK (S11 Yes), or if the time difference is less than the reference value (S13 No), the control circuit 31 causes the memory chip 11 of the write target to execute the write operation (S15).

After the end of the write operation, the control circuit 31 confirms whether the destination of data write is a last page of the block BLK that is the write target (S16).

In a case where the destination of data write is not the last page of the block BLK (S16 No), the control circuit 31 once resets the time difference timer 38 and then starts the time difference timer 38 (S17). More specifically, the time difference timer 38 starts measurement of the elapsed time from the end of the write operation to the cell unit CU of the block BLK. In a case where the write operation to each cell unit CU is executed in multiple steps, the time difference timer 38 measures the elapsed time from the end of the last step of the write operation to the cell unit CU of the block BLK.

After starting the time difference timer (S17), or if the destination of data write is the last page of the block BLK (S16_Yes), the control circuit 31 ends the write operation.

1.3. Flow of Registration of CU_Gr Conversion Information

Next, referring to FIG. 13, an example of a flow of registration of the CU_Gr conversion information is described. FIG. 13 is a flowchart illustrating an example of the flow of registration of the CU_Gr conversion information.

As illustrated in FIG. 13, the control circuit 31 first confirms the presence or absence of the time difference occurrence flag (S100).

In a case where the time difference occurrence flag is absent (S101 No), the control circuit 31 ends the registration of the CU_Gr conversion information.

In a case where the time difference occurrence flag is present (is set) (S101_Yes), the control circuit 31 confirms whether the number of times of occurrence of the time difference occurrence flag (time difference) in one block BLK is equal to or less than a set value N that is preset (N is an integer that is equal to or greater than 0 and is equal to or less than (the total number of cell unit groups in block BLK−1)) (S102). For example, in a case where one occurrence of the time difference (a movement of the boundary line) is permitted per block BLK, the set value is set at N=1. Since the number of boundaries is the total number of cell unit groups−1, the maximum value of the set value N is the total number of cell unit groups−1. In other words, the maximum value of the set value N is a value obtained by subtracting 1 from the total number of cell unit groups CU_Gr. In this case, the movement of all boundary lines is permitted.

In a case where the number of times of occurrence is equal to or less than the set value N (S102_Yes), the control circuit 31 acquires information of the boundary line that is changed (S103), and confirms whether the acquisition is successful (S104). For example, there are two methods in regard to the method of changing the boundary line.

In a first method, an address range, to which each boundary line corresponds at a time of occurrence of a time difference, is predetermined. In the case of the configuration of the cell unit groups CU_Gr described with reference to FIG. 9, if the time difference occurs in a range from the cell unit CU corresponding to the set of the string unit SU0 and the word line WL0 to the cell unit CU corresponding to the set of the string unit SU3 and the word line WL4, the control circuit 31 moves the boundary 0. If the time difference occurs in a range from the cell unit CU corresponding to the set of the string unit SU0 and the word line WL5 to the cell unit CU corresponding to the set of the string unit SU3 and the word line WL9, the control circuit 31 moves the boundary 1. If the time difference occurs in a range from the cell unit CU corresponding to the set of the string unit SU0 and the word line WL10 to the cell unit CU corresponding to the set of the string unit SU3 and the word line WL15, the control circuit 31 moves the boundary 2. For example, a changed boundary line is set to be a boundary k, by using a variable k (k is an integer that is equal to or greater than 0 and is equal to or less than (the total number of cell unit groups in block BLK−1)). For example, the next boundary line (k+1) is adaptive to the address range after the movement of the boundary k. In a case where there is no boundary line that can adapt to the occurrence of the time difference, the control circuit 31 determines the failure of acquisition.

In a second method, in a case where a time difference occurs, the location of the occurrence of the time difference is set to be a boundary line between the cell unit group CU_Gr, to which the address of the previous write destination belongs, and the next cell unit group CU_Gr. In a case where a time difference occurs in the last cell unit group CU_Gr (in the example of FIG. 9, the cell unit group CU_Gr3), the control circuit 31 determines the failure of acquisition.

In a case where the acquisition is successful (S104_Yes), the control circuit 31 updates the position of the boundary line (S105). For example, the control circuit 31 moves the boundary line to a position between the previous write destination address (the cell unit CU corresponding to the previous write destination address) and the next write destination address (the cell unit CU corresponding to the next write destination address).

The control circuit 31 registers the information of the moved boundary line in the CU_Gr conversion information (S106).

In a case where the number of times of occurrence exceeds the set value N (S102_No), or in a case of the failure of acquisition (S104_No), the control circuit 31 sets a block moving flag (S107). Specifically, the control circuit 31 sets the block moving flag at "H" level. The block moving flag is a flag indicating that, after the write operation to all cell units CU of a block BLK has ended, this block BLK is preferentially selected as a target of data movement. For example, if the write operation to all cell units CU of a block BLK has ended, the control circuit 31 confirms the block moving flag. If the block moving flag is set, the control circuit 31 selects this block BLK as the target of data movement. Then, the control circuit 31 reads out the valid data of the block BLK, and, after the execution of an error correction process by the ECC circuit 34, writes the read data into another block BLK.

1.4. Concrete Examples of Boundary Line Movement

Next, two concrete examples in a case where the boundary line was moved are illustrated.

1.4.1. First Concrete Example

A first concrete example is described. In the first concrete example, a case is described in which N=1, that is, the number of times of movement of the boundary line (namely, the number of times of occurrence of the time difference) in one block BLK is permitted up to once. FIG. 14 is a schematic diagram illustrating the first concrete example of the boundary line movement in one block BLK. FIG. 15 is a table illustrating an example of CU_Gr conversion information in the first concrete example.

As illustrated in FIG. 14, in the present example, a time difference occurs between the cell unit CU corresponding to the set of the string unit SU2 and the word line WL6 and the cell unit CU corresponding to the set of the string unit SU3 and the word line WL6. In other words, the elapsed time from the execution of the write operation to the cell unit CU corresponding to the set of the string unit SU2 and the word line WL6 to the execution of the write operation to the cell unit CU corresponding to the set of the string unit SU3 and the word line WL6 exceeds a preset reference value. Thus, the control circuit 31 moves the boundary 1 to between these two cell units CU. The movement amount of the boundary 1 in this case is −5.

As a result, the cell unit CU corresponding to the set of string unit SU0 and the word line WL0 through the cell unit CU corresponding to the set of the string unit SU3 and the word line WL3 belong to the cell unit group CU_Gr0. The cell unit CU corresponding to the set of the string unit SU0 and the word line WL4 through the cell unit CU corresponding to the set of the string unit SU2 and the word line WL6 belong to the cell unit group CU_Gr1. In addition, the cell unit CU corresponding to the set of the string unit SU3 and the word line WL6 through the cell unit CU corresponding to the set of the string unit SU3 and the word line WL11 belong to the cell unit group CU_Gr2. Besides, the cell unit CU corresponding to the set of the string unit SU0 and the word line WL12 through the cell unit CU corresponding to the set of the string unit SU3 and the word line WL15 belong to the cell unit group CU_Gr3.

As illustrated in FIG. 15, boundary information "01" and position information "11011" is registered as the CU_Gr conversion information. The boundary information "01" indicates the boundary 1. The position information "11011" indicates that the movement amount is −5.

1.4.2. Second Concrete Example

Next, a second concrete example is described. In the second concrete example, a case is described in which N=(the total number of cell unit groups−1), that is, the number of times of movement of the boundary line (namely, the number of times of occurrence of the time difference) in one block BLK is permitted up to the total number of boundary lines. In other words, a case is described in which the control circuit 31 moves all boundary lines. FIG. 16 is a schematic diagram illustrating the second concrete example of the boundary line movement in one block BLK. FIG. 17 is a table illustrating an example of Vth information and CU_Gr conversion information in the second concrete example.

As illustrated in FIG. 16, in the present example, the control circuit 31 moves the boundary 0 through the boundary 2. More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU2 and the word line WL6 and the cell unit CU corresponding to the set of the string unit SU3 and the word line WL6. Thus, the control circuit 31 moves the boundary 1 to between these two cell units CU. The movement amount of the boundary 1 is −5.

In addition, a time difference occurs between the cell unit CU corresponding to the set of the string unit SU0 and the word line WL9 and the cell unit CU corresponding to the set of the string unit SU1 and the word line WL9. Thus, the control circuit 31 moves the boundary 2 to between these two cell units CU. The movement amount of the boundary 2 is −11.

As a result, the cell unit CU corresponding to the set of the string unit SU0 and the word line WL0 through the cell unit CU corresponding to the set of the string unit SU1 and the word line WL2 belong to the cell unit group CU_Gr0. The cell unit CU corresponding to the set of the string unit SU2 and the word line WL2 through the cell unit CU corresponding to the set of the string unit SU2 and the word line WL6 belong to the cell unit group CU_Gr1. The cell unit CU corresponding to the set of the string unit SU3 and the word line WL6 through the cell unit CU corresponding to the set of the string unit SU0 and the word line WL9 belong to the cell unit group CU_Gr2. In addition, the cell unit CU corresponding to the set of the string unit SU1 and the word line WL9 through the cell unit CU corresponding to the set of the string unit SU3 and the word line WL15 belong to the cell unit group CU_Gr3.

As illustrated in FIG. 17, for example, in the block management information, the Vth information and the CU_Gr conversion information may be managed by one table. In this case, in the CU_Gr conversion information, the position information of the boundary line corresponding to the cell unit group CU_Gr is included. For example, the position information of the boundary line is indicated by 7-bit data (−64≤movement amount≤+63). For example, in a case where the occurrence of the time difference is permitted up to three times, the increase of the data amount by the addition of the CU_Gr conversion information is 3 bytes per block BLK.

For example, in the position information of the boundary line, a movement amount from the initial state is set. If no movement occurs, the position information of the boundary line is set to "0000000". For example, in a case where the movement amount of the boundary line is −64, the position information of the boundary line is set to "1000000". For example, in a case where the movement amount of the boundary line is −1, the position information of the boundary line is set to "1111111". For example, in a case where the movement amount of the boundary line is +63, the position information of the boundary line is set to "0111111". In the example of FIG. 17, "1111010" is registered as the CU_Gr conversion information of the boundary 0. "1111010" indicates that the movement amount is −6. "1111011" is registered as the CU_Gr conversion information of the boundary 1. "1111011" indicates that the movement amount is −5. "1110101" is registered as the CU_Gr conversion information of the boundary 2. "1110101" indicates that the movement amount is −11.

1.5. Advantageous Effects According to the Present Embodiment

With the configuration according to the present embodiment, the memory system can improve the processing capability. The advantageous effects are described in detail.

For example, in the case of the ZNS-adaptive memory system, in the write operation, even if a time difference occurs in the block BLK, the insertion process of padding data is not executed. In the block BLK, the write operation of valid data is continued as such. Since the optimal value of the read voltage is different before and after the occurrence of the time difference, the number of error bits increases in the cell unit group CU_Gr in which the time difference occurred. Thus, the reliability of data deteriorates. In addition, for the purpose of error correction, the process for reducing error bits, such as refresh read or retry read, is executed more frequently. The retry read is an operation of executing a read operation once again by shifting the read voltage. The refresh read is a process of rewriting data into another memory area. Thus, the processing capability of the memory system lowers.

In addition, in the case of the ZNS—nonadaptive memory system, if the time difference occurs, the insertion process of padding data is executed for a cell unit CU in which data is not written in the block BLK. Thus, invalid data increases, and the WAF increases. In addition, due to the insertion process of padding data, the processing capability of the memory system lowers.

On the other hand, with the configuration according to the present embodiment, if the time difference occurs, the configuration of the cell unit groups CU_Gr in the block BLK can dynamically be changed. The boundary line of the cell unit groups CU_Gr can be moved to a location at which the time difference occurred. Even if the optimal value of the read voltage is different before and after the occurrence of the time difference, the optimal value of the read voltage can be set for each cell unit group CU_Gr, and thus the increase of error bits can be suppressed. Therefore, the decrease in reliability of data can be suppressed. Accordingly, the reliability of the memory system 3 can be improved. Moreover, since the frequency of execution of the process for reducing error bits can be decreased, the processing capability of the memory system 3 can be improved.

1.6. Modification of the First Embodiment

Next, a modification of the first embodiment is described. In the present modification, a case in which an anchor AK is not set is described. Hereinafter, different points from the first embodiment are mainly described.

1.6.1. Configuration of Cell Unit Groups

First, referring to FIG. 18, the configuration of the cell unit groups CU_Gr in the block BLK is described. FIG. 18 is a schematic diagram illustrating the configuration of cell unit groups CU_Gr in one block BLK.

As illustrated in FIG. 18, the initial configuration of the cell unit groups CU_Gr is the same as described with reference to FIG. 9 of the first embodiment, except that the anchor AK is not set.

1.6.2. Concrete Examples of Boundary Line Movement

Next, two concrete examples in a case where the boundary line was moved are illustrated.

1.6.2.1. First Concrete Example

A first concrete example is described. In the first concrete example, a case is described in which N=1, that is, the number of times of movement of the boundary line (namely, the number of times of occurrence of the time difference) in one block BLK is permitted up to once. FIG. 19 is a schematic diagram illustrating the first concrete example of the boundary line movement in one block BLK.

As illustrated in FIG. 19, in the present example, as in the first concrete example of the first embodiment, a time difference occurs between the cell unit CU corresponding to the set of the string unit SU2 and the word line WL6 and the cell unit CU corresponding to the set of the string unit SU3 and the word line WL6. Thus, the control circuit 31 moves the boundary 1 to between these two cell units CU. The movement amount of the boundary 1 in this case is −5.

The configuration of each cell unit group CU_Gr is the same as described with reference to FIG. 14.

1.6.2.2. Second Concrete Example

Next, a second concrete example is described. In the second concrete example, a case is described in which N=(the total number of cell unit groups−1), that is, the number of times of movement of the boundary line (namely, the number of times of occurrence of the time difference) in one block BLK is permitted up to the total number of boundary lines. In other words, a case is described in which the control circuit 31 moves all boundary lines. FIG. 20 is a schematic diagram illustrating the second concrete example of the boundary line movement in one block BLK.

As illustrated in FIG. 20, in the present example, as in the second concrete example of the first embodiment, the control circuit 31 moves the boundary 0 through the boundary 2. More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU2 and the word line WL6 and the cell unit CU corresponding to the set of the string unit SU3 and the word line WL6. Thus, the control circuit 31 moves the boundary 1 to between these two cell units CU. The movement amount of the boundary 1 is −5.

In addition, a time difference occurs between the cell unit CU corresponding to the set of the string unit SU0 and the word line WL9 and the cell unit CU corresponding to the set of the string unit SU1 and the word line WL9. Thus, the control circuit 31 moves the boundary 2 to between these two cell units CU. The movement amount of the boundary 2 is −11.

The configuration of each cell unit group CU_Gr is the same as described with reference to FIG. 16.

1.6.3. Advantageous Effects According to the Present Modification

With the configuration according to the present modification, the same advantageous effects as in the first embodiment can be obtained.

2. Second Embodiment

Next, a second embodiment is described. In the second embodiment, a case is described in which the boundary line and the anchor AK are moved. Hereinafter, different points from the first embodiment are mainly described.

2.1. CU_Gr Conversion Information and Anchor Conversion Information

First, referring to FIG. 21, an example of the CU_Gr conversion information and anchor conversion information is described. FIG. 21 is a table illustrating an example of the CU_Gr conversion information and the anchor conversion information. The CU_Gr conversion information and the anchor conversion information is included in the block management information.

As illustrated in FIG. 21, similarly as described with reference to FIG. 11 of the first embodiment, the CU_Gr conversion information includes boundary information indicating a moved boundary line, and position information of the boundary line.

The anchor conversion information is change information of the cell unit CU that is set as the anchor AK. The anchor conversion information includes anchor information indicating the moved anchor AK, and position information of this anchor AK. For example, in a case where the number of anchors included in one block BLK is four or less, the anchor information is indicated by 2-bit data. In addition, for example, the position information of the anchor AK, as in the position information of the boundary line, is indicated by 5-bit data. For example, in the case where the occurrence of the time difference is permitted up to once, an amount of increase of data by the addition of the anchor conversion information is one byte per block BLK. In this case, an amount of increase of data by the CU_Gr conversion information and the anchor conversion information is two bytes per block BLK.

The example of FIG. 21 illustrates a case where the time difference (movement of the boundary line) did not occur. "00" is set in the boundary information. The position information of the boundary line is set to "00000". "00" is set in the anchor information. The anchor position information is set to "00000". For example, in a case where the movement amount of the anchor AK is −16, the anchor position information is set to "10000". For example, in a case where the movement amount of the anchor AK is −1, the anchor position information is set to "11111". For example, in a case where the movement amount of the anchor AK is +15, the anchor position information is set to "01111".

2.2. Flow of Registration of CU_Gr Conversion Information and Anchor Conversion Information Next, referring to FIG. 22, an example of a flow of registration of the CU_Gr conversion information and the anchor conversion information is described. FIG. 22 is a flowchart illustrating an example of the flow of registration of the CU_Gr conversion information and the anchor conversion information.

As illustrated in FIG. 22, the flow of steps S100 to S107 is the same as described with reference to FIG. 13 of the first embodiment.

After registering the CU_Gr conversion information (S106), the control circuit 31 confirms whether an anchor AK is included in the cell unit group CU_Gr after the change (S108).

If no anchor AK is included (S108_No), the control circuit 31 acquires information of the anchor AK that is changed (S109). For example, the control circuit 31 selects, as a target, the anchor AK included in the cell unit group CU_Gr to which the previous write destination address (cell unit CU) belongs. More specifically, for example, in a case of a state in which two anchors AK are included in the cell unit group CU_Gr to which the previous write destination address (cell unit CU) belongs, the anchor AK located near the moved boundary line is selected as the target of movement. On the other hand, in a case where the anchor AK is included (S108 Yes), the control circuit 31 ends the registration.

The control circuit 31 updates the position information of the anchor AK selected as the target of change (S110). The control circuit 31 sets, as an anchor AK, one of the cell units CU included in the cell unit group CU_Gr to which the next write destination address (cell unit CU) belongs.

The control circuit 31 registers the information of the moved anchor AK in the anchor conversion information (S111).

2.3. Concrete Examples of Movement of Boundary Line and Anchor

Next, four concrete examples in a case where the boundary line and anchor AK were moved are illustrated.

2.3.1. First Concrete Example

A first concrete example is described. In the first concrete example, a case is described in which N=1, that is, the number of times of movement of the boundary line (namely, the number of times of occurrence of the time difference) in one block BLK is permitted up to once. FIG. 23 is a schematic diagram illustrating the first concrete example of the movement of the boundary line and the anchor AK in one block BLK. FIG. 24 is a table illustrating an example of CU_Gr conversion information and the anchor conversion information in the first concrete example.

As illustrated in FIG. 23, in the present example, a time difference occurs between the cell unit CU corresponding to the set of the string unit SU1 and the word line WL9 and the cell unit CU corresponding to the set of the string unit SU2 and the word line WL9. Thus, the control circuit 31 moves the boundary 1 to between these two cell units CU. The movement amount of the boundary 1 in this case is +6.

By the movement of the boundary 1, the anchor AK2 is included in the cell unit group CU_Gr1. Thus the anchor AK2 is selected as a target of movement. For example, the cell unit CU corresponding to the set of the string unit SU3 and the word line WL10 of the cell unit group CU_Gr2 is allocated as a new anchor AK2. Specifically, the control circuit 31 moves the anchor AK2 from the cell unit CU corresponding to the set of the string unit SU0 and the word line WL8 to the cell unit CU corresponding to the set of the string unit SU3 and the word line WL10. The movement amount of the anchor AK2 in this case is +11. Note that the cell unit CU that is selected as the anchor AK2 may be any one of the cell units CU in the cell unit group CU_Gr2.

As a result, the cell unit CU corresponding to the set of the string unit SU0 and the word line WL0 through the cell unit CU corresponding to the set of the string unit SU3 and the word line WL3 belong to the cell unit group CU_Gr0. The cell unit CU corresponding to the set of the string unit SU0 and the word line WL4 through the cell unit CU corresponding to the set of the string unit SU1 and the word line WL9 belong to the cell unit group CU_Gr1. In addition, the cell unit CU corresponding to the set of the string unit SU2 and the word line WL9 through the cell unit CU corresponding to the set of the string unit SU3 and the word line WL11 belong to the cell unit group CU_Gr2. Besides, the cell unit CU corresponding to the set of the string unit SU0 and the word line WL12 through the cell unit CU corresponding to the set of the string unit SU3 and the word line WL15 belong to the cell unit group CU_Gr3.

For example, the cell unit CU corresponding to the set of the string unit SU0 and the word line WL0 is allocated to the anchor AK0. For example, the cell unit CU corresponding to the set of the string unit SU0 and the word line WL4 is allocated to the anchor AK1. For example, the cell unit CU corresponding to the set of the string unit SU3 and the word line WL10 is allocated to the anchor AK2. For example, the cell unit CU corresponding to the set of the string unit SU0 and the word line WL12 is allocated to the anchor AK3.

As illustrated in FIG. 24, boundary information "01" and position information "00110" is registered as the CU_Gr conversion information. The boundary information "01" indicates the boundary 1. The position information "00110" of the boundary line indicates that the movement amount is +6. Anchor information "10" and anchor position information "01011" is registered as the anchor conversion information. The anchor information "10" indicates the anchor AK2. The anchor position information "01011" means that the movement amount is +11.

2.3.2. Second Concrete Example

Next, a second concrete example is described. In the second concrete example, a case is described in which N=(the total number of cell unit groups−1), that is, the number of times of movement of the boundary line (namely, the number of times of occurrence of the time difference) in one block BLK is permitted up to the total number of boundary lines. FIG. 25 is a schematic diagram illustrating the second concrete example of the movement of the boundary line and the anchor AK in one block BLK. FIG. 26 is a table illustrating an example of Vth information, CU_Gr conversion information and anchor conversion information in the second concrete example.

As illustrated in FIG. 25, in the present example, the control circuit 31 moves the boundary 0 through the boundary 2. In accordance with this, the control circuit 31 moves the anchor AK3.

More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU2 and the word line WL6 and the cell unit CU corresponding to the set of the string unit SU3 and the word line WL6. Thus, the control circuit 31 moves the boundary 1 to between these two cell units CU. The movement amount of the boundary 1 is −5.

A time difference occurs between the cell unit CU corresponding to the set of the string unit SU1 and the word line WL12 and the cell unit CU corresponding to the set of the string unit SU2 and the word line WL12. Thus, the control circuit 31 moves the boundary 2 to between these two cell units CU. The movement amount of the boundary 2 is +2.

The control circuit 31 moves the anchor AK3 from the cell unit CU corresponding to the set of the string unit SU0 and the word line WL12 to the cell unit CU corresponding to the set of the string unit SU0 and the word line WL14. The movement amount of the anchor AK3 is +8.

As a result, the cell unit CU corresponding to the set of the string unit SU0 and the word line WL0 through the cell unit CU corresponding to the set of the string unit SU1 and the word line WL2 belong to the cell unit group CU_Gr0. The cell unit CU corresponding to the set of the string unit SU2 and the word line WL2 through the cell unit CU corresponding to the set of the string unit SU2 and the word line WL6 belong to the cell unit group CU_Gr1. The cell unit CU corresponding to the set of the string unit SU3 and the word line WL6 through the cell unit CU corresponding to the set of the string unit SU1 and the word line WL12 belong to the cell unit group CU_Gr2. In addition, the cell unit CU corresponding to the set of the string unit SU2 and the word line WL12 through the cell unit CU corresponding to the set of the string unit SU3 and the word line WL15 belong to the cell unit group CU_Gr3.

For example, the cell unit CU corresponding to the set of the string unit SU0 and the word line WL0 is allocated to the anchor AK0. For example, the cell unit CU corresponding to the set of the string unit SU0 and the word line WL4 is allocated to the anchor AK1. For example, the cell unit CU corresponding to the set of the string unit SU0 and the word line WL8 is allocated to the anchor AK2. For example, the cell unit CU corresponding to the set of the string unit SU0 and the word line WL14 is allocated to the anchor AK3.

As illustrated in FIG. 26, for example, in the block management information, the Vth information, CU_Gr conversion information and the anchor conversion information may be managed by one table. In this case, in the anchor conversion information, the position information of the anchor AK included in the cell unit group CU_Gr is included. In the CU_Gr conversion information, the position information of the boundary line corresponding to the cell unit group CU_Gr is included. For example, the anchor position information and the position information of the boundary line is indicated by 7-bit data (−64≤movement amount≤+63). Thus, for example, in a case where the occurrence of the time difference is permitted up to three times, the amount of increase of data by the addition of the CU_Gr conversion information is 6 bytes per block BLK at maximum. Note that data can be omitted in regard to the anchor AK and the boundary line that are not moved. Thus, in the example of FIG. 26, the data addition of four bytes is illustrated.

For example, an amount of movement from the initial state is set in the position information of the anchor AK and the boundary line. In a case where no movement occurs, the position information is set to "0000000". For example, in case where the movement amount is −64, the position information is set to "1000000". For example, in case where the movement amount is −1, the position information is set to "1111111". For example, in case where the movement amount is +63, the position information of the boundary line is set to "0111111".

In the example of FIG. 26, in the anchor conversion information, "0001000" is registered as the conversion information of the anchor AK3 included in the cell unit group CU_Gr3. "0001000" indicates that the movement amount of the anchor AK3 is +8.

In the CU_Gr conversion information, "1111010" is registered as the CU_Gr conversion information of the boundary 0. "1111010" indicates that the movement amount of the boundary 0 is −6. "1111011" is registered as the CU_Gr conversion information of the boundary 1. "1111011" indicates that the movement amount of the boundary 1 is −5. "0000010" is registered as the CU_Gr conversion information of the boundary 2. "0000010" indicates that the movement amount of the boundary 2 is +2.

2.3.3. Third Concrete Example

Next, a third concrete example is described. In the third concrete example, a case is described in which boundary lines concentrate between cell units CU corresponding to the word line WL0. In the third concrete example, as in the second concrete example of the second embodiment, the number of times of movement of the boundary line (namely, the number of times of occurrence of the time difference) in one block BLK is permitted up to the total number of boundary lines. FIG. 27 is a schematic diagram illustrating the third concrete example of the movement of the boundary line and the anchor AK in one block BLK. FIG. 28 is a table illustrating an example of the Vth information, the CU_Gr conversion information, and the anchor conversion information in the third concrete example.

As illustrated in FIG. 27, in the present example, the control circuit 31 moves the boundary 0 through the boundary 2. In accordance with this, the control circuit 31 moves the anchors AK1 and AK2.

More specifically, a time difference occurs between the cell unit CU corresponding to the set of the string unit SU0 and the word line WL0 and the cell unit CU corresponding to the set of the string unit SU1 and the word line WL0. Thus, the control circuit 31 moves the boundary 0 to between these two cell units CU. The movement amount of the boundary 0 is –15.

A time difference occurs between the cell unit CU corresponding to the set of the string unit SU1 and the word line WL0 and the cell unit CU corresponding to the set of the string unit SU2 and the word line WL0. Thus, the control circuit 31 moves the boundary 1 to between these two cell units CU. The movement amount of the boundary 1 is –30.

A time difference occurs between the cell unit CU corresponding to the set of the string unit SU2 and the word line WL0 and the cell unit CU corresponding to the set of the string unit SU3 and the word line WL0. Thus, the control circuit 31 moves the boundary 2 to between these two cell units CU. The movement amount of the boundary 2 is –45.

The control circuit 31 moves the anchor AK1 from the cell unit CU corresponding to the set of the string unit SU0 and the word line WL4 to the cell unit CU corresponding to the set of the string unit SU1 and the word line WL0. The movement amount of the anchor AK1 is –15. The control circuit 31 moves the anchor AK2 from the cell unit CU corresponding to the set of the string unit SU0 and the word line WL8 to the cell unit CU corresponding to the set of the string unit SU2 and the word line WL0. The movement amount of the anchor AK2 is –30.

As a result, the cell unit CU corresponding to the set of the string unit SU0 and the word line WL0 belongs to the cell unit group CU_Gr0. The cell unit CU corresponding to the set of the string unit SU1 and the word line WL0 belongs to the cell unit group CU_Gr1. The cell unit CU corresponding to the set of the string unit SU2 and the word line WL0 belongs to the cell unit group CU_Gr2. In addition, the cell unit CU corresponding to the set of the string unit SU3 and the word line WL0 through the cell unit CU corresponding to the set of the string unit SU3 and the word line WL15 belong to the cell unit group CU_Gr3.

For example, the cell unit CU corresponding to the set of the string unit SU0 and the word line WL0 is allocated to the anchor AK0. For example, the cell unit CU corresponding to the set of the string unit SU1 and the word line WL0 is allocated to the anchor AK1. For example, the cell unit CU corresponding to the set of the string unit SU2 and the word line WL0 is allocated to the anchor AK2. For example, the cell unit CU corresponding to the set of the string unit SU0 and the word line WL12 is allocated to the anchor AK3.

As illustrated in FIG. 28, in the anchor conversion information, "1110001" is registered as the conversion information of the anchor AK1 included in the cell unit group CU_Gr1. "1110001" indicates that the movement amount of the anchor AK1 is –15. "1110010" is registered as the conversion information of the anchor AK2 included in the cell unit group CU_Gr2. "1110010" indicates that the movement amount of the anchor AK2 is –30.

In the CU_Gr conversion information, "1110001" is registered as the CU_Gr conversion information of the boundary 0. "1110001" indicates that the movement amount of the boundary 0 is –15. "1110010" is registered as the CU_Gr conversion information of the boundary 1. "1110010" indicates that the movement amount of the boundary 1 is –30. "1010011" is registered as the CU_Gr conversion information of the boundary 2. "1010011" indicates that the movement amount of the boundary 2 is –45.

2.3.4. Fourth Concrete Example

Next, a fourth concrete example is described. In the fourth concrete example, a case is described in which boundary lines concentrate between cell units CU corresponding to the word line WL15. In the fourth concrete example, as in the second concrete example and third concrete example of the second embodiment, the number of times of movement of the boundary line (namely, the number of times of occurrence of the time difference) in one block BLK is permitted up to the total number of boundary lines. FIG. 29 is a schematic diagram illustrating the fourth concrete example of the movement of the boundary line and the anchor AK in one block BLK. FIG. 30 is a table illustrating an example of the Vth information, the CU_Gr conversion information, and the anchor conversion information in the fourth concrete example.

As illustrated in FIG. 29, in the present example, the control circuit 31 moves the boundary 0 through the boundary 2. In accordance with this, the control circuit 31 moves the anchors AK1 to AK3.

More specifically, a time difference occurs between the cell unit CU corresponding to the set of the string unit SU0 and the word line WL15 and the cell unit CU corresponding to the set of the string unit SU1 and the word line WL15. Thus, the control circuit 31 moves the boundary 0 to between these two cell units CU. The movement amount of the boundary 0 is +45.

A time difference occurs between the cell unit CU corresponding to the set of the string unit SU1 and the word line WL15 and the cell unit CU corresponding to the set of the string unit SU2 and the word line WL15. Thus, the control circuit 31 moves the boundary 1 to between these two cell units CU. The movement amount of the boundary 1 is +30.

A time difference occurs between the cell unit CU corresponding to the set of the string unit SU2 and the word line WL15 and the cell unit CU corresponding to the set of the string unit SU3 and the word line WL15. Thus, the control circuit 31 moves the boundary 2 to between these two cell units CU. The movement amount of the boundary 2 is +15.

The control circuit 31 moves the anchor AK1 from the cell unit CU corresponding to the set of the string unit SU0 and the word line WL4 to the cell unit CU corresponding to the set of the string unit SU1 and the word line WL15. The movement amount of the anchor AK1 is +45. The control circuit 31 moves the anchor AK2 from the cell unit CU corresponding to the set of the string unit SU0 and the word line WL8 to the cell unit CU corresponding to the set of the string unit SU2 and the word line WL15. The movement amount of the anchor AK2 is +30. The control circuit 31 moves the anchor AK3 from the cell unit CU corresponding to the set of the string unit SU0 and the word line WL12 to the cell unit CU corresponding to the set of the string unit SU3 and the word line WL15. The movement amount of the anchor AK3 is +15.

As a result, the cell unit CU corresponding to the set of the string unit SU0 and the word line WL0 through the cell unit CU corresponding to the set of the string unit SU0 and the word line WL15 belong to the cell unit group CU_Gr0. The cell unit CU corresponding to the set of the string unit SU1 and the word line WL15 belongs to the cell unit group CU_Gr1. The cell unit CU corresponding to the set of the string unit SU2 and the word line WL15 belongs to the cell unit group CU_Gr2. In addition, the cell unit CU corresponding to the set of the string unit SU3 and the word line WL15 belongs to the cell unit group CU_Gr3.

For example, the cell unit CU corresponding to the set of the string unit SU0 and the word line WL0 is allocated to the anchor AK0. For example, the cell unit CU corresponding to the set of the string unit SU1 and the word line WL15 is allocated to the anchor AK1. For example, the cell unit CU corresponding to the set of the string unit SU2 and the word line WL15 is allocated to the anchor AK2. For example, the cell unit CU corresponding to the set of the string unit SU3 and the word line WL15 is allocated to the anchor AK3.

As illustrated in FIG. 30, in the anchor conversion information, "0101101" is registered as the conversion information of the anchor AK1 included in the cell unit group CU_Gr1. "0101101" indicates that the movement amount of the anchor AK1 is +45. "0011110" is registered as the conversion information of the anchor AK2 included in the cell unit group CU_Gr2. "0011110" indicates that the movement amount of the anchor AK2 is +30. "0001111" is registered as the conversion information of the anchor AK3 included in the cell unit group CU_Gr3. "0001111" indicates that the movement amount of the anchor AK3 is +15.

In the CU_Gr conversion information, "0101101" is registered as the CU_Gr conversion information of the boundary 0. "0101101" indicates that the movement amount of the boundary 0 is +45. "0011110" is registered as the CU_Gr conversion information of the boundary 1. "0011110" indicates that the movement amount of the boundary 1 is +30. "0001111" is registered as the CU_Gr conversion information of the boundary 2. "0001111" indicates that the movement amount of the boundary 2 is +15.

2.4. Advantageous Effects According to the Present Embodiment

With the configuration according to the present embodiment, the same advantageous effects as in the first embodiment can be obtained.

Furthermore, with the configuration according to the present embodiment, since the anchors AK can be moved, the range in which the boundary lines are movable can be increased.

2.5. Modification of the Second Embodiment

Next, a modification of the second embodiment is described. In the present modification, a flow of registration of the anchor conversion information, which is different from the second embodiment, is described.

2.5.1. Flow of Registration of Anchor Conversion Information

Referring to FIG. 31, a flow of registration of the anchor conversion information is described. FIG. 31 is a flowchart illustrating the flow of registration of the anchor conversion information.

In the present modification, after the write operation to all cell units CU of the block BLK of the write target ended, the anchor conversion information of this block BLK is registered. In the description below, the anchor AK and the cell unit group CU_Gr are expressed as an anchor AKi and a cell unit group CU_Gri by using a variable i (i is an integer that is equal to or greater than 0 and is equal to or less than (the total number of cell unit groups−1)).

Note that as regards the flow of the CU_Gr conversion information, the flow of the CU_Gr conversion information described with reference to FIG. 13 of the first embodiment is applicable.

As illustrated in FIG. 31, the control circuit 31 confirms that the write operation to all cell units CU of the block BLK of the write target ended (S200).

At first, the control circuit 31 sets the variable i to i=0 (S201).

Referring to the block management information, the control circuit 31 acquires the position information of the anchor AKi (S202). Then, the control circuit 31 confirms whether the anchor AKi is included in the cell unit group CU_Gri (S203).

If the anchor AKi is not present in the cell unit group CU_Gri (S203 No), the control circuit 31 updates the position of the anchor AKi (S204). Specifically, the control circuit 31 moves the anchor AKi to a freely selected position in the cell unit group CU_Gri.

The control circuit 31 registers the updated position of the anchor AKi in the anchor conversion information (S205).

After registering the anchor conversion information (S205), or in a case where the anchor AKi is present in the cell unit group CU_Gri (S203_Yes), the control circuit 31 increments the variable i and sets i=i+1 (S206). Then, the control circuit 31 confirms whether the variable i is less than the total number of cell unit groups CU_Gr (S207).

If the variable i is less than the total number of cell unit groups CU_Gr (S207_Yes), the control circuit 31 advances to step S202. On the other hand, if the variable i is not less than the total number of cell unit groups CU_Gr (S207 No), the control circuit 31 ends the registration of the anchor conversion information in regard to the present block BLK.

2.5.2. Advantageous Effects According to the Present Modification

With the configuration according to the present modification, the same advantageous effects as in the second embodiment can be obtained.

3. Third Embodiment

Next, a third embodiment is described. In the third embodiment, a case is described in which, when the boundary line was moved, the position of the anchor AK in the cell unit group CU_Gr is moved. Hereinafter, different points from the first and second embodiments are mainly described.

3.1. Flow of Registration of CU_Gr Conversion Information and Anchor Conversion Information First, referring to FIG. 32, an example of a flow of registration of the CU_Gr conversion information and the anchor conversion information is described. FIG. 32 is a flowchart illustrating an example of the flow of registration of the CU_Gr conversion information and the anchor conversion information.

As illustrated in FIG. 32, the flow of steps S100 to S107 is the same as described with reference to FIG. 13 of the first embodiment.

After registering the CU_Gr conversion information (S106), the control circuit 31 confirms whether there is a change (movement) of the anchor AK (S120). For example, in a case where there is a cell unit group CU_Gr in which the anchor AK is not included, or in a case where there is an anchor AK that needs to be moved even if the anchor AK is included in the cell unit group CU_Gr, the control circuit 31 determines that there is a change of the anchor AK.

If there is a change of the anchor AK (S120 Yes), the control circuit 31 acquires the information of the anchor AK that is changed (S121). For example, in a case of moving the position of the anchor AK to the vicinity of the center of the corresponding cell unit group CU_Gr, the control circuit 31 moves the anchor AK that is present in the cell unit group CU_Gr, in accordance with the movement of the boundary line. On the other hand, if there is no change of the anchor AK (S120 No), the control circuit 31 ends the registration.

The control circuit 31 updates the position of the anchor AK that is selected as the target of change (S122).

The control circuit 31 registers the information of the moved anchor AK in the anchor conversion information (S111).

3.2. Concrete Example of Movement of Boundary Line and Anchor

Next, referring to FIG. 33 and FIG. 34, a concrete example in a case where the boundary line and anchor AK were moved is described. In the present concrete example, a case is described in which N=(the total number of cell unit groups−1), that is, the number of times of movement of the boundary line (namely, the number of times of occurrence of the time difference) in one block BLK is permitted up to the total number of boundary lines. FIG. 33 is a schematic diagram illustrating a concrete example of the movement of the boundary line and the anchor AK in one block BLK. FIG. 34 is a table illustrating an example of the Vth information, the CU_Gr conversion information, and the anchor conversion information in the concrete example.

As illustrated in FIG. 33, in the present example, the control circuit 31 moves the boundary 0 through the boundary 2. In accordance with this, the control circuit 31 moves each anchor AK to the vicinity of the center of the corresponding cell unit group CU_Gr.

More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU0 and the word line WL9 and the cell unit CU corresponding to the set of the string unit SU1 and the word line WL9. Thus, the control circuit 31 moves the boundary 1 to between these two cell units CU. The movement amount of the boundary 1 is +5.

A time difference occurs between the cell unit CU corresponding to the set of the string unit SU2 and the word line WL14 and the cell unit CU corresponding to the set of the string unit SU3 and the word line WL14. Thus, the control circuit 31 moves the boundary 2 to between these two cell units CU. The movement amount of the boundary 2 is +11.

As a result, the cell unit CU corresponding to the set of the string unit SU0 and the word line WL0 through the cell unit CU corresponding to the set of the string unit SU and the word line WL2 belong to the cell unit group CU_Gr0. The cell unit CU corresponding to the set of the string unit SU2 and the word line WL2 through the cell unit CU corresponding to the set of the string unit SU0 and the word line WL9 belong to the cell unit group CU_Gr1. The cell unit CU corresponding to the set of the string unit SU1 and the word line WL9 through the cell unit CU corresponding to the set of the string unit SU2 and the word line WL14 belong to the cell unit group CU_Gr2. In addition, the cell unit CU corresponding to the set of the string unit SU3 and the word line WL14 through the cell unit CU corresponding to the set of the string unit SU3 and the word line WL15 belong to the cell unit group CU_Gr3.

The control circuit 31 moves the anchor AK0 from the cell unit CU corresponding to the set of the string unit SU0 and the word line WL0 to the cell unit CU corresponding to the set of the string unit SU0 and the word line WL1. The movement amount of the anchor AK0 is +4. The control circuit 31 moves the anchor AK1 from the cell unit CU corresponding to the set of the string unit SU0 and the word line WL4 to the cell unit CU corresponding to the set of the string unit SU3 and the word line WL5. The movement amount of the anchor AK1 is +7. The control circuit 31 moves the anchor AK2 from the cell unit CU corresponding to the set of the string unit SU0 and the word line WL8 to the cell unit CU corresponding to the set of the string unit SU0 and the word line WL12. The movement amount of the anchor AK2 is +16. The control circuit 31 moves the anchor AK3 from the cell unit CU corresponding to the set of the string unit SU0 and the word line WL12 to the cell unit CU corresponding to the set of the string unit SU1 and the word line WL15. The movement amount of the anchor AK3 is +13.

As illustrated in FIG. 34, in the anchor conversion information, "0000100" is registered as the conversion information of the anchor AK0 included in the cell unit group CU_Gr0. "0000100" indicates that the movement amount of the anchor AK0 is +4. "0000111" is registered as the conversion information of the anchor AK1 included in the cell unit group CU_Gr1. "0000111" indicates that the movement amount of the anchor AK1 is +7. "0010000" is registered as the conversion information of the anchor AK2 included in the cell unit group CU_Gr2. "0010000" indicates that the movement amount of the anchor AK2 is +16. "0001101" is registered as the conversion information of the anchor AK3 included in the cell unit group CU_Gr3. "0001101" indicates that the movement amount of the anchor AK3 is +13.

In the CU_Gr conversion information, "1111010" is registered as the CU_Gr conversion information of the boundary 0. "1111010" indicates that the movement amount of the boundary 0 is −6. "0000101" is registered as the CU_Gr conversion information of the boundary 1. "0000101" indicates that the movement amount of the boundary 1 is +5. "0001011" is registered as the CU_Gr conversion information of the boundary 2. "0001011" indicates that the movement amount of the boundary 2 is +11.

3.3. Advantageous Effects According to the Present Embodiment

With the configuration according to the present embodiment, the same advantageous effects as in the first and second embodiments can be obtained.

3.4. Modification of the Third Embodiment

Next, a modification of the third embodiment is described. In the present modification, a flow of registration of the anchor conversion information, which is different from the third embodiment, is described.

3.4.1. Flow of Registration of Anchor Conversion Information

Referring to FIG. 35, a flow of registration of the anchor conversion information is described. FIG. 35 is a flowchart illustrating the flow of registration of the anchor conversion information.

In the present modification, as in the modification of the second embodiment, after the write operation to all cell units CU of the block BLK of the write target ended, the anchor conversion information of this block BLK is registered.

Note that as regards the flow of the CU_Gr conversion information, the flow of the CU_Gr conversion information described with reference to FIG. 13 of the first embodiment is applicable.

As illustrated in FIG. 35, the flow of steps S200 to S202 is the same as described with reference to FIG. 31 of the modification of the second embodiment.

After acquiring the position information of the anchor AKi (S202), the control circuit 31 confirms whether a change of the position of the anchor AKi is necessary (S210).

If a change of the position of the anchor AKi is necessary (S210 Yes), the control circuit 31 updates the position of the anchor AKi (S204). Specifically, the control circuit 31 moves the anchor AKi to a freely selected position in the cell unit group CU_Gri. On the other hand, if a change of the position of the anchor AKi is not necessary (S210_No), the control circuit 31 advances to step S206.

The flow of steps S205 to S207 is the same as described with reference to FIG. 31 of the modification of the second embodiment.

3.4.2. Advantageous Effects According to the Present Modification

With the configuration according to the present modification, the same advantageous effects as in the third embodiment can be obtained.

4. Fourth Embodiment

Next, a fourth embodiment is described. In the fourth embodiment, a case is described in which a cell unit group CU_Gr and an anchor AK are added.

4.1. Flow of Addition of Cell Unit Group and Anchor

Next, referring to FIG. 36, an example of addition of a cell unit group CU_Gr and an anchor AK is described. FIG. 36 is a flowchart illustrating an example of the flow of addition of the cell unit group CU_Gr and the anchor AK. Note that the example of FIG. 36 is a flowchart in which attention is paid to the addition of the cell unit group CU_Gr and the anchor AK, and a flow relating to the movement of the existing cell unit groups CU_Gr and the anchors AK is omitted.

As illustrated in FIG. 36, the flow of steps S100 to S104 is the same as described with reference to FIG. 13 of the first embodiment.

In a case where the acquisition is successful (S104_Yes), the control circuit 31 executes the registration process in accordance with the flow described with reference to FIG. 13 of the first embodiment, the flow described with reference to FIG. 22 of the second embodiment, or the flow described with reference to FIG. 32 of the third embodiment.

In a case of the failure of acquisition (S104_No), or in a case where the number of times of occurrence of the time difference exceeds the set value N (S102_No), the control circuit 31 confirms whether the number of times of addition of the cell unit group CU_Gr is equal to or less than a preset determination value M (M is an integer of 1 or more) (S130). For example, the number of times of addition of the cell unit group CU_Gr is a value obtained by subtracting the set value N from the number of times of occurrence of the time difference. For example, the determination value M is set by referring to the number of cell units CU included in the cell unit group CU_Gr. The control circuit 31 confirms whether the number of times of occurrence of the time difference is equal to or greater than (N+M). For example, in a case where the number of times of occurrence of the time difference is equal to or greater than the total number of cell unit groups, the control circuit 31 confirms whether the addition of the cell unit group CU_Gr is possible.

If the number of times of addition of the cell unit group CU_Gr is equal to or less than the determination value M (S130_Yes), the control circuit 31 determines that the cell unit group CU_Gr can be added, and creates Vth information corresponding to the cell unit group CU_Gr that is added (S131).

Next, the control circuit creates CU_Gr conversion information corresponding to the cell unit group CU_Gr that is added (S132).

Next, the control circuit creates anchor conversion information corresponding to the cell unit group CU_Gr that is added (S133). Note that the order of steps S131 to S133 may be changed, or steps S131 to S133 may be executed in parallel.

In addition, if the number of times of addition of the cell unit group CU_Gr exceeds the determination value M (S130_No), the control circuit 31 sets a block moving flag (S107).

4.2. Concrete Example of Addition of Cell Unit Group and Anchor

Next, referring to FIG. 37 and FIG. 38, a concrete example of a case of adding a cell unit group CU_Gr and an anchor AK is described. In the present concrete example, a case is described in which N=(the total number of cell unit groups−1), that is, the number of times of movement of the boundary line (namely, the number of times of occurrence of the time difference) in one block BLK is permitted up to the total number of boundary lines. FIG. 37 is a schematic diagram illustrating a concrete example of adding a cell unit group CU_Gr and an anchor AK in one block BLK. FIG. 38 is a table illustrating an example of the Vth information, the CU_Gr conversion information, and the anchor conversion information in the concrete example.

As illustrated in FIG. 37, in the present example, the control circuit 31 moves the boundary 0 through the boundary 2. In accordance with this, the control circuit 31 moves anchors AK0 to AK3. In addition, the control circuit 31 adds a cell unit group CU_Gr4 and an anchor AK4.

More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU0 and the word line WL9 and the cell unit CU corresponding to the set of the string unit SU1 and the word line WL9. Thus, the control circuit 31 moves the boundary 1 to between these two cell units CU. The movement amount of the boundary 1 is +5.

A time difference occurs between the cell unit CU corresponding to the set of the string unit SU2 and the word line WL14 and the cell unit CU corresponding to the set of the string unit SU3 and the word line WL14. Thus, the control circuit 31 moves the boundary 2 to between these two cell units CU. The movement amount of the boundary 2 is +11.

A time difference occurs between the cell unit CU corresponding to the set of the string unit SU1 and the word line WL15 and the cell unit CU corresponding to the set of the string unit SU2 and the word line WL15. Thus, the control circuit 31 adds a boundary 3 between these two cell units CU. In addition, the control circuit 31 adds a cell unit group CU_Gr4 and an anchor AK4.

As a result, the cell unit CU corresponding to the set of the string unit SU0 and the word line WL0 through the cell unit CU corresponding to the set of the string unit SU1 and the word line WL2 belong to the cell unit group CU_Gr0. The cell unit CU corresponding to the set of the string unit SU2 and the word line WL2 through the cell unit CU corresponding to the set of the string unit SU0 and the word line WL9 belong to the cell unit group CU_Gr1. The cell unit CU corresponding to the set of the string unit SU1 and the word line WL9 through the cell unit CU corresponding to the set of the string unit SU2 and the word line WL14 belong to the cell unit group CU_Gr2. The cell unit CU corresponding to the set of the string unit SU3 and the word line WL14 through the cell unit CU corresponding to the set of the string unit SU1 and the word line WL15 belong to the cell unit group CU_Gr3. In addition, the cell unit CU corresponding to the set of the string unit SU2 and the word line WL15 through the cell unit CU corresponding to the set of the string unit SU3 and the word line WL15 belong to the added cell unit group CU_Gr4.

The control circuit 31 moves the anchor AK0 from the cell unit CU corresponding to the set of the string unit SU0 and the word line WL0 to the cell unit CU corresponding to the set of the string unit SU0 and the word line WL1. The movement amount of the anchor AK0 is +4. The control circuit 31 moves the anchor AK1 from the cell unit CU corresponding to the set of the string unit SU0 and the word line WL4 to the cell unit CU corresponding to the set of the string unit SU3 and the word line WL5. The movement amount of the anchor AK1 is +7. The control circuit 31 moves the anchor AK2 from the cell unit CU corresponding to the set of the string unit SU0 and the word line WL8 to the cell unit CU corresponding to the set of the string unit SU0 and the word line WL12. The movement amount of the anchor AK2 is +16. The control circuit 31 moves the anchor AK3 from the cell unit CU corresponding to the set of the string unit SU0 and the word line WL12 to the cell unit CU corresponding to the set of the string unit SU0 and the word line WL15. The movement amount of the anchor AK3 is +12. In addition, the control circuit 31 allocates the anchor AK4 to the cell unit CU corresponding to the set of the string unit SU2 and the word line WL15.

As illustrated in FIG. 38, the cell unit group CU_Gr4 is added in the block BLK0. In the example of FIG. 38, in a case where the number of times of addition, which is permitted, is one, five bytes in total, namely three bytes of Vth information of the MLC (a set of ΔVA, ΔVB, and ΔVC), one byte of anchor conversion information, and one byte of CU_Gr conversion information, are added. Accordingly, in a case where the time difference occurs at four locations, the amount of increase of data is 11 bytes at maximum per block BLK.

A set of ΔVA4, ΔVB4 and ΔVC4 is created as the Vth information corresponding to the cell unit group CU_Gr4.

In the anchor conversion information, "0000100" is registered as the conversion information of the anchor AK0 included in the cell unit group CU_Gr0. "0000100" indicates that the movement amount of the anchor AK0 is +4. "0000111" is registered as the conversion information of the anchor AK1 included in the cell unit group CU_Gr1. "0000111" indicates that the movement amount of the anchor AK1 is +7. "0010000" is registered as the conversion information of the anchor AK2 included in the cell unit group CU_Gr2. "0010000" indicates that the movement amount of the anchor AK2 is +16. "0001100" is registered as the conversion information of the anchor AK3 included in the cell unit group CU_Gr3. "0001100" indicates that the movement amount of the anchor AK3 is +12. For example, "0111010" is registered as the conversion information of the anchor AK4 included in the cell unit group CU_Gr4. "0111010" indicates that the movement amount with reference to the anchor AK0 is +58. Note that the movement amount of the anchor AK4 may be set with reference to the cell unit CU corresponding to the set of the string unit SU0 and the word line WL0, or may be set with reference to the immediately preceding anchor AK3.

In the CU_Gr conversion information, "1111010" is registered as the CU_Gr conversion information of the boundary 0. "1111010" indicates that the movement amount of the boundary 0 is −6. "0000101" is registered as the CU_Gr conversion information of the boundary 1. "0000101" indicates that the movement amount of the boundary 1 is +5. "0001011" is registered as the CU_Gr conversion information of the boundary 2. "0001011" indicates that the movement amount of the boundary 2 is +11. For example, "0111000" is registered as the CU_Gr conversion information of the added boundary 3. "0111000" indicates that the movement amount with reference to the boundary 0 is +56. Note that the movement amount of the boundary 3 may be set with reference to the immediately preceding boundary 2.

4.3. Advantageous Effects According to the Present Embodiment

With the configuration according to the present embodiment, the same advantageous effects as in the first to third embodiments can be obtained.

Furthermore, with the configuration according to the present embodiment, the cell unit group CU_Gr and the anchor AK can be added. Thus, for example, in a case where the memory system 3 is the ZNS-adaptive memory system, even if the number of times of occurrence of the time difference becomes greater than (the total number of cell unit groups CU_Gr−1), an increase of error bits due to the occurrence of the time difference can be suppressed. Thus, the reliability of the memory system 3 can be improved. In addition, a decrease in processing capability due to a process for error correction can be suppressed. Besides, for example, in a case where the memory system 3 is the ZNS-nonadaptive memory system, even if the number of times of occurrence of the time difference becomes greater than (the total number of cell unit groups CU_Gr−1), the write operation in the present block BLK can be continued without executing the insertion process of padding data. Therefore, an increase of the WAF can be suppressed.

4.4. Modification of the Fourth Embodiment

Next, a modification of the fourth embodiment is described. In the present modification, as in the modification of the first embodiment, a case is described in which an anchor AK is not set. Hereinafter, different points from the fourth embodiment are mainly described.

4.4.1. Flow of Addition of Cell Unit Group

First, referring to FIG. 39, a flow of addition of a cell unit group CU_Gr is described. FIG. 39 is a flowchart illustrating the flow of addition of the cell unit group CU_Gr. Note that the example of FIG. 39 is a flowchart in which attention is paid to the addition of the cell unit group CU_Gr, and a flow relating to the movement of the existing cell unit groups CU_Gr is omitted.

As illustrated in FIG. 39, the flow of steps S100 to S104 is the same as described with reference to FIG. 13 of the first embodiment.

In a case where the acquisition is successful (S104_Yes), the control circuit 31 executes the registration process in accordance with the flow described with reference to FIG. 13 of the first embodiment.

On the other hand, in a case of the failure of acquisition (S104_No), the control circuit 31 confirms whether the number of times of addition of the cell unit group CU_Gr is equal to or less than a preset determination value M (M is an integer of 1 or more) (S130). In other words, the control circuit 31 confirms whether the number of times of occurrence of the time difference is equal to or less than (N+M).

If the number of times of addition of the cell unit group CU_Gr is equal to or less than the determination value M (S130_Yes), the control circuit 31 creates Vth information corresponding to the cell unit group CU_Gr that is added (S131).

Next, the control circuit creates CU_Gr conversion information corresponding to the cell unit group CU_Gr that is added (S132). Note that the order of steps S131 and S132 may be changed, or steps S131 and S132 may be executed in parallel. In the present example, the creation of the anchor conversion information of step S133 described with reference to FIG. 36 of the fourth embodiment is omitted.

If the number of times of addition of the cell unit group CU_Gr exceeds the determination value M (S130_No), the control circuit 31 sets a block moving flag (S107).

4.4.2. Concrete Example of Addition of Cell Unit Group

Next, referring to FIG. 40 and FIG. 41, a concrete example of a case of adding the cell unit group CU_Gr is described. In the present concrete example, a case is described in which N=(the total number of cell unit groups−1), that is, the number of times of movement of the boundary line (namely, the number of times of occurrence of the time difference) in one block BLK is permitted up to the total number of boundary lines. FIG. 40 is a schematic diagram illustrating a concrete example in which the cell unit group CU_Gr is added in one block BLK. FIG. 41 is a table illustrating an example of the Vth information and the CU_Gr conversion information in the concrete example.

As illustrated in FIG. 40, as in the concrete example described with reference to FIG. 37 of the fourth embodiment, the control circuit 31 moves the boundary 0 through the boundary 2. In addition, the control circuit 31 adds the cell unit group CU_Gr4.

More specifically, a time difference occurs between the cell unit CU corresponding to the set of the string unit SU1 and the word line WL2 and the cell unit CU corresponding to the set of the string unit SU2 and the word line WL2. Thus, the control circuit 31 moves the boundary 0 to between these two cell units CU. The movement amount of the boundary 0 is −6.

A time difference occurs between the cell unit CU corresponding to the set of the string unit SU0 and the word line WL9 and the cell unit CU corresponding to the set of the string unit SU1 and the word line WL9. Thus, the control circuit 31 moves the boundary 1 to between these two cell units CU. The movement amount of the boundary 1 is +5.

A time difference occurs between the cell unit CU corresponding to the set of the string unit SU2 and the word line WL14 and the cell unit CU corresponding to the set of the string unit SU3 and the word line WL14. Thus, the control circuit 31 moves the boundary 2 to between these two cell units CU. The movement amount of the boundary 2 is +11.

A time difference occurs between the cell unit CU corresponding to the set of the string unit SU1 and the word line WL15 and the cell unit CU corresponding to the set of the string unit SU2 and the word line WL15. Thus, the control circuit 31 adds a boundary 3 between these two cell units CU.

The configuration of each cell unit group CU_Gr is the same as described with reference to FIG. 37.

As illustrated in FIG. 41, the cell unit group CU_Gr4 is added in the block BLK0.

A set of ΔVA4, ΔVB4 and ΔVC4 is created as the Vth information corresponding to the cell unit group CU_Gr4.

In the CU_Gr conversion information, "1111010" is registered as the CU_Gr conversion information of the boundary 0. "1111010" indicates that the movement amount of the boundary 0 is −6. "0000101" is registered as the CU_Gr conversion information of the boundary 1. "0000101" indicates that the movement amount of the boundary 1 is +5. "0001011" is registered as the CU_Gr conversion information of the boundary 2. "0001011" indicates that the movement amount of the boundary 2 is +11. "0111000" is registered as the CU_Gr conversion information of the added boundary 3. "0111000" indicates that the movement amount with reference to the boundary 0 is +56. Note that the movement amount of the boundary 3 may be set with reference to the immediately preceding boundary 2.

4.4.3. Advantageous Effects According to the Present Modification

With the configuration according to the present modification, the same advantageous effects as in the fourth embodiment can be obtained.

5. Fifth Embodiment

Next, a fifth embodiment is described. In the fifth embodiment, a description is given of a case of executing an insertion process of padding data (hereinafter, also referred to simply as "padding process") in a write block in a case where the memory system 3 is the ZNS-nonadaptive memory system. Hereinafter, different points from the first to fourth embodiments are mainly described.

5.1. Flow of Insertion Process of Padding Data

First, referring to FIG. 42, an example of a flow of the insertion process of padding data is described. FIG. 42 is a flowchart illustrating an example of the flow of the insertion process of padding data.

In the present embodiment, when a time difference occurred, padding data is inserted in remaining (unwritten) cell units CU in the cell unit group CU_Gr in which the time difference occurred.

As illustrated in FIG. 42, the control circuit 31 first confirms the presence or absence of the time difference occurrence flag (S300).

In a case where the time difference occurrence flag is absent (S301_No), the control circuit 31 ends the insertion process of padding data.

In a case where the time difference occurrence flag is present (is set) (S301_Yes), the control circuit 31 acquires a start address for starting the insertion process of padding data (S302). For example, the address of the cell unit CU next to a location where the time difference occurred is acquired as the start address.

Next, the control circuit 31 acquires an end address for ending the insertion process of padding data (S303). For example, the address of the last cell unit CU of the cell unit group CU_Gr in which the time difference occurred is acquired as the end address.

The control circuit 31 executes the insertion process of padding data (S304). More specifically, the control circuit 31 writes padding data in the cell units CU between the start address and the end address. In other words, the control circuit 31 writes padding data in the unwritten cell units CU in the cell unit group CU_Gr in which the time difference occurred.

After the insertion process of padding data, the control circuit 31 sets an address of the next write destination (S305). More specifically, for example, the control circuit 31 sets the address of the first cell unit CU of the next cell unit group CU_Gr as the address of the next write destination. Note that in a case where the cell unit group CU_Gr in which the time difference occurred is the last cell unit group CU_Gr in the block BLK, the control circuit 31 sets an address of another block BLK as the address of the next write destination.

5.2. Concrete Example of Padding Data Insertion

Figure 43:
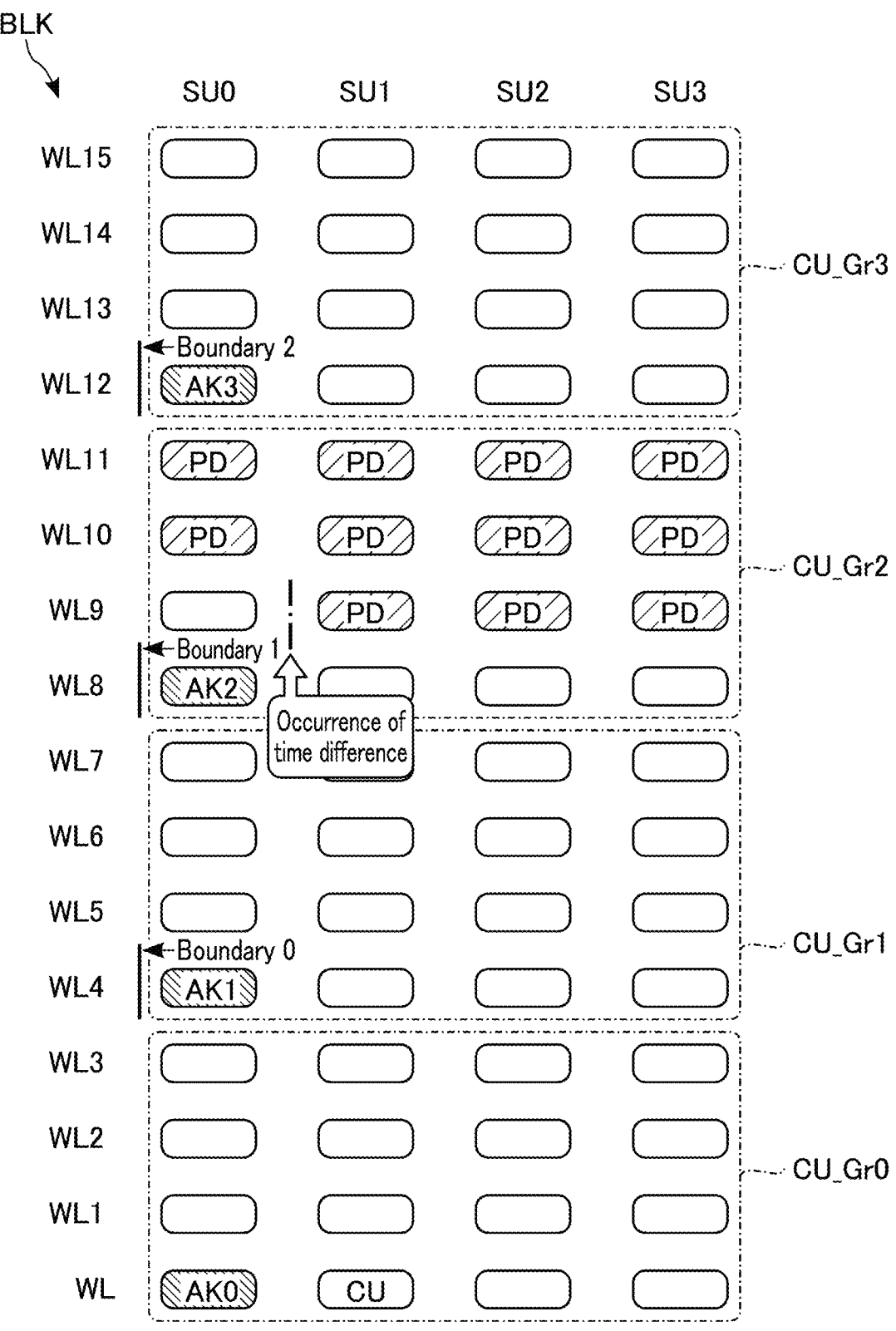
FIG. 43 is a schematic diagram illustrating a concrete example of inserting padding data in one block included in the memory system according to the fifth embodiment.

Next, referring to FIG. 43, a concrete example of insertion of padding data PD is described. FIG. 43 is a schematic diagram illustrating a concrete example of inserting padding data PD in one block BLK.

As illustrated in FIG. 43, the configuration of cell unit groups CU_Gr and the arrangement of anchors AK are the same as in FIG. 9 of the first embodiment.

For example, a time difference occurs between the cell unit CU corresponding to the set of the string unit SU0 and the word line WL9 and the cell unit CU corresponding to the set of the string unit SU1 and the word line WL9 of the cell unit group CU_Gr2. In this case, the control circuit 31 executes the insertion process of the padding data PD in the remaining cell units CU of the cell unit group CU_Gr2. More specifically, the padding data PD is written in eleven cell units CU from the cell unit CU corresponding to the set of the string unit SU1 and the word line WL9 to the cell unit CU corresponding to the set of the string unit SU3 and the word line WL11.

Then, the control circuit 31 sets, as the address of the next write destination, the address of the cell unit CU corresponding to the set of the string unit SU0 and the word line WL12 of the cell unit group CU_Gr3.

5.3. Advantageous Effects According to the Present Embodiment

With the configuration according to the present embodiment, in the memory system 3 in which padding data PD can be inserted, that is, in the ZNS—nonadaptive memory system, the range of insertion of padding data PD can be set to be the unwritten cell units CU of the cell unit group CU_Gr in which the time difference occurred. Thereby, the range of insertion of padding data PD can be made narrower than in a case where the range of insertion of padding data PD is set to be all unwritten cell units CU of the block BLK of the write target. Thereby, since the increase of invalid data can be suppressed, the increase of the WAF can be suppressed. Thus, the decrease in effective memory capacity of the memory system 3 can be suppressed. Moreover, since the increase in write frequency of invalid data can be suppressed, the increase in the number of times of repetition of the write operation and the erase operation can be suppressed. Therefore, a deterioration in life of the memory system 3 can be suppressed.

5.4. Modification of the Fifth Embodiment

Next, a modification of the fifth embodiment is described. In the present modification, as in the modification of the first embodiment, a case in which an anchor AK is not set is described. Hereinafter, different points from the fifth embodiment are mainly described.

5.4.1. Concrete Example of Padding Data Insertion

Next, referring to FIG. 44, a concrete example of insertion of padding data PD is described. FIG. 44 is a schematic diagram illustrating a concrete example of inserting padding data in one block BLK.

As illustrated in FIG. 44, in the present example, as in the concrete example of the fifth embodiment, a time difference occurs between the cell unit CU corresponding to the set of the string unit SU0 and the word line WL9 and the cell unit CU corresponding to the set of the string unit SU1 and the word line WL9 of the cell unit group CU_Gr2. Thus, the control circuit 31 executes the insertion process of padding data PD in the remaining cell units CU of the cell unit group CU_Gr2.

Then, the control circuit 31 sets, as the address of the next write destination, the address of the cell unit CU corresponding to the set of the string unit SU0 and the word line WL12 of the cell unit group CU_Gr3.

5.4.2. Advantageous Effects According to the Present Modification

With the configuration according to the present modification, the same advantageous effects as in the fifth embodiment can be obtained.

6. Sixth Embodiment

Next, a sixth embodiment is described. In the sixth embodiment, a case is described in which padding data PD is inserted in the cell unit group CU_Gr in which a time difference occurred, and also the position of the anchor AK is changed. Hereinafter, different points from the first to fifth embodiments are mainly described.

6.1. Flow of Insertion Process of Padding Data and Registration of Anchor Conversion Information First, referring to FIG. 45, a description is given of an example of the flow of the insertion process of padding data PD and the registration of anchor conversion information. FIG. 45 is a flowchart illustrating an example of the flow of the insertion process of padding data PD and the registration of anchor conversion information.

In the present embodiment, when a time difference occurred, padding data PD is inserted in remaining (unwritten) cell units CU in the cell unit group CU_Gr in which the time difference occurred.

As illustrated in FIG. 45, the flow of steps S300 to S305 is the same as described with reference to FIG. 42 of the fifth embodiment.

After setting the address of the next write destination (S305), the control circuit 31 confirms whether there is a change (movement) of the anchor AK (S306). For example, in a case where an anchor AK is included in the cell unit CU that is the target of insertion of the padding data PD, or in a case where there is an anchor AK that is moved, the control circuit 31 determines that there is a change of the anchor AK.

If there is a change of the anchor AK (S306 Yes), the control circuit 31 acquires the information of the anchor AK that is changed (S307). For example, in a case of setting the position of the anchor AK in the vicinity of the center of the cell unit group CU_Gr, the control circuit 31 moves the anchor AK to the vicinity of the center of cell units CU in which valid data is written in the cell unit group CU_Gr, in accordance with the insertion of the padding data PD. On the other hand, if there is no change of the anchor AK (S306_No), the control circuit 31 ends the registration.

The control circuit 31 updates the position of the anchor AK that is selected as the target of change (S308).

The control circuit 31 registers the information of the moved anchor AK in the anchor conversion information (S309).

6.2. Concrete Example of Padding Data Insertion and Anchor Movement

Next, referring to FIG. 46 and FIG. 47, a concrete example of the insertion of the padding data PD and the movement of the anchor AK is described. FIG. 46 is a schematic diagram illustrating a concrete example of inserting the padding data PD and moving the anchor AK in one block BLK. FIG. 47 is a table illustrating an example of the Vth information and the anchor conversion information in the concrete example.

As illustrated in FIG. 46, the configuration of cell unit groups CU_Gr and the arrangement of anchors AK are the same as in FIG. 9 of the first embodiment.

For example, as in the description of FIG. 43 of the fifth embodiment, a time difference occurs between the cell unit CU corresponding to the set of the string unit SU0 and the word line WL9 and the cell unit CU corresponding to the set of the string unit SU1 and the word line WL9 of the cell unit group CU_Gr2. In this case, the control circuit 31 executes the insertion process of the padding data PD in the remaining cell units CU of the cell unit group CU_Gr2. More specifically, the padding data PD is written in eleven cell units CU from the cell unit CU corresponding to the set of the string unit SU1 and the word line WL9 to the cell unit CU corresponding to the set of the string unit SU3 and the word line WL11.

The control circuit 31 sets, as the address of the next write destination, the address of the cell unit CU corresponding to the set of the string unit SU0 and the word line WL12 of the cell unit group CU_Gr3.

In addition, the control circuit 31 moves the anchor AK2 from the cell unit CU corresponding to the set of the string unit SU0 and the word line WL8 to the cell unit CU corresponding to the set of the string unit SU2 and the word line WL8. The movement amount of the anchor AK2 is +2.

As illustrated in FIG. 47, the anchor conversion information is indicated by, for example, 4-bit data ($0 \leq$ movement amount $\leq +15$). In a case where there occurs no movement of the anchor AK, the anchor position information is set to "0000". For example, in a case where the movement amount is +15, the position information of the boundary line is set to "1111".

In the example of FIG. 47, in the anchor conversion information, "0010" is registered as the conversion information of the anchor AK2 included in the cell unit group CU_Gr2. "0010" indicates that the movement amount of the anchor AK2 is +2.

6.3. Advantageous Effects According to the Present Embodiment

With the configuration according to the present embodiment, the same advantageous effects as in the fifth embodiment can be obtained.

Moreover, with the configuration according to the present embodiment, since the anchor AK can be moved, the range in which the padding data PD can be inserted can be increased.

7. Modifications

According to the above embodiments, a memory system includes a memory chip (11) including a block (BLK) that includes a plurality of cell units (CU) and a memory controller (30). Each of the plurality of cell units including a plurality of memory cells (MC). A first cell unit (CU, SU2_WL6) and a second cell unit (CU, SU3_WL6) of the plurality of cell units are classified into a first group (CU_Gr1), and a third cell unit (CU, SU0_WL8) of the plurality of cell units is classified into a second group (CU_Gr2). The memory controller is configured to use a first correction amount ($\Delta$VA1) of a read voltage when data is read from the plurality of memory cells of a cell unit classified into the first group among the plurality of cell units, to use a second correction amount ($\Delta$VA2) of the read voltage when data is read from the memory cells of a cell unit classified into the second group among the plurality of cell units. In a case where a time difference from execution of a write operation of the first cell unit to execution of the write operation of the second cell unit exceeds a reference value, the memory controller is configured to change a boundary position between the first group and the second group to between the first cell unit and the second cell unit, and to classify the second cell unit into the second group.

By applying the above-described embodiments, a semiconductor storage device that can improve a processing capability can be provided.

Note that the embodiments are not limited to the above-described modes, and various modifications are possible.

Besides, the term "coupling" in the above-described embodiments includes a state of indirect coupling, with some element, such as a transistor or a register, being interposed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a memory chip including a block that includes a plurality of cell units, each of the plurality of cell units including a plurality of memory cells; and
a memory controller, wherein
a first cell unit and a second cell unit of the plurality of cell units are classified into a first group, and a third cell unit of the plurality of cell units is classified into a second group, and
the memory controller is configured to:
use a first correction amount of a read voltage when data is read from the plurality of memory cells of a cell unit classified into the first group among the plurality of cell units;
use a second correction amount of the read voltage when data is read from the memory cells of a cell unit classified into the second group among the plurality of cell units; and
in a case where a time difference from execution of a write operation of the first cell unit to execution of the write operation of the second cell unit exceeds a reference value, change a boundary position between the first group and the second group to be between the first cell unit and the second cell unit, and classify the second cell unit into the second group.

2. The memory system according to claim 1, wherein in a case where, in the block, a number of times of occurrence of the time difference exceeding the reference value exceeds a set value, the memory controller is further configured to select the block as a target block of data movement.

3. The memory system according to claim 2, wherein the set value is 1.

4. The memory system according to claim 2, wherein
the block is classified into a plurality of groups including the first group and the second group, and
a maximum value of the set value is a value obtained by subtracting one from a total number of the groups included in the block.

5. The memory system according to claim 1, wherein the memory controller is further configured to execute the write operation of the second cell unit after executing the write operation of the first cell unit.

6. The memory system according to claim 1, wherein the memory controller is further configured to use a fourth cell unit that is classified into the first group among the plurality of cell units, for a calculation of the first correction amount, and to use the third cell unit for a calculation of the second correction amount.

7. The memory system according to claim 1, wherein
a fifth cell unit and a sixth cell unit of the plurality of cell units are classified into the second group,
a seventh cell unit of the cell units of the plurality of cell units is classified into a third group, and
the memory controller is further configured to:
use a third correction amount of the read voltage when data is read from the plurality of memory cells of a cell unit classified into the third group among the plurality of cell units; and
in a case where a time difference from execution of the write operation of the fifth cell unit to execution of the write operation of the sixth cell unit exceeds the reference value, change a boundary position between the second group and the third group to be between the fifth cell unit and the sixth cell unit, and classify the sixth cell unit into the third group.

8. The memory system according to claim 6, wherein
an eighth cell unit, a ninth cell unit, a tenth cell unit and an eleventh cell unit of the plurality of cell units are classified into a third group, and
the memory controller is further configured to:
use a third correction amount of the read voltage, the third correction amount being calculated by using the eighth cell unit, when data is read from the plurality of memory cells of a cell unit classified into the third group among the plurality of cell units; and
in a case where a time difference from execution of the write operation of the ninth cell unit to execution of the write operation of the tenth cell unit exceeds the reference value, change a boundary position between the second group and the third group to be between the ninth cell unit and the tenth cell unit, classify the eighth cell unit and the ninth cell unit into the second group, and use the eleventh cell unit for a calculation of the third correction amount.

9. The memory system according to claim 1, wherein
a twelfth cell unit of the plurality of cell units is classified into the first group,
a 13th cell unit of the plurality of cell units is classified into a third group, and
the memory controller is further configured to:
use a third correction amount of the read voltage, the third correction amount being calculated by using the 13th cell unit, when data is read from the plurality of memory cells of a cell unit classified into the third group among the plurality of cell units; and
in a case where a time difference from execution of the write operation of the second cell unit to execution of the write operation of the twelfth cell unit exceeds the reference value, change a boundary position between the second group and the third group to be between the second cell unit and the twelfth cell unit, and classify the twelfth cell unit into the third group.

10. The memory system according to claim 9, wherein the memory controller is further configured to use the first cell unit for a calculation of the first correction amount, to use the second cell unit for a calculation of the second correction amount, and to use the twelfth cell unit for a calculation of the third correction amount.

11. The memory system according to claim 1, wherein
a 14th cell unit and a 15th cell unit of the plurality of cell units are classified into the first group, and
the memory controller is further configured to:
use the 14th cell unit for a calculation of the first correction amount; and
in a case where the time difference exceeds the reference value, change the cell unit used for the calculation of the first correction amount from the 14th cell unit to the 15th cell unit.

12. The memory system according to claim 1, wherein the block is classified into a plurality of groups including the first group and the second group, and the memory controller is further configured to add a fourth group to the plurality of groups, in a case where, in the block, a number of times of occurrence of the time difference exceeding the reference value exceeds a set value.

13. The memory system according to claim 12, wherein a 16th cell unit of the plurality of cell units is classified into the fourth group, and the memory controller is further configured to manage information of a fourth correction amount of the read voltage corresponding to the fourth group, position information of the fourth group, and information of the 16th cell unit used for a calculation of the fourth correction amount.

14. The memory system according to claim 1, wherein the memory chip further includes a plurality of bit lines coupled to the plurality of memory cells included in the first cell unit of the plurality of cell units, and a word line coupled to the plurality of memory cells.

15. The memory system according to claim 1, wherein the memory controller includes a timer configured to measure the time difference from execution of a latest write operation to execution of a next write operation in the block.

16. A memory system comprising:

a memory chip including a block that includes a plurality of cell units, each of the plurality of cell units including a plurality of memory cells; and a memory controller, wherein a first cell unit of the plurality of cell units is classified into a first group, a second cell unit of the plurality of cell units is classified into a second group, and a third cell unit, a fourth cell unit, a fifth cell unit, and a sixth cell unit of the plurality of cell units are classified into a third group, and the memory controller is configured to:

use a first correction amount of a read voltage when data is read from the plurality of memory cells of a cell unit classified into the first group among the plurality of cell units;

use a second correction amount of the read voltage when data is read from the plurality of memory cells of a cell unit classified into the second group among the plurality of cell units;

use a third correction amount of the read voltage when data is read from the plurality of memory cells of a cell unit classified into the third group among the plurality of cell units; and in a case where a time difference from execution of a write operation of the fourth cell unit to execution of the write operation of the fifth cell unit exceeds a reference value, change a boundary position between the first group and the second group to be between the fourth cell unit and the fifth cell unit, and classify the fifth cell unit into the second group.

17. The memory system according to claim 16, wherein in a case where a time difference from execution of the write operation of the fifth cell unit to execution of the write operation of the sixth cell unit exceeds the reference value, the memory controller is further configured to change a boundary position between the second group and the third group to be between the fifth cell unit and the sixth cell unit, and classify the sixth cell unit into the third group.

18. The memory system according to claim 17, wherein the memory controller is further configured to use the fifth cell unit for a calculation of the second correction amount, and to use the sixth cell unit for a calculation of the third correction amount.

* * * * *